United States Patent
Yu et al.

(10) Patent No.: US 11,581,644 B2
(45) Date of Patent: Feb. 14, 2023

(54) PHASE SHIFTER WITH BIDIRECTIONAL AMPLIFICATION

(71) Applicant: Qualcomm Incorporated, San Diego, CA (US)

(72) Inventors: Xinmin Yu, San Diego, CA (US); Lai Kan Leung, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 254 days.

(21) Appl. No.: 16/835,177

(22) Filed: Mar. 30, 2020

(65) Prior Publication Data

US 2020/0350679 A1    Nov. 5, 2020

Related U.S. Application Data

(60) Provisional application No. 62/843,191, filed on May 3, 2019.

(51) Int. Cl.
*H03F 1/02* (2006.01)
*G09G 5/00* (2006.01)
(Continued)

(52) U.S. Cl.
CPC ............ *H01Q 3/38* (2013.01); *G09G 5/006* (2013.01); *H01Q 21/22* (2013.01);
(Continued)

(58) Field of Classification Search
CPC ......... H03F 1/0211; H01Q 3/38; G09G 5/006
See application file for complete search history.

(56) References Cited

U.S. PATENT DOCUMENTS 5,504,745 A    4/1996 Petz et al.
5,939,918 A    8/1999 McGarry et al.
(Continued)

FOREIGN PATENT DOCUMENTS

EP    0430509 A2    6/1991
KR    101869241 B1    6/2018
WO    2019050098 A1    3/2019

OTHER PUBLICATIONS

Partial International Search Report—PCT/US2020/025972—ISAEPO—dated Jul, 21, 2020.
(Continued)

*Primary Examiner* — Patricia T Nguyen
(74) *Attorney, Agent, or Firm* — Colby Nipper/Qualcomm

(57) ABSTRACT

An apparatus is disclosed for bidirectional amplification with phase-shifting. In example implementations, an apparatus includes a phase shifter with a bidirectional amplifier. The bidirectional amplifier includes a first transistor coupled between a first plus node and a second minus node, a second transistor coupled between a first minus node and a second plus node, a third transistor coupled between the first plus node and the second minus node, and a fourth transistor coupled between the first minus node and the second plus node. The bidirectional amplifier also includes a fifth transistor coupled between the first plus node and the second plus node, a sixth transistor coupled between the first minus node and the second minus node, a seventh transistor coupled between the first plus node and the second plus node, and an eighth transistor coupled between the first minus node and the second minus node.

47 Claims, 18 Drawing Sheets

(51) Int. Cl.

| H01Q 3/38 | (2006.01) |
|---|---|
| H03H 11/16 | (2006.01) |
| H03F 3/45 | (2006.01) |
| H03F 3/68 | (2006.01) |
| H01Q 21/22 | (2006.01) |

(52) U.S. Cl.
CPC ....... *H03F 1/0211* (2013.01); *H03F 3/45179* (2013.01); *H03F 3/68* (2013.01); *H03H 11/16* (2013.01); *G09G 2310/0254* (2013.01); *G09G 2370/08* (2013.01); *H03F 2200/294* (2013.01); *H03F 2200/451* (2013.01); *H03F 2203/45294* (2013.01); *H03F 2203/45296* (2013.01); *H03F 2203/45352* (2013.01)

(56) References Cited

U.S. PATENT DOCUMENTS

| 7,250,814 | B2 | 7/2007 | Bardsley et al. | |
|---|---|---|---|---|
| 7,292,101 | B2 | 11/2007 | Kocaman et al. | |
| 7,486,135 | B2 | 2/2009 | Mu | |
| 8,576,006 | B1 | 11/2013 | Davis | |
| 8,736,370 | B2 | 5/2014 | Chiu | |
| 8,971,832 | B2 | 3/2015 | Bult et al. | |
| 9,537,558 | B1 | 1/2017 | Wyse et al. | |
| 10,003,374 | B1* | 6/2018 | Lee | H03F 3/245 |
| 10,158,508 | B1 | 12/2018 | Boers et al. | |
| 2009/0102574 | A1 | 4/2009 | Vickes et al. | |
| 2009/0295513 | A1 | 12/2009 | Ouacha et al. | |
| 2010/0117758 | A1 | 5/2010 | Miya | |
| 2017/0338854 | A1* | 11/2017 | Perumana | H04B 1/56 |
| 2020/0228081 | A1* | 7/2020 | Wu | H03G 1/0088 |
| 2020/0287281 | A1 | 9/2020 | Howard et al. | |
| 2020/0287282 | A1 | 9/2020 | Wu et al. | |
| 2022/0140797 | A1* | 5/2022 | Oshima | H03F 3/45 330/253 |

OTHER PUBLICATIONS

International Search Report and Written Opinion—PCT/US2020/025972—ISA/EPO—dated Oct. 23, 2020.

Afroz, et al., "94 GHz Bidirectional Variable Gain Amplifier in 0.13-μm SiGe BiCMOS for Phased Array Transmit and Receive (T/R) Applications", 2015 IEEE MTT-S International Microwave Symposium, 2015, 3 pages.

Afsahi, et al., "A Low-Power Single-Weight-Combiner 802.11abg SoC in 0.13 μm CMOS for Embedded Application Utilizing An Area and Power Efficient Cartesian Phase Shifter and Mixer Circuit", IEEE Journal of Solid-State Circuits, vol. 43, No. 5, ISSN: 0018-9200., May 5, 2008,1101-1118 pages.

Afsahi, et al., "An Area and Power Efficient Cartesian Phase Shifter + Mixer Circuit Applied to WLAN System", 2007 IEEE Radio Frequency Integrated Circuits (FRIC) Symposium, 2007, 357-360 pages.

Baker, et al., "CMOS Circuit Design, Layout, and Simulation", Department of Electrical Engineering Microelectronics Research Center The University of Idaho, 1998, 20 pages.

Cassan, et al., "A 1-V Transformer-Feedback Low-Noise Amplifier for 5-GHz Wireless LAN in 0.18-um CMOS", IEEE Journal of Solid-State Circuits, vol. 38, No. 3, Mar. 2003, Mar. 2003, 9 pages.

Cho, et al., "Compact X-band CMOS Bidirectional Gain Amplifier without T/R Switches", Electron. Lett., vol. 49, No. 1, pp. 66-68, Jan. 2013, Jan. 2013, 2 pages.

Gong, et al., "A 28-GHz Switchless, SiGe Bidirectional Amplifier Using Neutralized Common-Emitter Differential Pair", IEEE Microwave and Wireless Components Letters, vol. 28, No. 8, pp. 717-719, Aug. 2018, Aug. 2018, 3 pages.

Kim, et al., "Design of 60 GHz Vector Modulator Based Active Phase Shifter", 2011 Sixth IEEE International Symposium on Electronic Design, 2011, 4 pages.

Koh, et al., "0.13-μm CMOS Phase Shifters for X-, Ku-, and K-Band Phased Arrays", IEEE Journal of Solid-State Circuits, vol. 42, No. 11, Nov. 2007, 2535-2546 pages.

Lee, "The Design of CMOS Radio-Frequency Integrated Circuits", ISBN 0 521 63061 4 ISBN 0 521 63922 0, 1998, 7 pages.

Mashayekhi, "Bi-Directional Vector Variable Gain Amplifier for an X-Band Phased Array Radar Application", Mashayekhi, Arash, "Bi-Directional Vector Variable Gain Amplifier for an X-Band Phased Array Radar Application" (2014). Masters Theses 1911—Feb. 2014. 1190., Feb. 2014, 271 pages.

Motamed, et al., "A Low-Voltage Low-Power Wide-Range CMOS Variable Gain Amplifier", IEEE Transactions on Circuits and Systems—II: Analog and Digital Signal Processing, vol. 45, No. 7, Jul. 1998, Jul. 1998, 13 pages.

Pang, et al., "A 28GHz CMOS Phased-Array Beamformer Utilizing Neutralized Bi-Directional Technique Supporting Dual-Polarized MIMO for 5G NR", 2019 IEEE International Solid-State Circuits Conference, 2019, 30 pages.

Park, et al., "A 28GHz 20.3%-Transmitter-Efficiency 1.5°-Phase-Error Beamforming Front-End IC with Embedded Switches and Dual-Vector Variable-Gain Phase Shifters", ISSCC 2019 / Session 9 / High-Frequency Transceivers for Radar and Communications / 9.8, 2019, 39 pages.

Pepe, et al., "Two mm-Wave Vector Modulator Active Phase Shifters With Novel IQ Generator in 28 nm FDSOI CMOS", IEEE Journal of Solid-State Circuits, vol. 52, No. 2, pp. 344-356, Feb. 2017, Feb. 2017, 13 pages.

Sim, et al., "A Compact X-Band Bi-Directional Phased-Array T/R Chipset in 0.13μm CMOS Technology", IEEE Transactions on Microwave Theory and Techniques, vol. 61, No. 1, Jan. 2013, 8 pages.

Suh, et al., "A 7-GHz CMOS Bidirectional Variable Gain Amplifier With Low Gain and Phase Imbalances", IEEE Transactions on Circuits and Systems—I: Regular Papers, vol. 65, No. 9, Sep. 2018, 10 pages.

Yu, et al., "A 60 GHz Phase Shifter Integrated With LNA and PA in 65 nm CMOS for Phased Array Systems", IEEE Journal of Solid-State Circuits, vol. 45 No., Sep. 9, 2010, 1697-1709 pages.

Yu, et al., "A 60GHz Digitally Controlled RF-Beamforming Receiver Front-end in 65nm CMOS", RMO3B-2, IEEE Radio Frequency Integrated Circuits Symposium, 2009, 211-214 pages.

* cited by examiner

PHASE SHIFTER WITH BIDIRECTIONAL AMPLIFICATION

CROSS-REFERENCE TO RELATED APPLICATION

This application claims the benefit of U.S. Provisional Application No. 62/843,191, filed 3 May 2019, the disclosure of which is hereby incorporated by reference in its entirety herein.

TECHNICAL FIELD

This disclosure relates generally to wireless communications with electronic devices and, more specifically, to implementing a phase shifter with a bidirectional amplifier.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, thermostats and other sensors or automated controllers, robotics, automotive electronics, devices embedded in other machines like refrigerators and industrial tools, Internet of Things (IoT) devices, and so forth. These various electronic devices provide services relating to productivity, communication, social interaction, security, safety, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between two or more different electronic devices using wireless or wired signals that are transmitted over one or more networks, such as the Internet, a Wi-Fi network, or a cellular network. Electronic communications therefore include both wireless and wired transmissions and receptions. To make such electronic communications, an electronic device uses a transceiver, such as a wireless transceiver.

Electronic communications can therefore be realized by propagating signals between two wireless transceivers at two different electronic devices. For example, using a wireless transmitter, a smartphone can transmit a wireless signal to a base station over an air medium as part of an uplink communication to support mobile services. Using a wireless receiver, the smartphone can receive a wireless signal from the base station via the air medium as part of a downlink communication to enable mobile services. With a smartphone, mobile services can include phone and video calls, social media interactions, messaging, watching movies, sharing videos, performing searches, acquiring map information or navigational instructions, finding friends, location-based services generally, transferring money, obtaining another service like a car ride, and so forth.

To provide these and other types of services, electronic devices typically use a wireless transceiver to communicate wireless signals in accordance with some wireless standard. Examples of wireless standards include a 4th Generation (4G) cellular standard and an IEEE 802.11b or 802.11g Wi-Fi standard, both of which are used today with smartphones and other connected devices. These wireless standards enable a certain wireless communication speed. Nonetheless, efforts to enable faster wireless networks through the creation of newer wireless standards are ongoing. Next-generation cellular networks and advanced Wi-Fi networks, for example, are expected to offer significantly higher bandwidths, lower latencies, and access to additional electromagnetic (EM) spectrum. Taken together, this means that exciting new wireless services can be provided to users, such as safer self-driving vehicles, augmented reality (AR) and other mixed reality (MR) imaging, on-the-go 4K video streaming, ubiquitous sensors to keep people safe and to use natural resources more efficiently, real-time language translations, and so forth.

To make these new, faster wireless technologies more widely available, many wireless devices besides smartphones and other traditional computing devices will be deployed, which is sometimes called the "Internet of Things" (IoT). Compared to today's use of wireless devices, tens of billions, and eventually trillions, of more devices are expected to be connected to the internet with the arrival of the Internet of Things. These IoT devices may include small, inexpensive, and low-powered devices, like sensors and tracking tags. To enable next-generation wireless technologies, IoT devices and electronic devices generally will operate in accordance with 5th Generation (5G) cellular standards and newer Wi-Fi standards. Such devices will be communicating with signals that use wider frequency ranges that are located at higher frequencies of the EM spectrum as compared to those devices that operate in accordance with older wireless standards. For example, many newer devices will be expected to operate at millimeter wave (mmWave) frequencies (e.g., frequencies between at least 24 and 300 Gigahertz (GHz)), as well as at frequencies in the single-digit GHz.

To accommodate these commercial expectations and surmount the associated technical hurdles, the physical components that enable wireless communications under these constraints will be expected to operate efficiently at mmWave frequencies. One component that facilitates electronic communication is the wireless interface device, which can include a wireless transceiver and a radio-frequency front-end (RFFE). Unfortunately, the wireless interface devices designed for electronic devices that operate in accordance with the Wi-Fi and 4G cellular standards of today are not adequate for the faster Wi-Fi and 5G wireless standards of tomorrow, which standards are expected to accommodate higher frequencies, account for more-stringent latency demands, and meet tighter fiscal constraints.

Consequently, to facilitate the adoption of newer cellular and faster Wi-Fi technologies, as well as the widespread deployment of electronic devices that can provide new capabilities and services, wireless interface devices will be deployed having designs that can handle mmWave frequencies. Electrical engineers and other designers of electronic devices are therefore striving to develop new wireless interface devices that will enable the promise of 5G, faster Wi-Fi, and other higher-frequency technologies to become a reality.

SUMMARY

Newer cellular standards, such as 5G, and newer Wi-Fi standards, such as WiGig®, are intended to establish broadband capabilities at higher electromagnetic (EM) frequencies. These higher EM frequencies include those in the gigahertz (GHz) range, such as frequencies with corresponding millimeter wavelengths (e.g., mmWave frequencies between at least 24 to 300 GHz). To facilitate wireless communications with mmWave frequencies, some electronic devices use signal beamforming Signal beamforming entails employing an antenna array to aim or steer a signal beam in a desired direction. Steering a signal beam from an origin apparatus toward a destination apparatus can decrease an amount of transmit power required to reach the destination apparatus. Further, beamforming enables a signal to be propagated over a greater distance as compared to an omnidirectional transmission, including with transmissions at mmWave frequencies.

To generate a signal beam, multiple antenna elements of an antenna array transmit or receive different versions of a wireless signal, such as different delayed or phase-shifted versions of the wireless signal. In some device architectures, a respective component chain is associated with each antenna element of the antenna array to generate a respective wireless signal version. Individual physical components of each component chain are therefore reproduced for each antenna element. A single electronic device can include many antenna elements, such as 4, 6, 12, 16, or more distributed across multiple antenna arrays. Consequently, a negative effect resulting from any particular physical component that is part of a component chain, such as a size occupied by an individual physical component, is multiplied by a quantity of antenna elements included in the electronic device.

An example of an individual physical component that may be included in each component chain is a phase shifter. A phase shifter can adjust a phase of a version of a wireless signal relative to other versions of the wireless signal to enable beamforming for mmWave and other frequencies of wireless communications. The phase shifter can be constructed using, for example, a signal phase generator and a vector modulator. In some implementations, the signal phase generator converts a signal having one phase corresponding to one signal component to a split signal having at least two phases corresponding to at least two components of the signal. In some scenarios, two phases of a split signal are separated by ninety degrees (90°), such as by having 0° and 90° phases. Such a split signal can be referred to as having an in-phase (I) signal component and a quadrature (Q) signal component.

In operation, the vector modulator can adjust a magnitude of each signal component of a split signal as part of the phase-shifting process. In a single-ended environment, the vector modulator can modulate two signal components, which may correspond to 0 and 90° phases of a split signal. In a differential environment, the vector modulator can modulate four signal components, which may correspond to 0, 90, 180, and 270° phases of a split signal. The vector modulator of the phase shifter can be realized as an amplifier that adjusts relative amplitudes of the components of the split signal. After recombining the adjusted components of the split signal, the relative amplitude adjustment can effectively change a phase of a signal version flowing through a given component chain for a given antenna element to support beamsteering operations.

Generally, an amplifier can be implemented as a unidirectional amplifier or a bidirectional amplifier. Because a component chain operates on both transmission signals and reception signals, a unidirectional amplifier that is deployed as a vector modulator for a phase shifter is duplicated at each phase shifter. This duplication occurs at each component chain for each antenna element of each antenna array of an electronic device. Employing a bidirectional amplifier for the vector modulator of each phase shifter in an electronic device can therefore reduce by fifty percent a total quantity of amplifiers used by the phase shifters of a device. This space reduction provides a cost savings.

Some bidirectional amplifiers use both active and passive components. Passive components, such as inductors, occupy a significant area of a radio-frequency (RF) integrated circuit (IC) (RFIC). This larger RFIC size increases costs and results in larger devices. Further, phase-shifting operations can be sensitive to phase and impedance variances caused by an amplifier of a vector modulator. It is particularly challenging to provide both constant phase and impedance performance across different gain factors, and an amplifier uses multiple gain factors to provide different phase-shift amounts for a vector-modulator-based phase shifter.

To address one or more of these issues, some described implementations include a phase shifter that employs a bidirectional variable gain amplifier (VGA) as part of a bidirectional active vector modulator. Described bidirectional VGAs can maintain phase and input/output (I/O) impedance during gain changes that are used to modulate signal components of a split signal, such as I and Q signal components. Example bidirectional VGAs also include a built-in sign-switching capability to extend a phase-shifting range from 0-180° to 0-360°. The described bidirectional VGAs additionally provide an opportunity to size the transistors used to amplify transmission signals independently from the transistors used to amplify reception signals. Independently sizing the transistors for at least partially separate signal transmission and signal reception paths enables the noise figure and linearity performance to be separately optimized for transmission and reception operations.

In example implementations, a bidirectional VGA for a vector modulator of a phase shifter includes multiple bidirectional amplifiers, and each bidirectional amplifier can generate a different amplification amount for gain programmability. In some implementations, each bidirectional amplifier includes a first bank of transistors for one signal propagation direction and a different unidirectional amplification circuit for another signal propagation direction. In other implementations, each bidirectional amplifier includes first and second banks of transistors, and each respective bank of transistors is arranged to amplify transmission signals or reception signals. Thus, a first transistor bank and a second transistor bank together form a bidirectional amplifier of the bidirectional VGA. Different bidirectional amplifiers that correspond to different amplification amounts can be activated or deactivated to establish a target gain of the VGA, with different gain amounts of the VGA corresponding to different phase-shift amounts of an associated phase shifter. In some cases, each transistor bank includes multiple pairs of transistors (e.g., four differential transistor pairs per bank with two banks for 16 transistors per differential bidirectional amplifier).

Within a given transistor bank, at least two differential pairs of transistors are cross-coupled with respect to each other. Thus, output terminals of a first transistor pair have an opposite differential polarization relative to output terminals of a second transistor pair. In other words, a plus-minus output configuration of the first transistor pair is inverted relative to a plus-minus output configuration of the second transistor pair. With four transistor pairs in a given transistor bank, two transistor pairs with a first differential output polarity can be enabled at a first time to pass a signal version at a given amplification amount without a phase inversion. The other two transistor pairs with a second differential output polarity can be enabled at a second time to pass a signal version at the given amplification amount with a 180-degree phase change (or phase inversion) to provide built-in sign-switching capability. In some cases, each respective differential transistor pair can be individually enabled or disabled with a respective enablement device, such as a switch or a variable current source. If enabled, a differential transistor pair accepts at least one direct-current (DC) current and amplifies at least one signal component—e.g., using a common-source (CS) or common-drain (CD) configuration for each transistor.

A phase of a signal version propagating through the VGA and I/O impedances of the VGA are maintained to be substantially constant across gain changes. The potential for variances in the phase and the I/O impedance across different gain amounts is reduced based on the cross-coupled connections present in each transistor bank and based on a same quantity of transistor pairs being enabled and disabled in each bidirectional amplifier for different operational modes. Operational modes can include a "regular active" amplification mode, a 180-degree or "inverted active" amplification mode for sign-switching, and a null or "inactive" amplification mode. In the inactive amplification mode, a particular bidirectional amplifier of the VGA contributes no amplitude adjustment.

Further, a drain-to-gate parasitic capacitance of each of the transistors of the multiple transistor pairs is substantially neutralized by the cross-coupling present within each transistor bank of each bidirectional amplifier. Consequently, each transistor bank—one for transmission and one for reception—can have transistors that are independently sized with respect to those of the other transistor bank in a given bidirectional amplifier to accommodate different target parameters for transmission and reception performance. In these manners, a described bidirectional phase shifter can be realized with a bidirectional VGA that offers sign-switching and substantially constant phase and I/O impedances across different gain amounts. Additionally, the bidirectional VGA enables custom transistor sizing for transmission and reception signal paths.

In an example aspect, an apparatus for phase-shifting signals is disclosed. The apparatus includes a phase shifter. The phase shifter includes a first plus node, a first minus node, a second plus node, a second minus node, and a bidirectional amplifier. The bidirectional amplifier includes a first transistor coupled between the first plus node and the second minus node, a second transistor coupled between the first minus node and the second plus node, a third transistor coupled between the first plus node and the second minus node, and a fourth transistor coupled between the first minus node and the second plus node. The bidirectional amplifier also includes a fifth transistor coupled between the first plus node and the second plus node, a sixth transistor coupled between the first minus node and the second minus node, a seventh transistor coupled between the first plus node and the second plus node, and an eighth transistor coupled between the first minus node and the second minus node.

In an example aspect, an apparatus for phase-shifting signals is disclosed. The apparatus includes a phase shifter. The phase shifter includes a first differential interface, a second differential interface, and a bidirectional amplifier. The bidirectional amplifier includes a first transistor pair having an input and an output, with the input of the first transistor pair coupled to the first differential interface. The bidirectional amplifier also includes a second transistor pair having an input and an output, with the input of the second transistor pair coupled to the first differential interface. The bidirectional amplifier includes a third transistor pair having an input and an output, with the input of the third transistor pair coupled to the first differential interface. The bidirectional amplifier includes a fourth transistor pair having an input and an output, with the input of the fourth transistor pair coupled to the first differential interface. The bidirectional amplifier additionally includes first polarity means for coupling the output of the first transistor pair and the output of the second transistor pair to the second differential interface. The bidirectional amplifier further includes second polarity means for coupling the output of the third transistor pair and the output of the fourth transistor pair to the second differential interface.

In an example aspect, a method for operating a phase shifter with bidirectional amplification is disclosed. The method includes generating at least one phase of a signal. The method also includes modulating a magnitude of a component of the signal, with the component corresponding to the at least one phase. The modulating includes amplifying the component of the signal in accordance with an active mode. The amplifying of the signal component in accordance with the active mode includes enabling a first transistor pair and a second transistor pair. The first transistor pair and the second transistor pair are coupled to a first interface, and the first transistor pair and the second transistor pair are coupled via a first polarity to a second interface. The amplifying of the signal component in accordance with the active mode also includes disabling a third transistor pair and a fourth transistor pair. The third transistor pair and the fourth transistor pair are coupled to the first interface, and the third transistor pair and the fourth transistor pair are coupled via a second polarity to the second interface. The second polarity is opposite the first polarity.

In an example aspect, an apparatus for phase-shifting signals is disclosed. The apparatus includes a phase shifter. The phase shifter includes a signal phase generator and at least one bidirectional amplifier coupled to the signal phase generator. The bidirectional amplifier includes a first interface, a second interface, a first transistor bank, and a second transistor bank. The first transistor bank is coupled between the first interface and the second interface. The first transistor bank includes four transistor pairs configured to amplify a first signal propagating from the first interface to the second interface. The second transistor bank is coupled between the first interface and the second interface. The second transistor bank includes four transistor pairs configured to amplify a second signal propagating from the second interface to the first interface.

BRIEF DESCRIPTION OF DRAWINGS

FIG. 3-1 illustrates an antenna array coupled to an example RF front-end that includes multiple component chains, each of which includes a phase shifter.

FIG. 3-2 illustrates an antenna element coupled to an example portion of a component chain that includes a phase shifter that can be operated bidirectionally.

FIG. 4-1 is a block diagram illustrating an example phase shifter including a signal phase generator, a vector modulator, and multiple ports.

FIG. 4-2 is an operational diagram illustrating an example phase shifter including a signal phase generator, a vector modulator, and multiple baluns, with depictions of multiple phases of multiple example signal components using phasor diagrams.

FIG. 10-1 is a circuit diagram illustrating an example bidirectional amplifier including example enablement devices and an example power distribution network implementation.

FIG. 10-2 is a circuit diagram that illustrates an example bidirectional amplifier and that depicts multiple example operational aspects.

FIG. 10-3 is a circuit diagram illustrating an example bidirectional amplifier including other example enablement devices and another example power distribution network implementation.

FIG. 11-1 is a circuit diagram illustrating a bidirectional amplifier that is in an example operational configuration for a regular active mode for signal amplification.

FIG. 11-2 is a circuit diagram illustrating a bidirectional amplifier that is in an example operational configuration for an inverted active mode for signal amplification.

FIG. 11-3 is a circuit diagram illustrating a bidirectional amplifier that is in an example operational configuration for an inactive mode for nonamplification.

DETAILED DESCRIPTION

Figure 1:
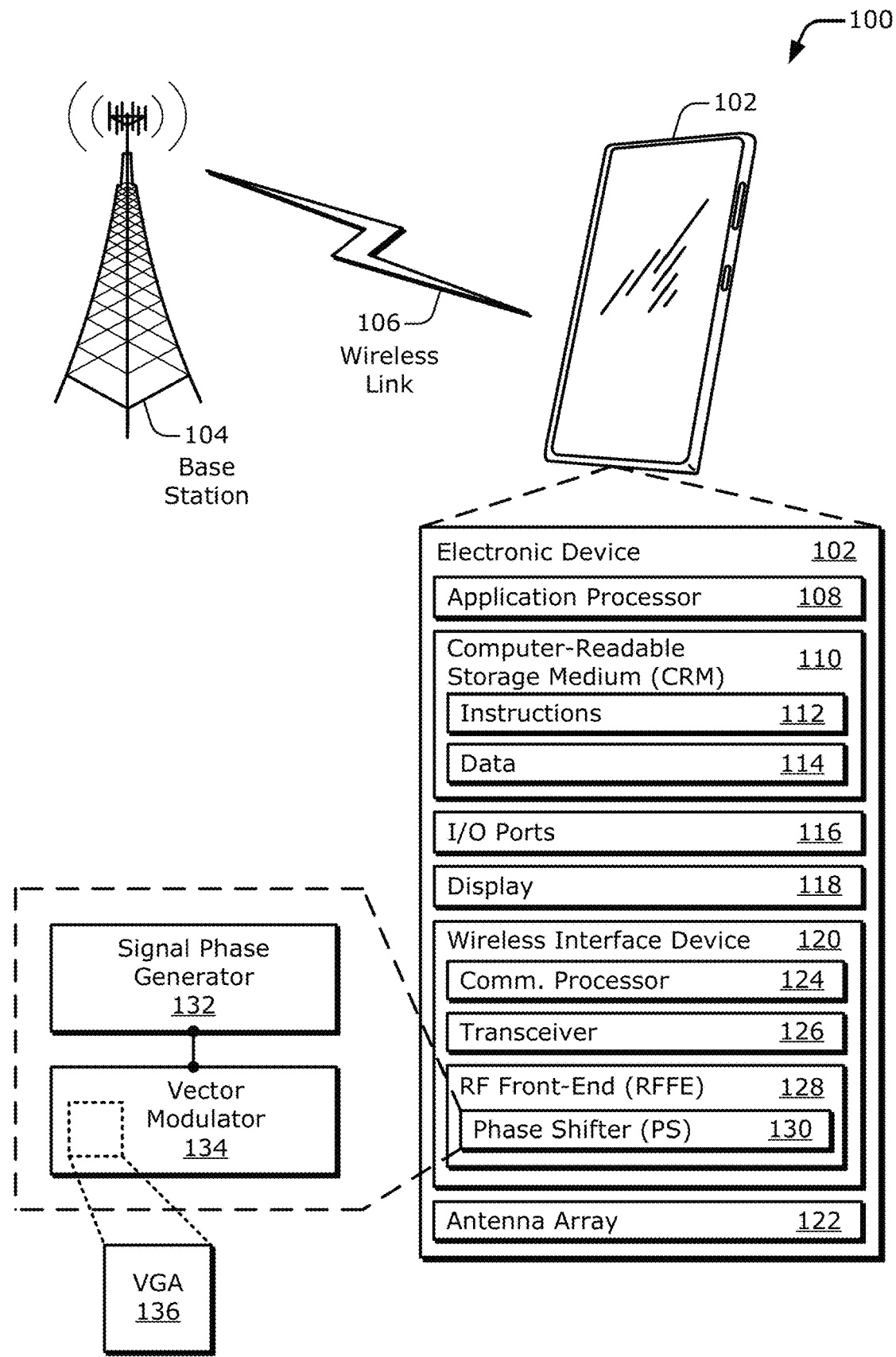
FIG. 1 illustrates an example environment that includes an electronic device having a wireless interface device with a radio-frequency (RF) front-end, which includes at least one phase shifter with a vector modulator.

As compared to 4G cellular and existing Wi-Fi networks, next-generation networks, such as 5G cellular networks and Wi-Gig® Wi-Fi networks, will utilize higher electromagnetic (EM) frequencies. These higher EM frequencies include millimeter wave (mmWave) frequencies that can span approximately 24 to 300 Gigahertz (GHz) of the EM spectrum. Other technologies that can operate at mmWave frequencies include 5G New Radio Spectrum Sharing (5G NR-SS) and WirelessHD®. Although higher EM frequencies can offer higher bandwidth and lower latency, higher frequencies also cause technical difficulties. For example, signals transmitted at higher frequencies are attenuated by the atmosphere more quickly and therefore have shorter intrinsic ranges at a given power level. To account for the naturally-shorter propagation distances, signals can be transmitted via signal beams that direct a signal toward a particular target with more effective power, which is called antenna beamforming or signal beamforming Using antenna beamforming, a transmission at a given power level can travel farther as a signal beam as compared to a signal being transmitted omnidirectionally.

Thus, electronic devices operating in accordance with 5G cellular and mmWave Wi-Fi, for example, may use beamforming to direct signals toward receiving devices. A wireless interface device of an electronic device is at least partially responsible for generating signal beams for beamformed communications. To form a transmission signal beam, the wireless interface device uses an antenna array to emanate multiple versions of a transmission signal in which each signal version is modified with respect to other signal versions. These modifications cause the signal versions to constructively and destructively combine during signal propagation. Signal modifications to produce the different signal versions can include being amplified by different amounts or being phase-shifted with respect to each other (e.g., delayed relative to one another by different time durations). Areas of constructive EM signal combination produce a signal beam that can be received at relatively farther distances as compared to a signal emanated without using antenna beamforming Receiving a communication signal with beamforming techniques works in a reciprocal or reverse manner by processing different received signal versions to reconstruct a received signal beam along some direction. Although antenna beamforming is described herein partially in terms of mmWave signaling, beamforming is applicable to other EM frequencies.

For antenna beamforming, each signal version is generally provided to or accepted from a respective antenna element of an antenna array of an electronic device. To modify different signal versions corresponding to respective ones of different antenna elements of the antenna array, a wireless interface device that is coupled to the antenna array may include a respective component chain of multiple component chains for each respective antenna element of multiple antenna elements. The electronic device may include multiple antenna arrays that each have multiple antenna elements to aim signal beams from different sides of the electronic device. In some architectures, there is a component chain associated with, and coupled to, each antenna element of each antenna array of the multiple antenna arrays.

Thus, within an electronic device, antenna elements are grouped into antenna arrays that can have two to five or more elements per array. Because each electronic device can have 2, 3, 4, or more antenna arrays, a total quantity of antenna elements can range between 4 and 20 or more in a single electronic device. If, for instance, an electronic device includes three antenna arrays with each array having four antenna elements, the electronic device can include a dozen total antenna elements and therefore a dozen corresponding component chains. Consequently, an impact resulting from each individual physical component that is present in each component chain, such as a negative effect caused by any individual physical component, is multiplied by a quantity of antenna elements included in the electronic device. Examples of negative effects include a size occupied by an individual physical component, a power usage of the component, or a loss of signal strength imparted to a signal being processed by the component. For instance, as a size of a physical component increases, the larger component occupies more space within an electronic device and increases a cost of the device.

An example of an individual physical component that may be included in each component chain is a phase shifter. A phase shifter can adjust a phase of a version of a wireless signal relative to other versions of the wireless signal to enable beamforming for mmWave and other frequencies of wireless communications. The phase shifter can be constructed using, for example, a signal phase generator and a vector modulator. The signal phase generator and the vector modulator are coupled to each other, and both process a signal version propagating through the phase shifter.

In some implementations, the signal phase generator converts a signal having one phase corresponding to one signal component to a split signal having at least two components corresponding to at least two phases of the signal. Two phases of a split signal may be separated by ninety degrees (90°), such as by having 0° and 90° phases. Such a split signal can be referred to as having an in-phase (I) signal component (e.g., with a 0° phase) and a quadrature (Q) signal component (e.g., with a 90° phase). The vector modulator of the phase shifter can be realized using an amplifier that adjusts relative amplitudes of the components of the split signal. In a single-ended environment, the vector modulator can modulate two signal components, which may correspond to 0° and 90° phases of the split signal. In a differential environment, the vector modulator can modulate four signal components, which may correspond to 0°, 90°, 180°, and 270° phases of the split signal. After recombining the amplitude-adjusted components of the split signal, the relative amplitude adjustment can effectively change a phase of a signal version flowing through a given component chain for a given antenna element to support beamsteering operations.

Phase shifters can be implemented fully or partially in a passive or active manner Passive phase shifters can be used to achieve about three bits of resolution, with the number of bits determining a granularity of the phase-shift amounts. The quantity of bits for a passive phase shifter is limited due to the large size of, and appreciable attenuation caused by, passive components (e.g., resistors, capacitors, and/or inductors) that form the passive phase shifter. Active phase shifters, on the other hand, can enable a higher bit resolution for a finer phase-shift granularity. Instead of being limited to 45° phase-shift increments as with a three-bit phase shifter, 22.5° and 11.25° phase-shift increments can be achieved with four-bit and five-bit phase shifters, respectively. This enables a signal beam to be more finely aimed using, e.g., a five-bit active phase shifter as compared to a three-bit passive one.

In some environments, an active phase shifter can use an active vector modulator that includes a variable gain amplifier (VGA). A VGA, however, can impact various performance characteristics of signal beamforming. Further, these performance characteristics that are impacted by operation of each VGA that is part of a phase shifter can be propagated along each component chain for an antenna array and can therefore affect a quality of a signal beam. For example, if a gain of a VGA is being programmed at each of multiple component chains to adjust a phase-shift amount, a phase or input/output (I/O) impedance (or both) of each VGA can be altered with some VGA designs. When the phase or I/O impedance of the VGA changes due to gain programming of the VGA, the resulting signal beam can fail to provide an intended coverage area or even fail to reach a targeted destination device.

Further, many active vector modulators and VGAs are unidirectional, which means such VGAs cannot be readily employed for both transmission and reception operations with a given antenna element. Consequently, such unidirectional active vector modulators are duplicated at each antenna element. In other words, a transmission path includes one instance of an active vector modulator, and a reception path includes another instance of an active vector modulator. Because a single electronic device can include 4, 9, 16, or more antenna elements distributed over two, three, or more antenna arrays, duplicating the unidirectional active vector modulator for each antenna element consumes an appreciable area of one or more transceiver integrated circuit (IC) chips. Additionally, as indicated above, some active vector modulators introduce signal phase changes with gain adjustments and/or present different I/O impedances during or after gain adjustments, which gain adjustments are used to change the phase-shift amounts that are provided by an associated phase shifter. Further, existing bidirectional amplifiers utilize area-consuming inductors or include additional switches along a signal propagation path that can affect signal characteristics. Still other bidirectional amplifiers entail using size-matched transistors for amplifying the signals traveling in both transmit and receive directions. Consequently, transistor sizes cannot be independently established for signals traveling in opposite directions, which enables the separate tuning of performance characteristics for transmission and reception operations.

In contrast, some described implementations are directed to a phase shifter that includes a signal phase generator and an active vector modulator. The active vector modulator is realized using a bidirectional VGA. A bidirectional phase shifter can therefore be implemented if the bidirectional VGA is paired with a bidirectional signal phase generator. Described examples of a bidirectional VGA maintain phase and I/O impedance between adjustments for different gain amounts, which different gain amounts are used to modulate the amplitudes of signal components (e.g., I and Q signal vectors) of a split signal by different amplification amounts. Also, described implementations of the bidirectional VGA offer a built-in sign-switching capability. Such implementations further provide an opportunity to independently size those transistors used to amplify transmission signals versus those transistors used to amplify reception signals. Independently sizing the amplification transistors enables a noise figure and linearity performance to be separately tuned for transmission and reception operations.

In example implementations, a bidirectional VGA for a vector modulator of a phase shifter includes multiple bidirectional amplifiers, and each bidirectional amplifier can provide a different amplification amount. Each bidirectional amplifier includes first and second banks of transistors, and each respective bank of transistors is arranged to amplify transmission signals or reception signals. Thus, a first transistor bank and a second transistor bank together form a bidirectional amplifier of the VGA. Different bidirectional amplifiers that correspond to different amplification amounts can be activated or deactivated to establish a target gain of the VGA. As part of an associated phase shifter, the different gain amounts of the VGA correspond to different phase-shift amounts of the associated phase shifter. In some cases, each transistor bank includes multiple pairs of transistors (e.g., four differential transistor pairs per bank with two banks for 16 transistors per differential bidirectional amplifier).

Within a given transistor bank, at least two differential pairs of transistors are cross-coupled with respect to each other. Thus, output terminals of a first transistor pair have an opposite differential polarization relative to output terminals of a second transistor pair, with regard to a same differential polarization on input terminals of both the two transistor pairs. In other words, a plus-minus output configuration of the first transistor pair is inverted relative to a plus-minus output configuration of the second transistor pair. With four transistor pairs in a given transistor bank, two transistor pairs with a same first differential output polarity can be enabled at a first time to pass a signal version at a given amplification amount without a phase inversion. The other two transistor pairs are disabled during this first time. The other two transistor pairs with a same second differential output polarity—which is opposite the first differential output polarity—can be enabled at a second time to pass a signal version at the given amplification amount with a 180-degree phase change (or a phase inversion) to provide built-in sign-switching capability. In some cases, each respective differential transistor pair can be individually enabled or disabled with a respective enablement device, such as a switch or a variable current source. If enabled, a differential transistor pair accepts a direct-current (DC) current and amplifies at least one signal component—e.g., using a common-source (CS) or common-drain (CD) configuration for each transistor.

A phase of a propagating signal version and an I/O impedance of the bidirectional VGA can both be maintained to be substantially constant across different gain amount adjustments. The potential for variances in the phase and the I/O impedance is reduced based on the cross-coupled connections in each transistor bank and on a same quantity of transistor pairs being enabled for different operational modes. Operational modes can include a "regular active" amplification mode, a 180-degree or "inverted active" amplification mode, and a null or "inactive" amplification mode. In the inactive amplification mode, a particular bidirectional amplifier of the VGA contributes no amplitude adjustment by enabling two transistor pairs that have opposite differential output polarities. Further, a drain-to-gate parasitic capacitance of each of the transistors of the multiple transistor pairs is substantially neutralized by the cross-coupling present within each transistor bank of each bidirectional amplifier. Consequently, each transistor bank—one for transmission and one for reception—can have transistors that are independently sized with respect to those of the other transistor bank to accommodate different target parameters for transmission and reception performance.

As described herein, multiple bidirectional amplifiers can be used to form a bidirectional VGA, and the bidirectional VGA can be used to realize a bidirectional vector modulator of phase shifter. This can reduce a quantity of vector modulators included as part of an electronic device. Further, a bidirectional phase shifter can be implemented if a bidirectional signal phase generator is coupled to the bidirectional vector modulator. In some implementations, each bidirectional amplifier includes four transistor pairs in a first transistor bank for transmission and another four transistor pairs in a second transistor bank for reception. Consequently, transistors can be separately tuned for transmission and reception operations. Within each bank of transistors that includes four pairs of transistors, two transistor pairs are cross-coupled relative to the other two transistor pairs from a perspective of the I/O terminals of the transistors and in terms of plus-minus differential polarity. In operation, different amplification modes are each engaged by enabling two transistor pairs of the four transistor pairs. In these manners, a substantially-constant phase and I/O impedance can be maintained across different amplification adjustments, or different gain amounts, of the bidirectional VGA.

FIG. 1 illustrates an example environment 100 that includes an electronic device 102 having a wireless interface device 120 with a radio-frequency (RF) front-end 128, which includes at least one phase shifter 130. The phase shifter 130 includes at least one signal phase generator 132 and at least one vector modulator 134. In the environment 100, the example electronic device 102 communicates with a base station 104 through a wireless link 106. In FIG. 1, the electronic device 102 is depicted as a smartphone. However, the electronic device 102 may be implemented as any suitable computing or other electronic device, such as a cellular base station, broadband router, access point, user equipment or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line, another electronic device as described above generally, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard. Examples of such protocols and standards include a 3rd Generation Partnership Project (3GPP) standard, such as a Long-Term Evolution (LTE), a 4th Generation (4G), or a 5th Generation (5G) cellular standard; an IEEE 802.11 standard, such as an 802.11g, ac, ax, ad, aj, or ay standard, including Wi-Fi 6; an IEEE 802.16 standard (e.g., WiMAX™); a Bluetooth™ standard; and so forth. In some implementations, the wireless link 106 may wirelessly provide power, and the electronic device 102 or the base station 104 may comprise a power source.

As shown, the electronic device 102 includes at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) or radar ports, camera or other sensor ports, and so forth. The display 118 can be realized as a display screen or a projection that presents one or more graphical images generated by the electronic device 102, such as a user interface associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna array 122. The wireless interface device 120 provides connectivity to respective networks and peer devices via a wireless link, which may be configured similar to or differently from the wireless link 106. Alternatively or additionally, the electronic device 102 may include a wired interface device (not shown), such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. However, the electronic device 102 may also or instead communicate directly with other peer devices, an alternative wireless network, and the like.

As shown, the wireless interface device 120 includes at least one communication processor 124, at least one transceiver 126, and at least one RF front-end 128 (RFFE 128). These components process data information, control information, and signals associated with communicating information for the electronic device 102 via the antenna array 122. The communication processor 124 may be implemented as at least part of a system-on-chip (SoC), a modem baseband processor, or a baseband radio processor (BBP) that enables a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding data that has been received. Additionally, the communication processor 124 may also manage (e.g., control or configure) aspects or operation of the transceiver 126, the RF front-end 128, and other components of the wireless interface device 120 to implement various communication protocols or communication techniques, such as antenna beamforming.

In some cases, the application processor 108 and the communication processor 124 can be combined into one module or integrated circuit (IC), such as an SoC. Regardless, the application processor 108 or the communication processor 124 can be operatively coupled to one or more other components, such as the CRM 110 or the display 118, to enable control of, or other interaction with, the other components of the electronic device 102. Thus, an operative coupling can enable components to perform a function together or interoperate as described herein. The communication processor 124 may also include a memory (not separately shown), such as a CRM 110, to store data and processor-executable instructions (e.g., code).

The various components illustrated in FIG. 1 (and other figures) using separate schematic blocks may be manufactured or packaged in different discrete or integrated manners. For example, one physical module may include components of the RF front-end 128 and a portion of the components of the transceiver 126, and another physical module may combine the communication processor 124 with the remaining components of the transceiver 126. Additionally or alternatively, at least one antenna array 122 may be co-packaged with at least some components of an RF front-end 128 as an antenna module. Further, an electronic device 102 may include multiple such antenna modules, thereby spatially distributing various physical components of at least one RF front-end 128 within a housing of the electronic device 102.

The transceiver 126 can include circuitry and logic for filtering, amplification, channelization, and frequency translation. The frequency translation may include an up-conversion or a down-conversion of frequency that is performed in a single conversion operation (e.g., with a direct-conversion architecture) or through multiple conversion operations (e.g., with a superheterodyne architecture). The transceiver 126 can include filters, switches, amplifiers, mixers, and so forth for routing and conditioning signals that are transmitted or received via the antenna array 122. Although not explicitly shown, the wireless interface device 120 can also include a digital-to-analog converter (DAC) or an analog-to-digital converter (ADC) to convert between analog signals and digital signals. A DAC or an ADC can be implemented as part of the communication processor 124, as part of the transceiver 126, or separately from both of them.

The components or circuitry of the transceiver 126 can be implemented in any suitable fashion, such as combined transceiver logic or separately as respective transmitter and receiver entities. In some cases, the transceiver 126 is implemented with multiple or different sections to implement respective transmitting and receiving operations (e.g., separate transmit and receive chains, respectively). The transceiver 126 may also include logic to perform in-phase/quadrature (I/Q) operations, such as synthesis, phase correction, modulation, demodulation, and the like.

Generally, the RF front-end 128 includes one or more filters, switches, or amplifiers for conditioning signals received via the antenna array 122 or for conditioning signals to be transmitted via the antenna array 122. As shown, the RF front-end 128 includes at least one phase shifter 130 (PS 130). The RF front-end 128 may also include other RF sensors and components, such as a peak detector, power meter, gain control block, antenna tuning circuit, N-plexer, balun, and the like. Configurable components of the RF front-end 128, such as the phase shifter 130, may be controlled by the communication processor 124 to implement communications in various modes, with different frequency bands, or using antenna beamforming Although the phase shifter 130 is depicted as being part of an RF front-end 128, described implementations of a phase shifter 130 can alternatively be employed in another portion of the wireless interface device 120 (e.g., the transceiver 126) or in another portion of the electronic device 102 generally.

In example implementations, the phase shifter 130 includes at least one signal phase generator 132 and at least one vector modulator 134, which are coupled to each other. The signal phase generator 132 changes a quantity of phases of a signal, such as by generating at least one phase to increase a quantity of phases. For instance, a signal phase generator 132 can produce an in-phase (I) signal component and a quadrature (Q) signal component (e.g., two phases for single-ended signaling) from an in-phase signal component (e.g., one phase for single-ended signaling). The vector modulator 134 can adjust at least one amplitude of one or more components of a signal traversing circuitry of the vector modulator 134. The adjustment can include increasing signal amplitude (e.g., positive amplification, amplification by a gain that is greater than one, or an amplification) or decreasing signal amplitude (e.g., negative amplification, amplification by a gain between zero and one, or an attenuation). Example implementations of the signal phase generator 132 and the vector modulator 134 are described herein below, starting with FIGS. 4-1 and 4-2.

As shown, the vector modulator 134 can be implemented with at least one variable gain amplifier 136 (VGA 136). For example, the vector modulator 134 can include a VGA 136 for an in-phase signal channel and another VGA 136 for a quadrature signal channel A VGA 136 as described herein can additionally or alternatively be deployed in other parts of the wireless interface device 120 or the electronic device 102 generally. Example implementations of a vector modulator 134 that include at least one VGA 136 are described below starting with FIG. 5. As described with reference to FIG. 6, each VGA 136 can include at least one bidirectional amplifier to enable a bidirectional vector modulator 134 and support a bidirectional phase shifter 130.

In some implementations, the antenna array 122 is implemented as at least one antenna array that includes multiple antenna elements. Thus, as used herein, an "antenna" can refer to at least one antenna array or at least one antenna element, depending on context. To implement antenna beamforming, a respective phase shifter 130 is coupled to each respective antenna element of the antenna array 122, which is described below with reference to FIGS. 3-1 and 3-2. Additional aspects of the wireless interface device 120 and the antenna array 122 in terms of antenna beamforming are described next with reference to FIG. 2.

Figure 2:
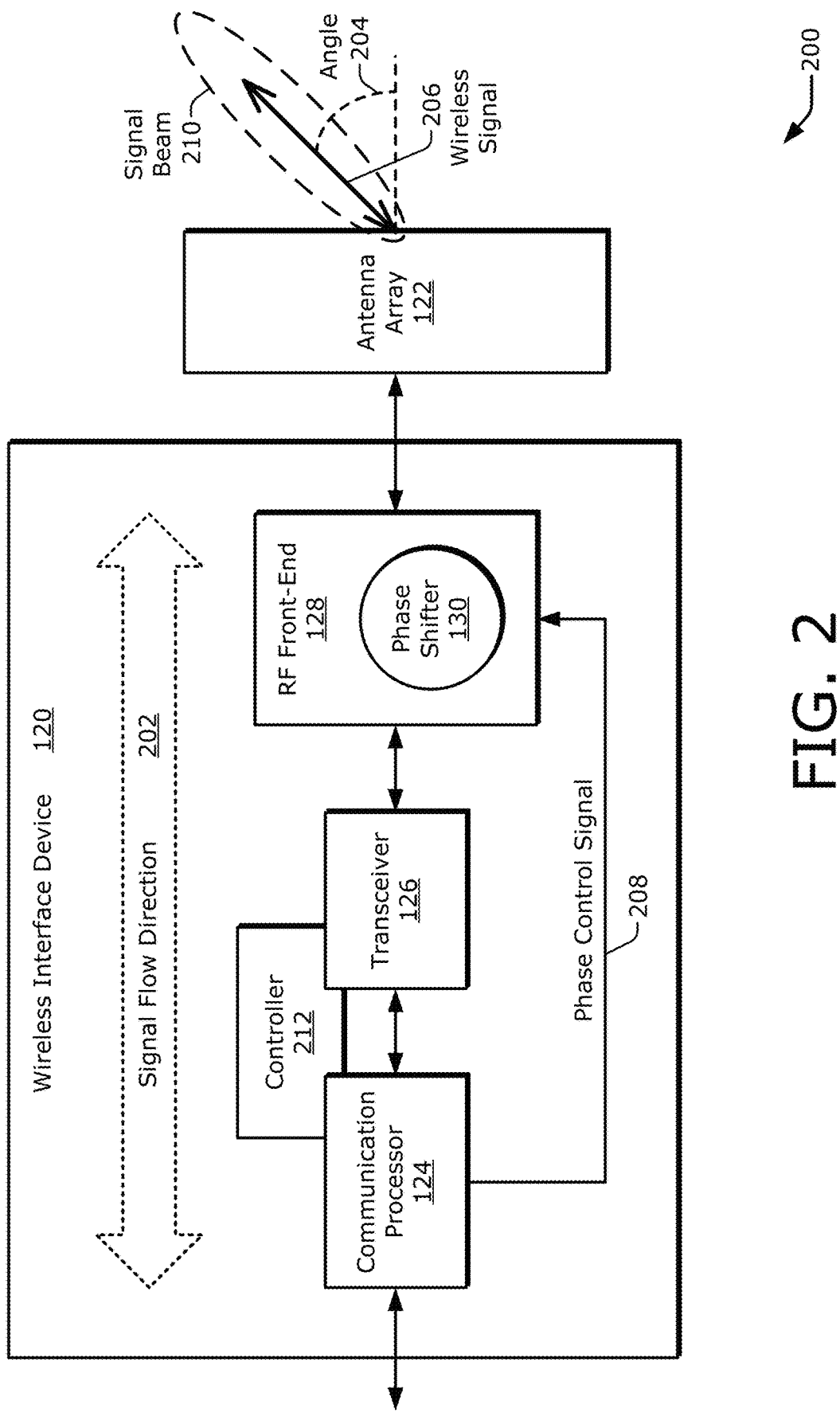
FIG. 2 illustrates an antenna array coupled to an example wireless interface device that includes a communication processor and an RF front-end with at least one phase shifter.

FIG. 2 illustrates at 200 generally the antenna array 122 coupled to an example implementation of the wireless interface device 120, which includes the communication processor 124 and the RF front-end 128. An example signal flow direction 202 is depicted bidirectionally. Thus, signals can flow in both directions across the wireless interface device 120 to accommodate both transmission and reception signals. As shown, the communication processor 124 is coupled to the transceiver 126, and the transceiver 126 is coupled to the RF front-end 128, which includes at least one phase shifter 130. Although not explicitly shown, the communication processor 124 can be coupled to other components of the electronic device 102 of FIG. 1, such as the application processor 108, the CRM 110, or the display 118.

In operation, the antenna array 122 emanates for transmission or senses for reception at least one wireless signal 206. With antenna beamforming, the wireless signal 206 can include multiple signal versions and can be transmitted or received via at least one signal beam 210. Using beamsteering, the wireless signal 206 can therefore be transmitted or received relative to at least one angle 204 to provide for wireless communication directionality. To do so, the phase shifter 130 of the RF front-end 128 shifts a phase of a version of a signal propagating through the phase shifter 130, with the propagating signal previously received as the wireless signal 206 or targeted for transmission as the wireless signal 206. The signal beam 210 can therefore be steered toward a destination device for transmitting operations or toward a source of the wireless signal 206 for receiving operations.

An amount of a phase shift by the phase shifter 130 can be controlled by the communication processor 124 using at least one phase control signal 208. The communication processor 124 can generate the phase control signal 208 responsive to beamforming parameters indicative of a targeted angle 204 or a targeted number of degrees of a phase shift or phase delay. This control of the phase shifting is described further herein below. Alternatively, the transceiver 126 can generate or provide the phase control signal 208. More generally, a controller 212 can generate or provide the phase control signal 208. The controller 212 can be part of at least one of the communication processor 124 or the transceiver 126 or can be separate from both.

Figures 1, 3:
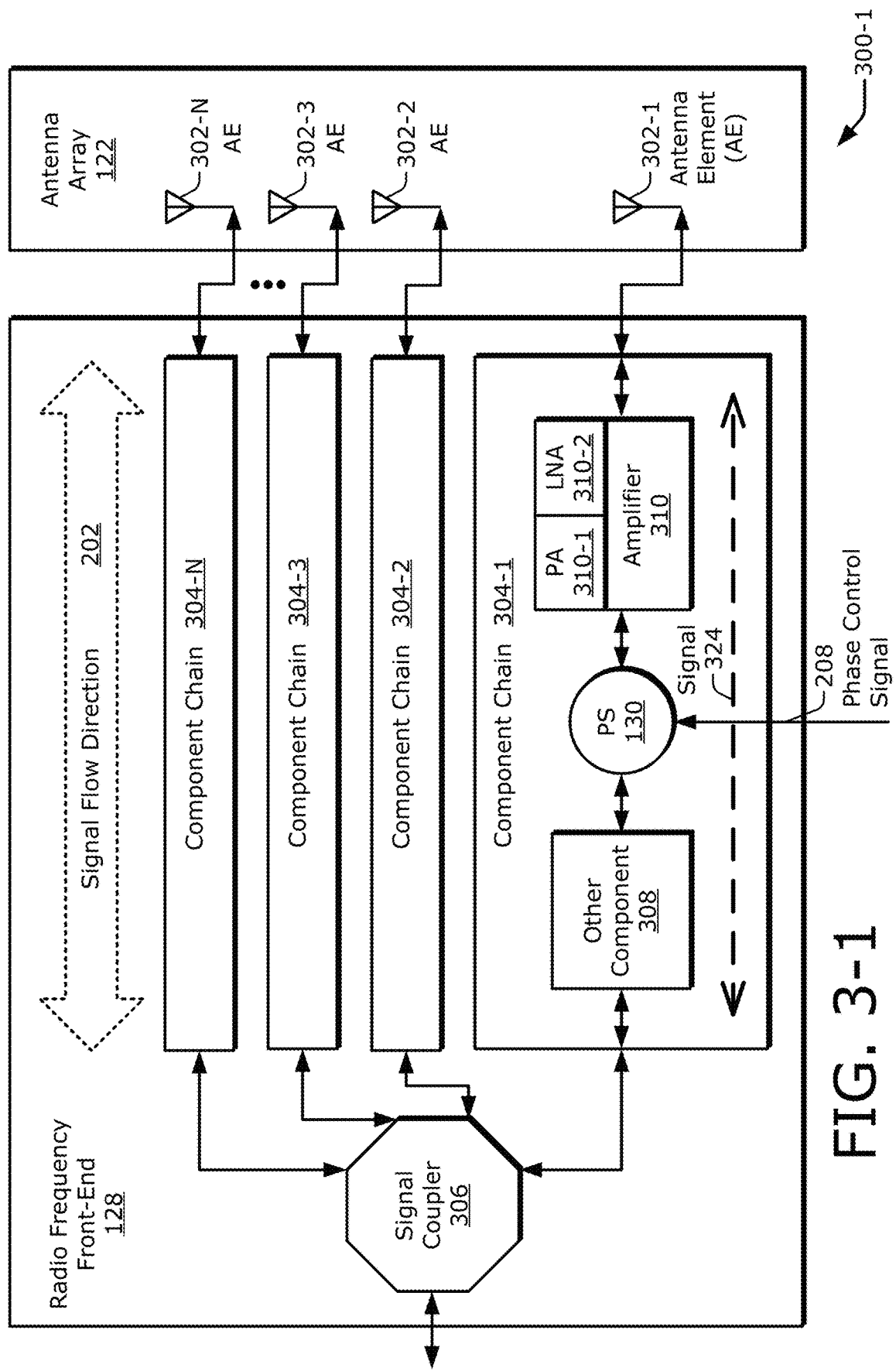
Figures 2, 3:
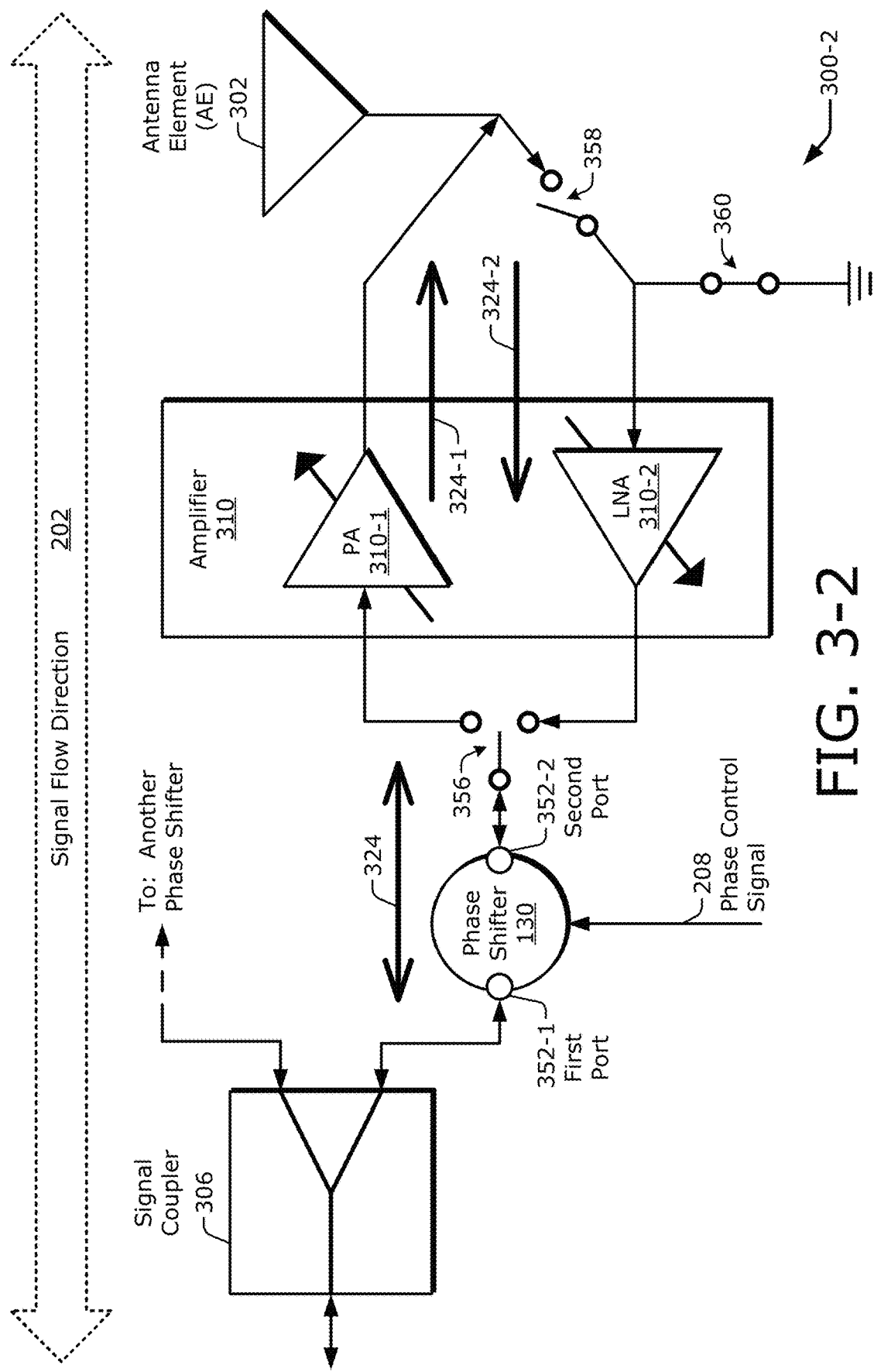

FIG. 3-1 illustrates generally at 300-1 the antenna array 122 being coupled to an example RF front-end 128 that includes multiple component chains 304-1, 304-2, 304-3, ..., 304-N, with "N" representing a positive integer (e.g., two or more for beamforming) Here, each component chain 304 includes at least one phase shifter 130 (PS 130). The antenna array 122 includes multiple antenna elements 302-1, 302-2, 302-3, ..., 302-N, with "N" representing a positive integer (e.g., two or more for beamforming) Each respective antenna element 302 (AE 302) of the multiple antenna elements 302-1 ... 302-N is coupled to a respective component chain 304 of the multiple component chains 304-1 ... 304-N. For example, a first component chain 304-1 is coupled to a first antenna element 302-1, and a second component chain 304-2 is coupled to a second antenna element 302-2.

In example implementations, each component chain 304 of the multiple component chains 304-1 ... 304-N is coupled to at least one signal coupler 306. The signal coupler 306 can function as a combiner/splitter. For example, the signal coupler 306 can combine multiple signal versions accepted from the multiple component chains 304-1 ... 304-N into a combined signal for a receiving operation. The signal coupler 306 can also split a signal into multiple signal versions and provide the versions to the multiple component chains 304-1 ... 304-N for a transmitting operation. Although a single four-to-one signal coupler 306 is explicitly illustrated, multiple signal couplers may be implemented instead. For example, two two-to-one (2-to-1) signal couplers (e.g., as partially shown in FIG. 3-2) may be coupled to the multiple component chains 304-1 ... 304-N for N=4.

As illustrated explicitly for the first component chain 304-1, each respective component chain 304 respectively includes a phase shifter 130, an amplifier 310, and at least one other component 308. However, a given component chain 304 can include more, fewer, or different components. The signal flow direction 202 along each component chain 304 can be bidirectional as indicated by the double-headed arrow. As shown, these physical components of a respective component chain 304 are coupled together in series between the signal coupler 306 and the respective corresponding antenna element 302 of the antenna array 122. The other component 308 is nearest the signal coupler 306, and the amplifier 310 is nearest the antenna element 302. The phase shifter 130 is therefore coupled between the other component 308 and the amplifier 310. However, the order of these physical components along a given component chain 304 may differ.

The amplifier 310 can be implemented in different manners. For example, the amplifier 310 can be implemented as a power amplifier 310-1 (PA) (PA 310-1) for transmission operations or as a low-noise amplifier 310-2 (LNA) (LNA 310-2) for reception operations. The other component 308 can be realized as a filter, another amplifier, a mixer, and so forth. The phase shifter 130 can therefore provide a phase-shifted signal to the PA 310-1 for amplification and forwarding to the corresponding antenna element 302 for emanation therefrom. The phase shifter 130 can also or instead accept an amplified signal from the LNA 310-2 for phase shifting and then forwarding to the other component 308, or for forwarding "directly" to the signal coupler 306 if no other component 308 is present.

In example operations, each respective component chain 304 adjusts or conditions a signal propagating between the signal coupler 306 and a respective antenna element 302. Thus, each respective component chain 304 modifies a signal version to produce a respective signal version having a different respective phase or amplitude that is appropriate for providing to or accepting from the respective antenna element 302 to support a beamsteering operation. To do so, the phase shifter 130 can perform phase shifting operations based on the phase control signal 208 as described herein.

In FIG. 3-1, a signal 324 is depicted with regard to the component chain 304-1. The signal 324 can propagate along the component chain 304-1 between the signal coupler 306 and the antenna element 302-1. Each signal 324 can represent a version of the wireless signal 206 (of FIG. 2). Other such signal versions can be propagating through other component chains. As indicated by the dashed appearance of the arrow representing the signal 324, the signal 324 can be realized as a bidirectional signal, a unidirectional signal, or a combination thereof as the signal 324 traverses different parts of the component chain 304-1. An implementation of the signal 324 that is bidirectional during propagation across the phase shifter 130 is described next with reference to FIG. 3-2.

FIG. 3-2 illustrates generally at circuitry 300-2 an antenna element 302 coupled to an example portion of a component chain 304 (e.g., of FIG. 3-1), which includes a phase shifter 130 that can be operated bidirectionally. As illustrated, the phase shifter 130 includes multiple ports: a first port 352-1 and a second port 352-2. The phase shifter 130 is coupled to the signal coupler 306 via the first port 352-1 and to the amplifier 310 via the second port 352-2. However, the orientation of the phase shifter 130 can be flipped such that the first port 352-1 is positioned closer to the antenna element 302 and the second port 352-2 couples the phase shifter 130 to the signal coupler 306. Although not explicitly shown, another phase shifter 130 can be coupled to the illustrated signal coupler 306, which is depicted as a two-to-one (2-to-1) signal coupler in FIG. 3-2. Further, another 2-to-1 signal coupler 306 and two additional phase shifters can be deployed to service an antenna array 122 with four antenna elements.

A switch 356 switchably couples the phase shifter 130 to the amplifier 310. As shown, the switch 356 is implemented using a single-pole, two-throw switch. Thus, the switch 356 includes a pole, which is coupled to the second port 352-2 of the phase shifter 130, and two throws: a top throw and a bottom throw. The switch 356 can selectively connect the second port 352-2 of the phase shifter 130 to an input of the PA 310-1 via the top throw or to an output of the LNA 310-2 via the bottom throw. The switch 356 can, however, be implemented differently.

An output of the PA 310-1 is coupled to the antenna element 302. An input of the LNA 310-2 is coupled to the antenna element 302 via a switch 358. A switch 360 can couple the input of the LNA 310-2 to ground. As depicted in FIG. 3-2, the switches 358 and 360 are in an open state and a closed state, respectively, to enable a transmission operation. To enable a reception operation, the switch 358 can be closed, and the switch 360 can be opened. However, a different quantity or arrangement of switches can be implemented to couple the various physical components of the component chain to each other or to the antenna element 302.

In operation for some implementations, a bidirectional signal 324 traverses the phase shifter 130. The bidirectional signal 324 propagates through the phase shifter 130 between the signal coupler 306 and the switch 356. Thus, the phase shifter 130 can be used for both transmit and receive operations. Example implementations of a bidirectional phase shifter with a bidirectional vector modulator are described herein below based on a bidirectional VGA that includes one or more bidirectional amplifiers. FIG. 3-2 also depicts unidirectional signals propagating between the switch 356 and the antenna element 302. Specifically, a unidirectional transmit signal 324-1 traverses through the PA 310-1 while propagating from the switch 356 to the antenna element 302. A unidirectional receive signal 324-2, on the other hand, traverses through the LNA 310-2 while propagating from the antenna element 302 to the switch 356.

Figures 1, 4:
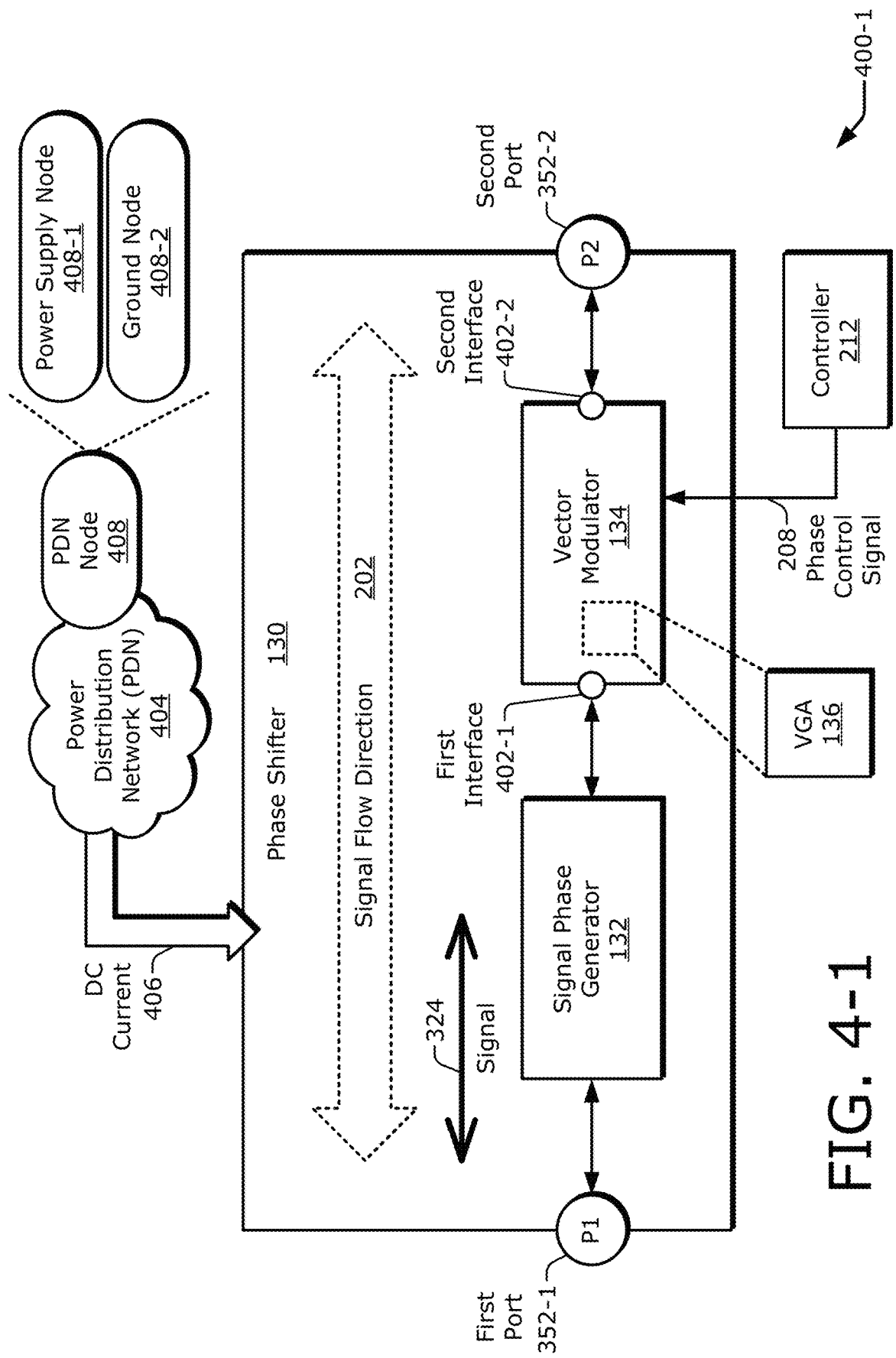
Figures 2, 4:
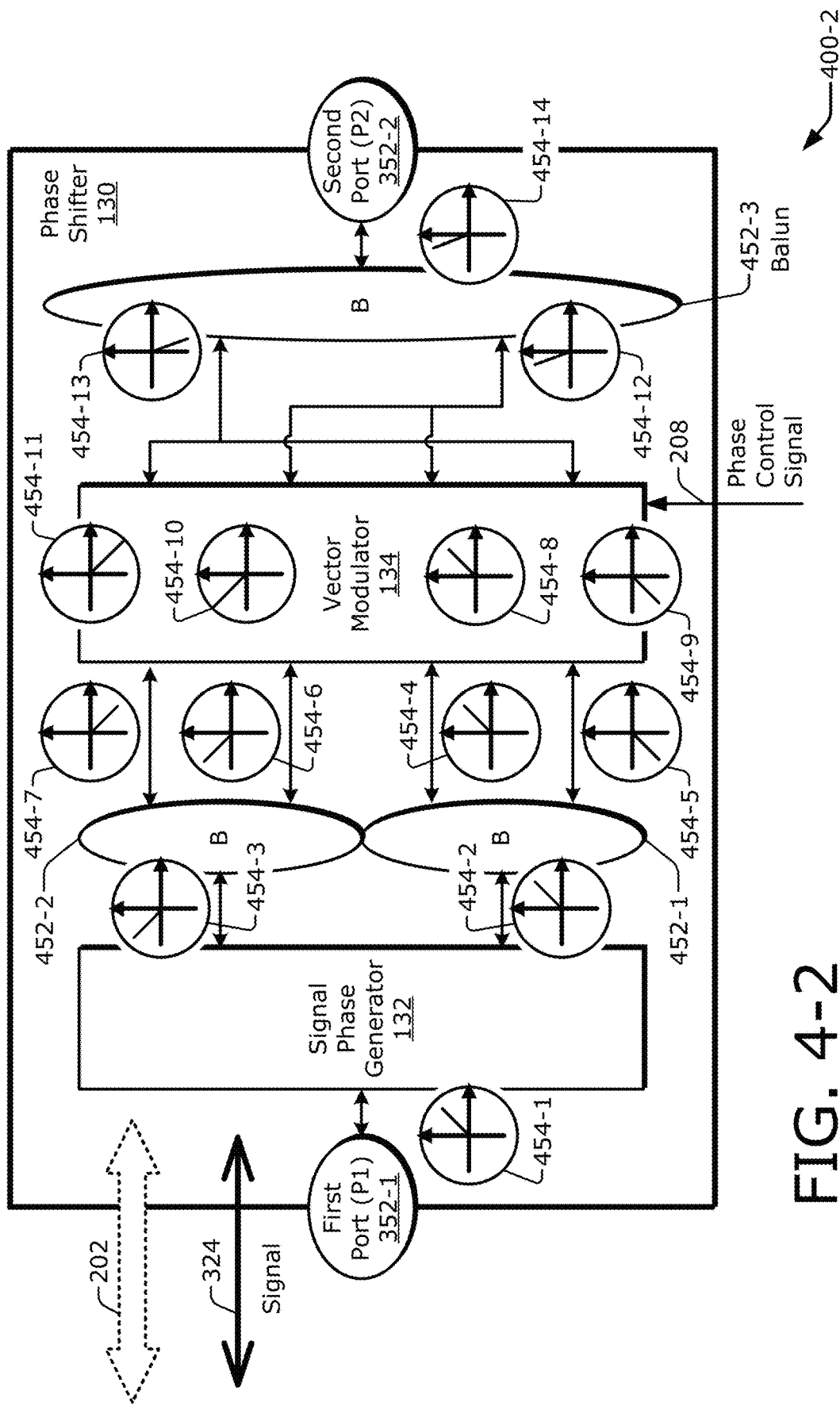

FIG. 4-1 is a block diagram 400-1 illustrating an example phase shifter 130 including the signal phase generator 132, the vector modulator 134, and multiple ports. The multiple ports include the first port 352-1 (P1) and the second port 352-2 (P2). As shown, the first port 352-1 is coupled to the signal phase generator 132, and the second port 352-2 is coupled to the vector modulator 134. However, these couplings to the ports may be swapped—e.g., such that the vector modulator 134 is coupled closer to the first port 352-1 than is the signal phase generator 132.

The vector modulator 134 includes at least one VGA 136 and multiple interfaces, such as a first interface 402-1 and a second interface 402-2. The vector modulator 134 is coupled to the signal phase generator 132 via the first interface 402-1 and to the second port 352-2 via the second interface 402-2. Accordingly, the second port 352-2 may comprise the second interface 402-2, and vice versa, if no other component is electrically disposed between the second interface 402-2 and the second port 352-2. Further, the vector modulator 134 may alternatively be coupled to the signal phase generator 132 via the second interface 402-2 instead of the first interface 402-1.

In example operations, the signal phase generator 132 converts a first quantity of phases of a signal 324 (e.g., one or two phases) to a second quantity of phases of the signal 324 (e.g., two or four phases, respectively). Each phase may be realized as a signal component of the signal 324 that is propagating through at least part of the phase shifter 130. The signal phase generator 132 in particular, the vector modulator 134 in particular, or the phase shifter 130 generally may recombine signal components to convert "back" to the first quantity of phases from the second quantity of phases before forwarding a phase-shifted signal to another physical component along a component chain 304 (e.g., of FIG. 3-1). Thus, the signal phase generator 132 generates one or more phases of a signal to produce a split signal with at least two signal components.

The vector modulator 134 adjusts an amplitude of at least one signal component of the signal 324 based on the phase control signal 208, which can be provided by the controller 212. For example, by increasing or decreasing an amplitude of at least one of an in-phase signal component (I signal component) or a quadrature signal component (Q signal component) using the vector modulator 134, the phase shifter 130 can shift a phase of the signal 324 while the signal 324 is propagating through the phase shifter between the first port 352-1 and the second port 352-2 along either signal flow direction 202. As described further below, the signal phase generator 132 can operate on a propagating signal "prior" to the vector modulator 134 for signals traversing the phase shifter 130 in a first direction (e.g., from the first port 352-1 to the second port 352-2). However, the vector modulator 134 can operate on a propagating signal "prior" to the signal phase generator 132 for signals traversing the phase shifter 130 in a second, opposite direction (e.g., from the second port 352-2 to the first port 352-1). This flexible order of operations of the signal phase generator 132 relative to the vector modulator 134 facilitates bidirectional operation of the phase shifter 130.

In example implementations, at least part of the phase shifter 130 operates actively instead of passively. For example, as described herein, at least the vector modulator 134 may be implemented as an active vector modulator 134. To power the active components, the phase shifter 130 is coupled to at least one power distribution network 404 (PDN 404) of the associated wireless interface device 120, such as one for the RF front-end 128 of the wireless interface device 120. The power distribution network (PDN) 404 includes at least one PDN node 408. Examples of a PDN node 408 include a power supply node 408-1 and a ground node 408-2.

The power supply node 408-1, which may be at least part of a voltage rail, is coupled to a power source that provides a supply voltage. An example of a power source is a power management integrated circuit (PMIC) (not shown). The ground node 408-2 may be at least part of a ground plane for one or more circuits. In operation, the power distribution network 404 can provide a direct-current (DC) current 406 (DC current 406) to active circuitry of the phase shifter 130. The DC current 406 can flow from a power supply node 408-1 to a ground node 408-2. PDN nodes and DC currents are described further with reference to FIGS. 10-1 to 10-3.

FIG. 4-2 is an operational diagram 400-2 illustrating an example phase shifter 130 including the signal phase generator 132, the vector modulator 134, and multiple baluns (B) 452-1, 452-2, and 452-3. The operational diagram 400-2 depicts multiple phases 454-1, 454-2, . . . , 454-13, and 454-14 of multiple example signal components using phasor diagrams. Each phasor diagram includes two orthogonal axes disposed within a circle and a line representing an angular vector. As indicated by the solid, double-headed arrow representing the signal 324, the phase shifter 130 can propagate the signal 324 from the first port 352-1 to the second port 352-2 or from the second port 352-2 to the first port 352-1. For clarity, an example operation of the phase shifter 130 is described below for a scenario in which the signal 324 traverses the phase shifter 130 from the first port 352-1 to the second port 352-2.

In example implementations, the phase shifter 130 includes at least one balun 452 (B 452). Each balun 452 can convert a signal from being single-ended to being differential, and vice versa. For instance, a balun 452 can convert a signal having one phase (e.g., a 0° phase) to a signal having two opposite phases (e.g., a 0° phase and a 180° phase). A balun 452 can be implemented using, for example, a transformer. In FIG. 4-2, the first port 352-1 is coupled to the signal phase generator 132. The signal phase generator 132 is coupled to the vector modulator 134 via a first balun 452-1 and a second balun 452-2. The vector modulator 134 is coupled to the second port 352-2 via a third balun 452-3. In this case, both the first port 352-1 and the second port 352-2 provide a single-ended signaling pathway for signals entering or exiting the phase shifter 130. One or both ports, however, can instead provide a differential signaling pathway in other implementations. For example, the signal phase generator 132 can be designed to operate on differential signals, or the third balun 452-3 can be omitted.

In example operations, the signal 324 arrives at the first port 352-1 with a phase 454-1. A phase of 45° is used in this example for this signal component so that the phase angles are not obscured by the axes of the phasor diagrams. The signal phase generator 132 accepts the signal component having the 45° phase from the first port 352-1 at a first side of the signal phase generator 132. The signal phase generator 132 generates one or more phases from the accepted signal component and provides the one or more generated phases at a second side of the signal phase generator 132 as two signal components. These two signal components of the signal 324 include a phase 454-2 that is at 45° and another phase 454-3 that is at 135°.

Thus, the two signal components at the second side of the signal phase generator 132 have phases that are separated by 90°. Alternatively, with a differential signal phase generator 132, the signal phase generator 132 can produce four signal components at 0°, 90°, 180°, and 270° phases from two signal components having 0° and 180° phases. Here, however, two baluns are used to produce differential signals. From the signal component having the phase 454-2 of 45°, the first balun 452-1 produces two signal components having a phase 454-4 that is at 45° and another phase 454-5 that is at 225° (e.g., signals that are 180° apart). From the signal component having the phase 454-3 of 135°, the second balun 452-2 produces two signal components having a phase 454-6 that is at 135° and another phase 454-7 that is at 315°. The four signal components that are provided to the vector modulator 134 via the first balun 452-1 and the second balun 452-2 are therefore each separated by 90° with relative phases of 45°, 135°, 225°, and 315°. These four signal components can therefore respectively correspond to a plus in-phase signal component (I+ signal component), a plus quadrature signal component (Q+ signal component), a minus in-phase signal component (I− signal component), and a minus quadrature signal component (Q− signal component).

The various phases are illustrated and described relative to each other at any given stage of the phase shifting process being performed along the phase shifter 130. Accordingly, the phases 454-2 and 454-3 are 90° apart at that stage of the phase shifter 130. For clarity, these are depicted as being at 45° and 135°, respectively. Nonetheless, phases at different stages may have a different relationship. In other words, the 45° phase 454-1 on the first side of the signal phase generator 132 may be different from the 45° phase 454-2 on the second side of the signal phase generator 132.

Continuing with the example operation of the phase shifter 130, the vector modulator 134 accepts the four signal components corresponding to the four phases 454-4 to 454-7. The vector modulator 134 adjusts an amplitude of one or more of these four signal components by increasing or decreasing a magnitude thereof based on the phase control signal 208. The vector modulator 134 can also pass a signal component without substantially changing a magnitude thereof. Here, the signal components corresponding to the phase 454-4 and the phase 454-5 have amplitudes that are unchanged by the vector modulator 134. Thus, the vector modulator 134 produces a first signal component corresponding to a phase 454-8 that is unchanged in magnitude from the phase 454-4 and a second signal component corresponding to a phase 454-9 that is unchanged in magnitude from the phase 454-5.

In contrast, the vector modulator 134 does adjust the magnitudes of two other signal components. The vector modulator 134 produces a third signal component corresponding to a phase 454-10 having a magnitude that is increased from that of the phase 454-6. Similarly, the vector modulator 134 produces a fourth signal component corresponding to a phase 454-11 having a magnitude that is increased from that of the phase 454-7. This is graphically represented with relatively longer phasor arrows for the phase 454-10 and the phase 454-11 as compared to those for the phase 454-6 and the phase 454-7, respectively.

These four components that are present at the "right" interface (as depicted in FIG. 4-2) of the vector modulator 134 are then combined in plus-plus and minus-minus pairs, as described below, to produce a differential signal with an adjusted phase. The first component corresponding to the phase 454-8 is combined with the third component corresponding to the phase 454-10 to produce another component corresponding to a phase 454-12. This is equivalent to "recombining" the two plus components: the I+ signal component and the Q+ signal component. As shown, the phasor for the phase 454-12 represents an angle of 110°. Because the magnitude for the third signal component having the 135° phase 454-10 is now larger than the magnitude of the first signal component having the 45° phase 454-8, the phase angle of the combined signal component is shifted towards the 135° phase (e.g., is shifted away from a 90° phase that would result from two equal-sized amplitudes at 45° and 135° phases to the 110° phase 454-12 that is depicted). The second component corresponding to the phase 454-9 is combined with the fourth component corresponding to the phase 454-11 to produce another component corresponding to a phase 454-13. This is equivalent to "recombining" the two minus components: the I− signal component and the Q− signal component. As shown, the phasor for the phase 454-13 represents an angle of 290°.

In this manner, the phase shifter 130 can use the signal phase generator 132 and the vector modulator 134 to shift the phases of two differential signal components at 45° and 225° for the phases 454-4 and 454-5 by a phase-shift amount of 65° (e.g., from 45° for the phase 454-4 to 110° for the phase 454-12 and from 225° for the phase 454-5 to 290° for the phase 454-13). In this case, the phase shifter 130 is coupled to another component at the second port 352-2 for single-ended signaling. Accordingly, the third balun 452-3 converts the differential signaling having two components with the phases 454-12 and 454-13 to single-ended signaling with a phase 454-14, which has a 110° angle. The phase shifter 130 therefore shifts a phase of the signal 324 by 65° from 45° for the phase 454-1 to 110° for the phase 454-14 as the signal 324 propagates from the first port 352-1 to the second port 352-2. Thus, a phase of a version of a wireless signal 206 (of FIG. 2) that is to be transmitted or that has been received via an antenna element 302 (of FIGS. 3-1 and 3-2) can be shifted to support a beamforming operation.

The phase shifter 130 has been described above in terms of the signal 324 traversing the depicted components from the first port 352-1 to the second port 352-2. However, the phase shifter 130 can be operated bidirectionally such that the signal 324 propagates from the second port 352-2 to the first port 352-1. With respect to a bidirectional phase shifter 130, a temporal order of signal processing between the signal phase generator 132 and the vector modulator 134 depends on whether a transmission operation or a reception operation is occurring and which port 352 is coupled closer to an antenna element. For example, as described above, the vector modulator 134 may operate on a propagating signal "after" the signal phase generator 132 operates on the propagating signal. Additionally or alternatively, the vector modulator 134 may operate on a propagating signal "before" the signal phase generator 132 operates on the propagating signal if the phase shifter 130 accepts the signal being processed at the second port 352-2 and outputs the phase-shifted signal at the first port 352-1. Thus, the amplitude adjustment of the vector modulator 134 can be applied before the one or more phases are generated. Although not so illustrated, a signal phase generator 132 may be implemented as two "separate" unidirectional signal phase generators to realize a bidirectional phase shifter 130. Nonetheless, in alternative environments, the phase shifter 130 can be operated fully or partially unidirectionally.

In terms of the RF front-end 128 (e.g., of FIG. 3-1), the first port 352-1 of the phase shifter 130 may be coupled to the other component 308 and thus closer to both the signal coupler 306 and the transceiver 126 (e.g., of FIG. 2). Here, the second port 352-2 of the phase shifter 130 may be coupled to the amplifier 310 and thus closer to the antenna array 122. Alternatively, the second port 352-2 may be coupled to the other component 308 and thus closer to both the signal coupler 306 and the transceiver 126. Here, the first port 352-1 may be coupled to the amplifier 310 and thus closer to the antenna array 122.

In some implementations, the vector modulator 134 includes at least two VGAs. For example, a first VGA can be deployed to adjust the amplitudes of the first and second components respectively corresponding to the phases 454-8 and 454-9, which form one differential signal. A second VGA can be deployed to adjust the amplitudes of the third and fourth components respectively corresponding to the phases 454-10 and 454-11 which form another differential signal. An example of this approach with two VGAs is described below with reference to FIG. 5. An example VGA 136, which includes multiple bidirectional amplifiers, is described with reference to FIG. 6. Example implementations of a bidirectional amplifier 602 are described with reference to FIGS. 7 to 11-3.

Figure 5:
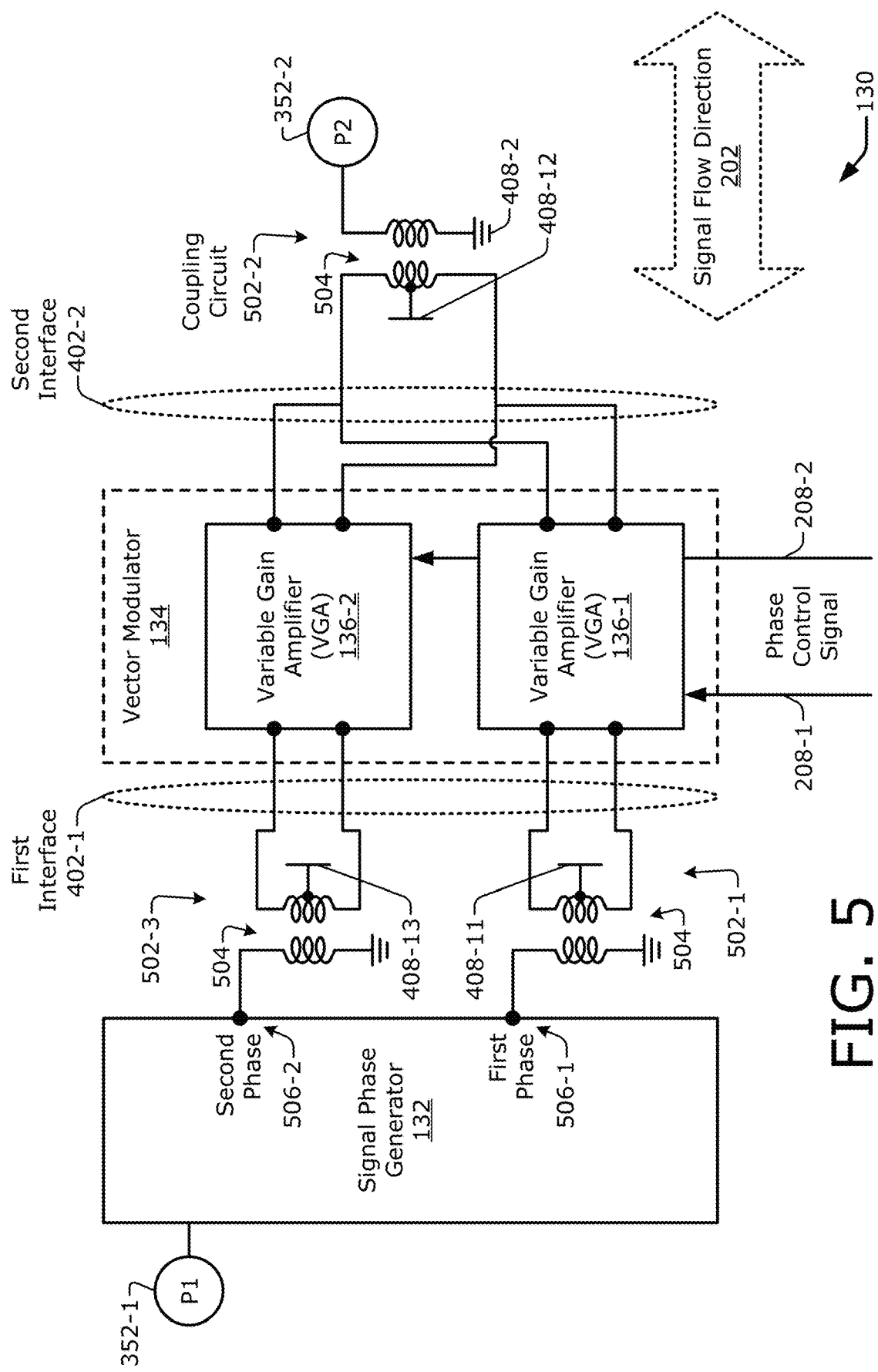
FIG. 5 is a schematic diagram illustrating an example phase shifter including a signal phase generator and a vector modulator, which includes at least one variable gain amplifier (VGA).

FIG. 5 is a schematic diagram illustrating an example phase shifter 130 including a signal phase generator 132 and a vector modulator 134, which includes at least one variable gain amplifier 136 (VGA 136). As illustrated, the vector modulator 134 includes two VGAs: a first VGA 136-1 and a second VGA 136-2. The phase shifter 130 includes multiple coupling circuits 502-1, 502-2, and 502-3. As shown, each coupling circuit 502 is realized as at least one transformer 504. Further, each transformer is implemented as a balun (e.g., a balun 452 of FIG. 4-2) to convert between single-ended and differential signaling (e.g., between balanced and unbalanced signals). The coupling circuits and the transformers can, however, be implemented differently.

In example implementations, the first port 352-1 is coupled to the signal phase generator 132. The signal phase generator 132 is coupled to the vector modulator 134 via a first coupling circuit 502-1 and a third coupling circuit 502-3. The vector modulator 134 is coupled to the second port 352-2 via the second coupling circuit 502-2. As shown, each coupling circuit 502 is realized using a transformer 504 that is implemented as a balun having a differential side and a single-ended side. Each transformer 504 is arranged to couple a differential signal to at least one VGA 136. Thus, each VGA 136 is configured to accept a differential signal, amplify a differential signal, and output a differential signal in both directions. The signal phase generator 132 and the second port 352-2 are therefore coupled to a single-ended side of at least one transformer 504 in this example.

The vector modulator 134 also accepts multiple phase control signals 208-1 and 208-2, one phase control signal 208 for each VGA 136. Thus each respective VGA 136 accepts a respective phase control signal 208. The first VGA 136-1 accepts a first phase control signal 208-1, and the second VGA 136-2 accepts a second phase control signal 208-2. Each respective VGA 136-1 and 136-2 therefore performs at least one amplification operation based on the respective phase control signal 208-1 and 208-2. Each VGA 136 can comprise a bidirectional VGA 136, as is described below with reference to FIG. 6.

To perform as a balun, each transformer 504 has a single-ended side and a differential side. In addition to a signal-carrying node, the single-ended side of each transformer 504 is coupled to a ground node 408-2. In addition to two differential signal-carrying nodes, the differential side of each transformer 504 is coupled to a power supply node 408-1 via a central tap of an inductor of the transformer 504. The multiple transformers can be coupled to a same ground node 408-2 or a same power supply node 408-1 or to different ones of either or both such PDN nodes. For example, the transformer 504 of the first coupling circuit 502-1 is coupled to a first power supply node 408-11. Similarly, the transformer 504 of the second coupling circuit 502-2 is coupled to a second power supply node 408-12, and the transformer 504 of the third coupling circuit 502-3 is coupled to a third power supply node 408-13. As described below, each power supply node 408 can provide power (e.g., a DC current 406 of FIG. 4-1) to one or more transistors of a VGA 136.

In example operations, from a signal with one phase, the signal phase generator 132 generates a first phase 506-1 at the first coupling circuit 502-1 and a second phase 506-2 at the third coupling circuit 502-3. Single-ended signaling components of the first and second phases 506-1 and 506-2 can correspond to, for example, an in-phase signal component (I signal component) and a quadrature signal component (Q signal component), respectively. Alternatively, the signal phase generator 132 can generate four phases from one or two phases. The transformer 504 of the first coupling circuit 502-1 converts the single-ended signal component having the first phase 506-1 to a differential signal having two signal components. These two signal components at the first coupling circuit 502-1 can thus correspond to I+ and I− signal components. The transformer 504 of the third coupling circuit 502-3 converts the single-ended signal component having the second phase 506-2 to a differential signal having two signal components. These two signal components at the third coupling circuit 502-3 can thus correspond to Q+ and Q− signal components.

The first VGA 136-1 processes the two signal components accepted via the first coupling circuit 502-1. The first VGA 136-1 can therefore amplify I+ and I− signal components based on the first phase control signal 208-1 to achieve a first gain amount. The second VGA 136-2 processes the two signal components accepted via the third coupling circuit 502-3. The second VGA 136-2 can therefore amplify Q+ and Q− signal components based on the second phase control signal 208-2 to achieve a second gain amount. Plus-minus nodes of the differential side of the transformer 504 of the second coupling circuit 502-2 recombine these signal components on a plus-plus and minus-minus basis. A plus node combines the I+ and Q+ signal components. A minus node combines the I− and Q− signal components. However, plus nodes and minus nodes need not combine signal components, as is described below with reference to FIG. 6. Here, the combined plus and minus signal components are coupled to the differential side of the transformer 504 of the second coupling circuit 502-2. After the transformer 504 converts the plus and minus signal components to a single-ended signal, the second coupling circuit 502-2 couples the singled-ended signal to the second port 352-2.

Example implementations for a phase shifter 130 are illustrated in FIGS. 4-2 and 5 and described above. A phase shifter 130 can, however, be implemented in alternative manners. For example, the first port 352-1 or the second port 352-2 (including possibly both ports given that the disjunctive "or" can be interpreted as being inclusive as explained below) can be implemented as a differential port to couple both plus and minus signals to or from the phase shifter 130. Thus, the signal phase generator 132 may be implemented as a differential signal phase generator that couples I+ and I− signal components on one side (e.g., on the first port 352-1 side) and I+, I−, Q+, and Q− signal components on another side (e.g., on the vector modulator 134 side). Further, one or more of the coupling circuits may be implemented differently, including with electrical conductors (e.g., wires) alone. In some implementations, the baluns may be moved outside of the phase shifter 130 or omitted from the circuitry. For example, the baluns of the first coupling circuit 502-1 and the third coupling circuit 502-3, which are each realized as a transformer 504 in FIG. 5, may be omitted by employing a differential signal phase generator 132. In some cases, this enables power to be supplied to the first VGA 136-1 and the second VGA 136-2 through the signal phase generator 132 (e.g., DC current may be routed to flow through components of a differential signal phase generator or two single-ended signal phase generators). As another example, the balun of the second coupling circuit 502-2 may be replaced with an inductor and two AC-coupling capacitors that jointly couple to a differential signaling pathway provided by the second port 352-2.

Figure 6:
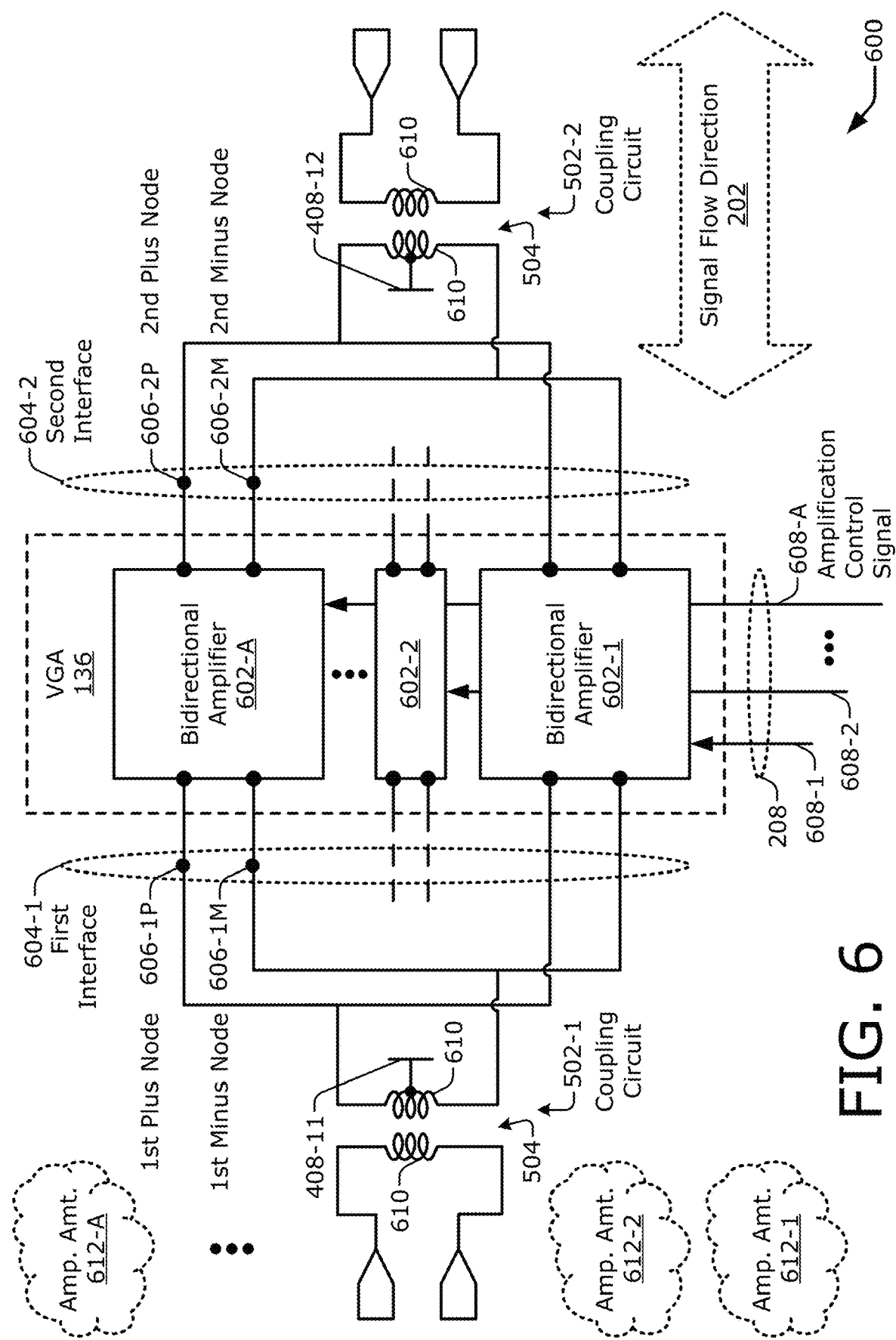
FIG. 6 is a schematic diagram illustrating an example VGA including multiple bidirectional amplifiers.

FIG. 6 is a schematic diagram 600 illustrating an example VGA 136 including multiple bidirectional amplifiers 602-1, 602-2, . . . , 602-A, with "A" representing a positive integer. The value of "A" establishes a quantity of bidirectional amplifiers included in the VGA 136 and thus a bit level of the VGA 136. For example, if "A" equals five (5), the illustrated VGA 136 can provide five bits of resolution and up to 32 different amplification amount combinations or levels from the five different amplification amounts. The number of bits of resolution for each VGA 136 is related to the bit-level of the associated phase shifter, which is described below. The schematic diagram 600 also depicts a respective transformer 504 for each respective coupling circuit 502, including the first coupling circuit 502-1 with a first transformer 504 and the second coupling circuit 502-2 with a second transformer 504. Each transformer 504 can include at least one inductor 610 on each side. In FIG. 6, the transformer 504 of each coupling circuit 502 operates with a differential signal; however, each transformer 504 can instead be implemented as a balun as shown in FIG. 5.

In example implementations, the VGA 136 is coupled between the first coupling circuit 502-1 and the second coupling circuit 502-2. Thus, each bidirectional amplifier 602 of the multiple bidirectional amplifiers 602-1 . . . 602-A is coupled between the first coupling circuit 502-1 and the second coupling circuit 502-2. The VGA 136 includes multiple interfaces, including a first interface 604-1 and a second interface 604-2. The first interface 604-1 is coupled to an inductor 610 of the transformer 504 of the first coupling circuit 502-1, and the second interface 604-2 is coupled to an inductor 610 of the transformer 504 of the second coupling circuit 502-2.

With differential signaling, a signal can include a plus signal component and a minus signal component. The plus signal component and the minus signal component are approximately 180 degrees (180°) apart. With circuitry that supports differential signaling, a plus signal path and a minus signal path can propagate the plus signal component and the minus signal component, respectively. Each signal path can include physical components—such as passive and active circuit elements, wires, nodes, and so forth. A circuit may therefore include a plus wire or a plus node to propagate a plus signal component. Similarly, the circuit may include a minus wire or a minus node to propagate a minus signal component. Thus, a plus node represents an electrical or electromagnetic point or part of a circuit that can correspond to a plus signal component, and a minus node represents an electrical or electromagnetic point or part of a circuit that can correspond to a minus signal component.

Each interface 604 can include multiple nodes. In some implementations, each interface 604 includes a plus node and a minus node to support differential signaling. In such cases, the first interface 604-1 comprises a first differential interface 604-1, and the second interface 604-2 comprises a second differential interface 604-2. The first interface 604-1 includes a first plus node 606-1P and a first minus node 606-1M. The second interface 604-2 includes a second plus node 606-2P and a second minus node 606-2M. The first plus node 606-1P and the first minus node 606-1M are therefore coupled to the transformer 504 of the first coupling circuit 502-1. The second plus node 606-2P and the second minus node 606-2M are therefore coupled to the transformer 504 of the second coupling circuit 502-2. Each interface 604 is coupled to each bidirectional amplifier 602 of the multiple bidirectional amplifiers 602-1 . . . 602-A. Each bidirectional amplifier 602 is therefore coupled between both the first plus node 606-1P and the first minus node 606-1M and both the second plus node 606-2P and the second minus node 606-2M.

Each respective bidirectional amplifier 602 of the multiple bidirectional amplifiers 602-1, 602-2, . . . , 602-A corresponds to a respective amplification amount 612 of multiple amplification amounts 612-1, 612-2, . . . , 612-A. For example, a first bidirectional amplifier 602-1 can provide a first amplification amount 612-1, and a second bidirectional amplifier 602-2 can provide a second amplification amount 612-2. Thus, each bidirectional amplifier 602 can provide a different amplification amount 612. The different amplification amounts 612 can be weighted. Examples of weighting techniques include binary, thermometer-coded, logarithmic, and so forth. With a binary weighting approach and a five-bit VGA (e.g., "A"=5), the weights can correspond to 1×, 2×, 4×, 8×, and 16×, which provides 32 combinations for 32 potentially-different gain amounts provided by the VGA 136. There can be a different number of phase-shifter bits as compared to VGA gain bits. Phase-shifter bits refer to a resolution of the phase shifter. For instance, a five-bit phase shifter has a phase resolution of 11.25 degrees (360/2^5). Such a five-bit phase shifter can be implemented with a vector modulator having 4, 5, or 6-bit VGAs, depending on an amount of phase error that can be tolerated by a phase shifter. Nonetheless, the higher the number of bits in a VGA, the higher the phase resolution that is generally achievable with the phase shifter.

The different weightings, which provide a different amplification amount 612 for each bidirectional amplifier 602, can be realized in various manners. For example, transistors with different sizes can be used (e.g., transistor widths can be scaled) across the multiple bidirectional amplifiers 602-1 . . . 602-A in each VGA 136. Additionally or alternatively, different quantities of transistors can be used (e.g., quantities of transistors with the same widths can be scaled) across the multiple bidirectional amplifiers 602-1 . . . 602-A in each VGA 136. Other approaches to implementing different amplification amounts or different amplifier weights can be employed.

The phase control signal 208 controls a gain amount of the VGA 136. The gain amount of the VGA 136 corresponds to a combination of the multiple amplification amounts 612-1 . . . 612-A across the multiple bidirectional amplifiers 602-1 . . . 602-A of the VGA 136. The phase control signal 208 includes at least one amplification control signal 608. For example, the phase control signal 208 can include multiple amplification control signals 608-1, 608-2, . . . 608-A. In such cases, each respective bidirectional amplifier 602 of the multiple bidirectional amplifiers 602-1 . . . 602-A accepts, and corresponds to, a respective amplification control signal 608 of the multiple amplification control signals 608-1 . . . 608-A. For example, a first bidirectional amplifier 602-1 is coupled to accept a first amplification control signal 608-1, and a second bidirectional amplifier 602-2 is coupled to accept a second amplification control signal 608-2.

In operation, each respective bidirectional amplifier 602 establishes a respective amplification amount 612 based on the respective amplification control signal 608. Thus, each bidirectional amplifier 602 is activated or deactivated responsive to the amplification control signal 608 that is coupled thereto. A given amplification control signal 608 can comprise one or more bits to engage a different operational mode, examples of which are described below. Each amplification control signal 608 respectively corresponds to a bidirectional amplifier 602 that is capable of providing a respective amplification amount 612 (e.g., 1×, 2×, 4×, 8×, and 16× for a five-bit VGA 136). These bidirectional amplifiers can be activated individually or in combination (e.g., just 4× alone or both 2× and 8× together for 10× total). The VGA 136 can therefore provide up to 32 different gain amounts (e.g., from none to 31× for a five-bit VGA 136) by combining the available amplification amounts of the multiple amplification amounts 612-1 . . . 612-A.

Example operational modes for each bidirectional amplifier 602 are described herein. These operational modes include a regular active amplification mode that corresponds to a given amplification amount 612 (e.g., 1×, 4×, or 16×) for the given bidirectional amplifier 602 and an inverted active amplification mode that corresponds to a sign-switched version of the given amplification amount 612. These operational modes also include an inactive amplification mode in which a particular bidirectional amplifier 602 does not contribute a corresponding amplification amount 612 to the gain amount being programmed for the VGA 136 (e.g., the particular bidirectional amplifier 602 is deactivated). These amplification modes are described below with reference to FIGS. 11-1 to 11-3. Circuitry to enable such modes are described with reference to FIGS. 10-1 to 10-3. General aspects of a bidirectional amplifier 602, however, are described next with reference to FIGS. 7 to 9.

Figure 7:
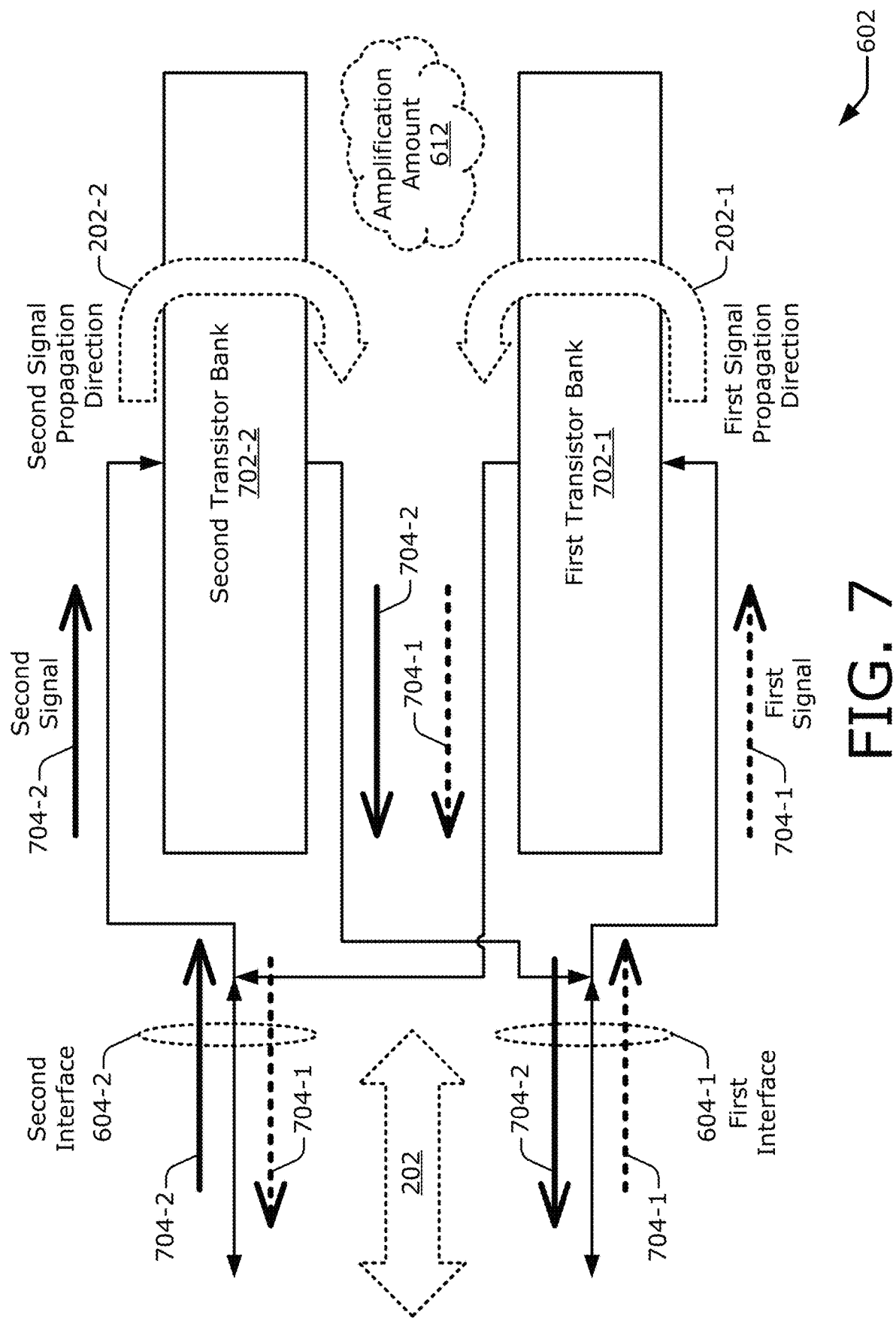
FIG. 7 is a schematic diagram that illustrates an example bidirectional amplifier including multiple transistor banks and that depicts multiple signal flows.

FIG. 7 is a schematic diagram that illustrates an example bidirectional amplifier 602 including multiple transistor banks and that depicts multiple signal flows. The bidirectional amplifier 602 corresponds to a particular amplification amount 612 and operates bidirectionally as indicated by the double-headed arrow of the signal flow direction 202. The bidirectional amplifier 602 includes the first interface 604-1 and the second interface 604-2. The bidirectional amplifier 602 can include a first amplification circuit for one propagation direction and a second amplification circuit for another propagation direction. In some cases, one of the amplification circuits is realized by a transistor bank. In other cases, both of the amplification circuits are realized by a respective transistor bank 702. As illustrated for the example of FIG. 7, the bidirectional amplifier 602 includes a first transistor bank 702-1 and a second transistor bank 702-2.

In example implementations, each respective transistor bank 702 processes signals flowing in a respective signal propagation direction. The first transistor bank 702-1 processes signals traveling along a first signal propagation direction 202-1 of the bidirectional signal flow direction 202. The first signal propagation direction 202-1 corresponds to signals flowing from the first interface 604-1 to the second interface 604-2. The second transistor bank 702-2 processes signals traveling along a second signal propagation direction 202-2 of the bidirectional signal flow direction 202. The second signal propagation direction 202-2 corresponds to signals flowing from the second interface 604-2 to the first interface 604-1. Thus, one of the first signal propagation direction 202-1 or the second signal propagation direction 202-2 corresponds to transmission operations, and the other signal propagation direction corresponds to reception operations. Based on this bidirectionality, one of the first transistor bank 702-1 or the second transistor bank 702-2 amplifies transmission signals for phase-shifting operations, and the other amplifies reception signals for the phase-shifting operations.

Two example signal flows in opposite directions are described. The two signal flows correspond to a first signal 704-1 that is represented by arrows with a dashed line and a second signal 704-2 that is represented by arrows with a solid line. These two signals can jointly correspond to the signal 324 of FIGS. 3-1 to 4-2. The first signal 704-1 enters the bidirectional amplifier 602 via the first interface 604-1. The first signal 704-1 propagates to the "lower edge" (as depicted) of the first transistor bank 702-1. The first transistor bank 702-1 amplifies the first signal 704-1 and outputs the amplified signal at the "top edge" of the first transistor bank 702-1. After amplification, the first signal 704-1 exits the bidirectional amplifier 602 via the second interface 604-2 (e.g., without passing through the second transistor bank 702-2).

For the opposite signal propagation direction, the second signal 704-2 enters the bidirectional amplifier 602 via the second interface 604-2. The second signal 704-2 propagates to the "upper edge" (as depicted) of the second transistor bank 702-2. The second transistor bank 702-2 amplifies the second signal 704-2 and outputs the amplified signal at the "lower edge" of the second transistor bank 702-2. After amplification, the second signal 704-2 exits the bidirectional amplifier 602 via the first interface 604-1 (e.g., without passing through the first transistor bank 702-1). The first interface 604-1 and the second interface 604-2 of the bidirectional amplifier 602 are therefore bidirectional. The first transistor bank 702-1 and the second transistor bank 702-2, on the other hand, can be implemented as unidirectional portions of the bidirectional amplifier 602.

Figure 8:
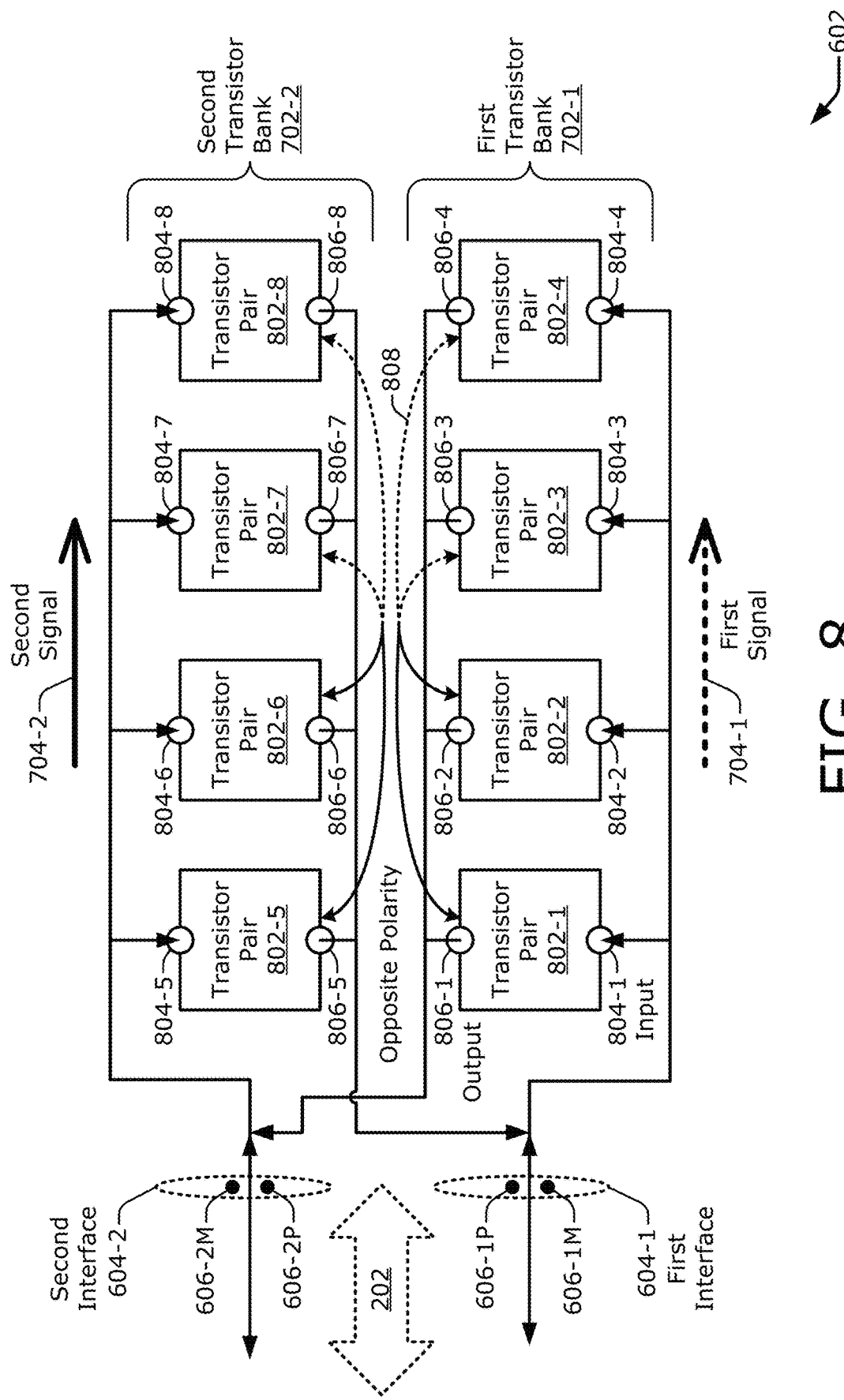
FIG. 8 is a schematic diagram illustrating an example bidirectional amplifier including multiple transistor banks, each of which includes multiple transistor pairs.

FIG. 8 is a schematic diagram illustrating an example bidirectional amplifier 602 including multiple transistor banks, each of which includes multiple transistor pairs. The first transistor bank 702-1 includes multiple transistor pairs, and the second transistor bank 702-2 includes multiple transistor pairs. As illustrated, the bidirectional amplifier 602 includes the first interface 604-1 and the second interface 604-2. The first interface 604-1 includes the first plus node 606-1P and the first minus node 606-1M. The second interface 604-2 includes the second plus node 606-2P and the second minus node 606-2M. Thus, the first interface 604-1 comprises a first bidirectional interface 604-1, and the second interface 604-2 comprises a second bidirectional interface 604-2.

In example implementations, the bidirectional amplifier 602 includes multiple transistor pairs, such as eight (8) transistor pairs 802-1, 802-2, . . . , 802-7, 802-8. In this case, each transistor bank 702 includes four transistor pairs. The first transistor bank 702-1 includes a first transistor pair 802-1, a second transistor pair 802-2, a third transistor pair 802-3, and a fourth transistor pair 802-4. The second transistor bank 702-2 includes a fifth transistor pair 802-5, a sixth transistor pair 802-6, a seventh transistor pair 802-7, and an eighth transistor pair 802-8. Each transistor pair 802 is coupled between the first interface 604-1 and the second interface 604-2.

Each respective transistor pair 802 includes a respective input 804 and a respective output 806. For the first transistor bank 702-1, the first transistor pair 802-1 includes an input 804-1 and an output 806-1. The second transistor pair 802-2 includes an input 804-2 and an output 806-2. The third transistor pair 802-3 includes an input 804-3 and an output 806-3. The fourth transistor pair 802-4 includes an input 804-4 and an output 806-4. The respective inputs 804-1, 804-2, 804-3, and 804-4 of the first, second, third, and fourth transistor pairs 802-1, 802-2, 802-3, and 802-4 correspond to the first interface 604-1, such as by being coupled to the first plus node 606-1P and the first minus node 606-1M. The respective outputs 806-1, 806-2, 806-3, and 806-4 of the first, second, third, and fourth transistor pairs 802-1, 802-2, 802-3, and 802-4 correspond to the second interface 604-2, such as by being coupled to the second plus node 606-2P and the second minus node 606-2M. Thus, the first signal 704-1 (e.g., also of FIG. 7) can travel through at least one of the first, second, third, or fourth transistor pairs 802-1, 802-2, 802-3, or 802-4 for amplification as the first signal 704-1 propagates from the first interface 604-1 to the second interface 604-2. In this scenario, the first interface 604-1 comprises a differential signaling input of the bidirectional amplifier 602, and the second interface 604-2 comprises a differential signaling output of the bidirectional amplifier 602.

For the second transistor bank 702-2, the fifth transistor pair 802-5 includes an input 804-5 and an output 806-5. The sixth transistor pair 802-6 includes an input 804-6 and an output 806-6. The seventh transistor pair 802-7 includes an input 804-7 and an output 806-7. The eighth transistor pair 802-8 includes an input 804-8 and an output 806-8. The respective inputs 804-5, 804-6, 804-7, and 804-8 of the fifth, sixth, seventh, and eighth transistor pairs 802-5, 802-6, 802-7, and 802-8 correspond to the second interface 604-2, such as by being coupled to the second plus node 606-2P and the second minus node 606-2M. The respective outputs 806-5, 806-6, 806-7, and 806-8 of the fifth, sixth, seventh, and eighth transistor pairs 802-5, 802-6, 802-7, and 802-8 correspond to the first interface 604-1, such as by being coupled to the first plus node 606-1P and the first minus node 606-1M. Thus, the second signal 704-2 (e.g., also of FIG. 7) can travel through at least one of the fifth, sixth, seventh, or eighth transistor pairs 802-5, 802-6, 802-7, or 802-8 for amplification as the second signal 704-2 propagates from the second interface 604-2 to the first interface 604-1. In this scenario, the first interface 604-1 comprises a differential signaling output of the bidirectional amplifier 602, and the second interface 604-2 comprises a differential signaling input of the bidirectional amplifier 602.

In some implementations, half of the transistor pairs in a given transistor bank 702 are coupled at the outputs thereof with one differential polarity, and the other half of the transistor pairs in the given transistor bank 702 are coupled to the outputs thereof with another differential polarity that is different. This is indicated in FIG. 8 by the opposite polarity coupling 808. In this example, the first and second transistor pairs 802-1 and 802-2 are coupled to the second interface 604-2 via a first differential polarity, and the third and fourth transistor pairs 802-3 and 802-4 are coupled to the second interface 604-2 via a second differential polarity. In other words, the plus and minus output signal couplings are swapped between the first and second transistor pairs 802-1 and 802-2 as compared to those of the third and fourth transistor pairs 802-3 and 802-4.

Similarly, the fifth and sixth transistor pairs 802-5 and 802-6 are coupled to the first interface 604-1 via a first differential polarity, and the seventh and eighth transistor pairs 802-7 and 802-8 are coupled to the first interface 604-1 via a second differential polarity. In other words, the plus and minus output signal couplings are swapped between the fifth and sixth transistor pairs 802-5 and 802-6 relative to those of the seventh and eighth transistor pairs 802-7 and 802-8. The opposite polarity coupling 808 can produce an inverted, or sign-swapped, signal as is described below. The opposite polarity coupling 808 can also neutralize parasitic capacitances of the transistors during operation, which is described below with regard to the inactive operational mode. Individual transistors of each transistor pair 802 include an input 804 and an output 806, such as input terminal and an output terminal. Examples of such terminals are described below with reference to FIG. 9.

The opposite polarity coupling 808 is illustrated in FIG. 8 symmetrically (from a left-right perspective as depicted) and described above in terms of two transistor pairs of the same polarity being next to each other. The opposite polarity coupling 808 can, however, be implemented differently. For example, different differential output polarities can be implemented with alternating transistor pairs that are adjacent to one another. Thus, the differential output polarities for multiple transistor pairs in a given transistor bank 702 can be ordered differently than is shown in FIG. 8 or 9 or than is described herein.

Figure 9:
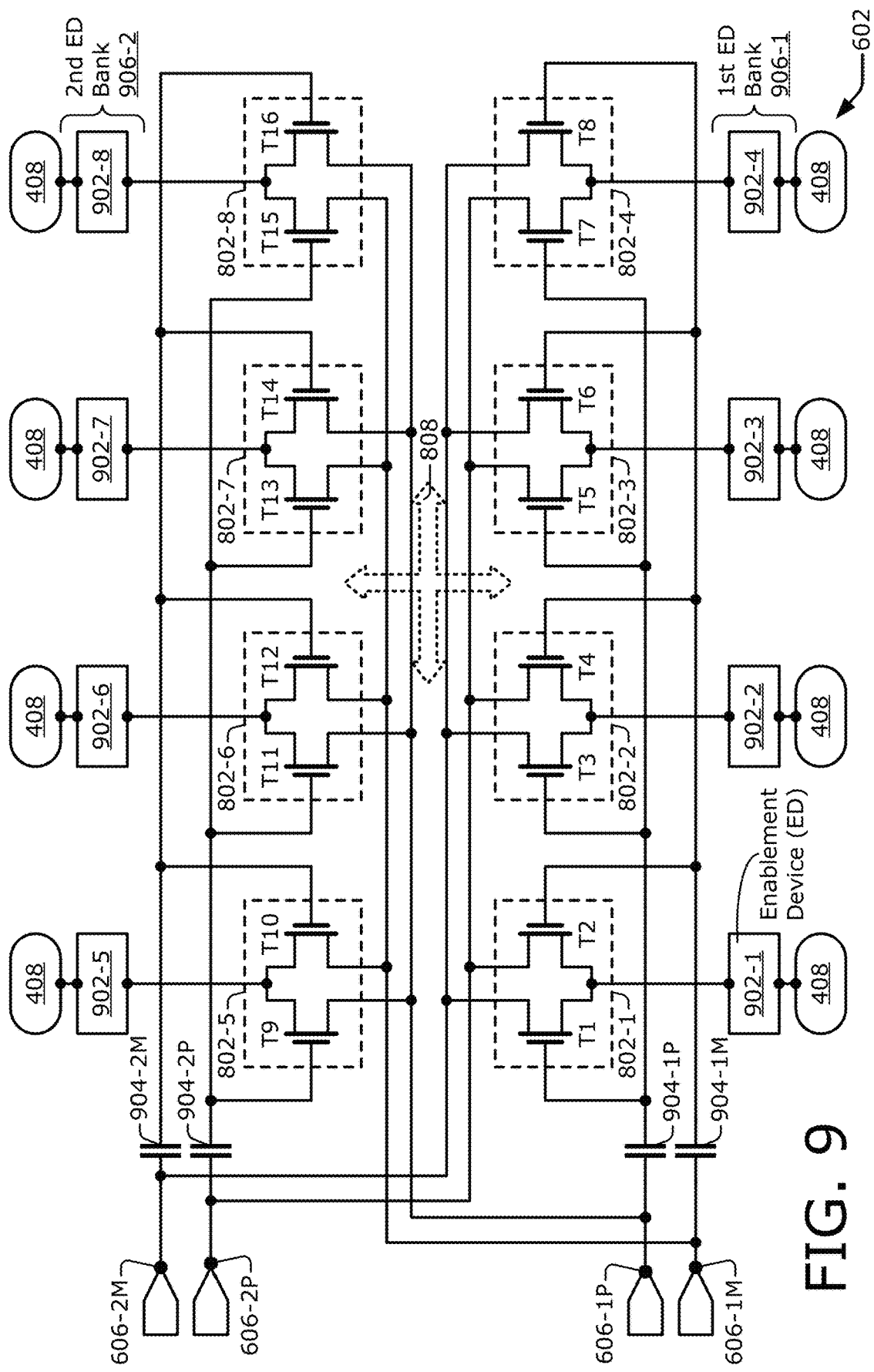
FIG. 9 is a circuit diagram illustrating an example bidirectional amplifier including multiple transistor pairs and multiple enablement-device banks.

FIG. 9 is a circuit diagram illustrating an example bidirectional amplifier 602 including multiple transistor pairs and multiple enablement-device banks. As compared to FIG. 8, each transistor pair 802 in FIG. 9 is explicitly shown to include two transistors for a differential implementation. As illustrated, the bidirectional amplifier 602 includes the first minus node 606-1M, the first plus node 606-1P, the second plus node 606-2P, and the second minus node 606-2M. FIG. 9 also includes a first enablement-device bank 906-1 and a second enablement-device bank 906-2. Each enablement-device bank 906 includes multiple enablement devices. Each enablement device 902 (ED 902) is coupled to a PDN node 408 and a transistor pair 802. The example opposite polarity coupling 808 is also depicted with dashed lines.

In example implementations, the first transistor bank 702-1 and the second transistor bank 702-2 (each of FIGS. 7 and 8) each include four transistor pairs for eight transistors total. Thus, the bidirectional amplifier 602 of FIG. 9 includes 16 transistors. The first transistor pair 802-1 includes a first transistor T1 and a second transistor T2. The second transistor pair 802-2 includes a third transistor T3 and a fourth transistor T4. The third transistor pair 802-3 includes a fifth transistor T5 and a sixth transistor T6. The fourth transistor pair 802-4 includes a seventh transistor T7 and an eighth transistor T8. The fifth transistor pair 802-5 includes a ninth transistor T9 and a tenth transistor T10. The sixth transistor pair 802-6 includes an eleventh transistor T11 and a twelfth transistor T12. The seventh transistor pair 802-7 includes a thirteenth transistor T13 and a fourteenth transistor T14. The eighth transistor pair 802-8 includes a fifteenth transistor T15 and a sixteenth transistor T16.

Each transistor (T#) is illustrated in FIG. 9 as a metal-oxide-semiconductor (MOS) field-effect transistor (FET) (MOSFET). However, each transistor of each transistor pair 802 may be implemented with a different type of transistor, such as another type of FET (e.g., a junction FET (JFET)), a bipolar junction transistor (BJT), and so forth. FETs can be implemented with an n-channel or a p-channel Thus, each transistor of the bidirectional amplifier 602 can be implemented as an n-channel metal-oxide-semiconductor (MOS) field-effect transistor (FET) (nMOSFET) or as a p-channel metal-oxide-semiconductor (MOS) field-effect transistor (FET) (pMOSFET). For FET implementations, each transistor includes a gate terminal and one or more channel terminals. As used herein, the one or more channel terminals can include a source terminal and a drain terminal.

Each transistor includes an input 804 and an output 806 (each of FIG. 8). For each transistor in FIG. 9, a gate terminal corresponds to the input 804, and a channel terminal corresponds to the output 806. Each node 606 is coupled to gate terminals of multiple ones of the sixteen transistors T1 to T16. More specifically, the four differential nodes are alternating-current coupled (AC-coupled) to the gate terminals of the transistors T1 to T16 via at least one coupling capacitor. As shown, the first minus node 606-1M is AC-coupled to the first, second, third, and fourth transistor pairs 802-1, 802-2, 802-3, and 802-4 via a first minus capacitor 904-1M. The first plus node 606-1P is AC-coupled to the first, second, third, and fourth transistor pairs 802-1, 802-2, 802-3, and 802-4 via a first plus capacitor 904-1P. The second plus node 606-2P is AC-coupled to the fifth, sixth, seventh, and eighth transistor pairs 802-5, 802-6, 802-7, and 802-8 via a second plus capacitor 904-2P. The second minus node 606-2M is AC-coupled to the fifth, sixth, seventh, and eighth transistor pairs 802-5, 802-6, 802-7, and 802-8 via a second minus capacitor 904-2M. In contrast, the output of each transistor pair 802 is direct-current-coupled (DC-coupled) to plus and minus nodes to provide power with a DC current that flows through each respective enablement device 902, which is described below.

As shown, the first transistor T1 is coupled between the first plus node 606-1P and the second minus node 606-2M. The second transistor T2 is coupled between the first minus node 606-1M and the second plus node 606-2P. The third transistor T3 is coupled between the first plus node 606-1P and the second minus node 606-2M. The fourth transistor T4 is coupled between the first minus node 606-1M and the second plus node 606-2P. The fifth transistor T5 is coupled between the first plus node 606-1P and the second plus node 606-2P. The sixth transistor T6 is coupled between the first minus node 606-1M and the second minus node 606-2M. The seventh transistor T7 is coupled between the first plus node 606-1P and the second plus node 606-2P. The eighth transistor T8 is coupled between the first minus node 606-1M and the second minus node 606-2M.

Further, the ninth transistor T9 is coupled between the second plus node 606-2P and the first plus node 606-1P. The tenth transistor T10 is coupled between the second minus node 606-2M and the first minus node 606-1M. The eleventh transistor T11 is coupled between the second plus node 606-2P and the first plus node 606-1P. The twelfth transistor T12 is coupled between the second minus node 606-2M and the first minus node 606-1M. The thirteenth transistor T13 is coupled between the second plus node 606-2P and the first minus node 606-1M. The fourteenth transistor T14 is coupled between the second minus node 606-2M and the first plus node 606-1P. The fifteenth transistor T15 is coupled between the second plus node 606-2P and the first minus node 606-1M. The sixteenth transistor T16 is coupled between the second minus node 606-2M and the first plus node 606-1P.

In some implementations, the first, second, third, fourth, fifth, sixth, seventh, and eighth transistors T1, T2, T3, T4, T5, T6, T7, and T8 each approximately have a first size. The ninth, tenth, eleventh, twelfth, thirteenth, fourteenth, fifteenth, and sixteenth transistors T9, T10, T11, T12, T13, T14, T15, and T16 each approximately have a second size. The first size can be substantially different from the second size. For example, the first size can be architected to be a different size than the second size based on a process technology used to fabricate the bidirectional amplifier 602. In some cases, the second size can be at least 20% larger than the first size. This enables the transistors that amplify signals propagating along one direction (e.g., for transmission operations) to be tuned differently than transistors that amplify signals propagating along another direction (e.g., for reception operations).

Transistor size can relate, for example, to how physically large a transistor is or how much current a transistor is capable of handling. For instance, transistor size can be determined at least partially by channel width. Alternatively, transistor size can be determined at least partially by channel length. Further, transistor size can be determined at least partially by a quantity of fins of a fin FET (FinFET) transistor. The quantity of fins is also referred to herein as an effective channel width. Transistor size can also correspond to a combination of two or more of channel width, channel length, effective channel width, and so forth.

Each of the two differential interfaces 604 (e.g., of FIGS. 7 and 8) operate as an input with respect to one transistor bank 702 and as an output with respect to the other transistor bank 702. With regard to the first, second, third, fourth, fifth, sixth, seventh, and eighth transistors T1, T2, T3, T4, T5, T6, T7, and T8, the first plus node 606-1P and the first minus node 606-1P comprise a first differential signaling input of the bidirectional amplifier 602 with respect to the first signal propagation direction 202-1 (e.g., of FIG. 7). The second plus node 606-2P and the second minus node 606-2M comprise a first differential signaling output of the bidirectional amplifier 602 with respect to the first signal propagation direction 202-1 for the first transistor bank 702-1 (e.g., of FIGS. 7 and 8). With regard to the ninth, tenth, eleventh, twelfth, thirteenth, fourteenth, fifteenth, and sixteenth transistors T9, T10, T11, T12, T13, T14, T15, and T16, the second plus node 606-2P and the second minus node 606-2M comprise a second differential signaling input of the bidirectional amplifier 602 with respect to a second signal propagation direction 202-2. The first plus node 606-1P and the first minus node 606-1M comprise a second differential signaling output of the bidirectional amplifier 602 with respect to the second signal propagation direction 202-2 for the second transistor bank 702-2 (e.g., of FIGS. 7 and 8).

In some implementations, each enablement-device bank 906 includes four enablement devices. The first enablement-device bank 906-1 includes a first enablement device 902-1, a second enablement device 902-2, a third enablement device 902-3, and a fourth enablement device 902-4. The second enablement-device bank 906-2 includes a fifth enablement device 902-5, a sixth enablement device 902-6, a seventh enablement device 902-7, and an eighth enablement device 902-8. Each respective enablement device 902 is coupled between a respective transistor pair 802 and a PDN node 408. As described below with reference to FIGS. 10-1 to 10-3, each PDN node 408 may comprise a power supply node 408-1 or a ground node 408-2, depending on transistor type.

Specifically, the first enablement device 902-1 is coupled between the first transistor pair 802-1 and a PDN node 408. The second enablement device 902-2 is coupled between the second transistor pair 802-2 and a PDN node 408. The third enablement device 902-3 is coupled between the third transistor pair 802-3 and a PDN node 408. The fourth enablement device 902-4 is coupled between the fourth transistor pair 802-4 and a PDN node 408. The fifth enablement device 902-5 is coupled between the fifth transistor pair 802-5 and a PDN node 408. The sixth enablement device 902-6 is coupled between the sixth transistor pair 802-6 and a PDN node 408. The seventh enablement device 902-7 is coupled between the seventh transistor pair 802-7 and a PDN node 408. The eighth enablement device 902-8 is coupled between the eighth transistor pair 802-8 and a PDN node 408. The PDN node 408 may be the same or may be different between the two first and second transistor banks 702-1 and 702-2.

As noted above, the various transistor pairs can be arranged with an opposite polarity coupling 808 between two or more different transistor pairs, which is described as follows. On the input side, each transistor pair 802 of a given transistor bank 702 is coupled to an interface 604 in a like manner. On the output side, on the other hand, each transistor pair 802 of the given transistor bank 702 is coupled to the other interface 604 in one of two different manners. With reference to the first transistor bank 702-1 (as indicated in FIGS. 7 and 8), the first, third, fifth, and seventh transistors T1, T3, T5, and T7 (e.g., four plus transistors) are each coupled to the first plus node 606-1P via a respective gate terminal thereof. The second, fourth, sixth, and eighth transistors T2, T4, T6, and T8 (e.g., four minus transistors) are each coupled to the first minus node 606-1M via a respective gate terminal thereof. The eight transistors T1 to T8 of these four transistor pairs 802-1 to 802-4 are therefore coupled to the first plus node 606-1P and the first minus node 606-1M in a same manner on the input side of the first transistor bank 702-1.

The eight transistors T1 to T8 of the four transistor pairs 802-1 to 802-4, however, are coupled to the second plus node 606-2P and the second minus node 606-2M differently on the output side of the first transistor bank 702-1. The first and third transistors T1 and T3 are coupled to the second minus node 606-2M via respective channel terminals thereof. The second and fourth transistors T2 and T4 are coupled to the second plus node 606-2P via respective channel terminals thereof. In contrast, the fifth and seventh transistors T5 and T7 are coupled to the second plus node 606-2P via respective channel terminals thereof. Further, the sixth and eighth transistors T6 and T8 are coupled to the second minus node 606-2M via respective channel terminals thereof. In other words, for the third and fourth transistor pairs 802-3 and 802-4, plus inputs are coupled to plus outputs, and minus inputs are coupled to minus outputs. This differential polarity is swapped for the first and second transistor pairs 802-1 and 802-2 in which plus inputs are coupled to minus outputs, and minus inputs are coupled to plus outputs. This opposite polarity coupling 808 is utilized in some of the operational modes described below.

Figures 1, 10:
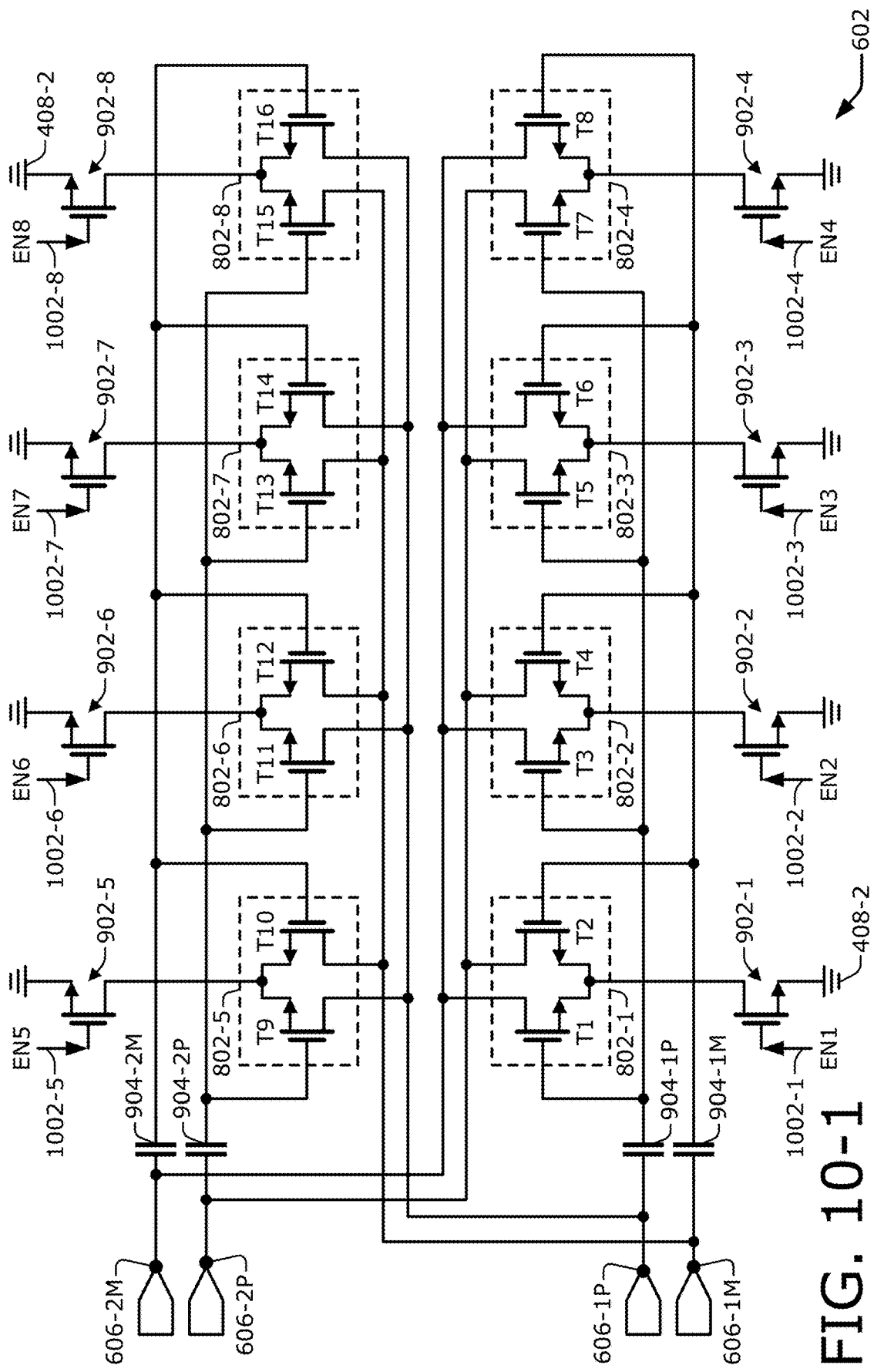
Figures 2, 10:
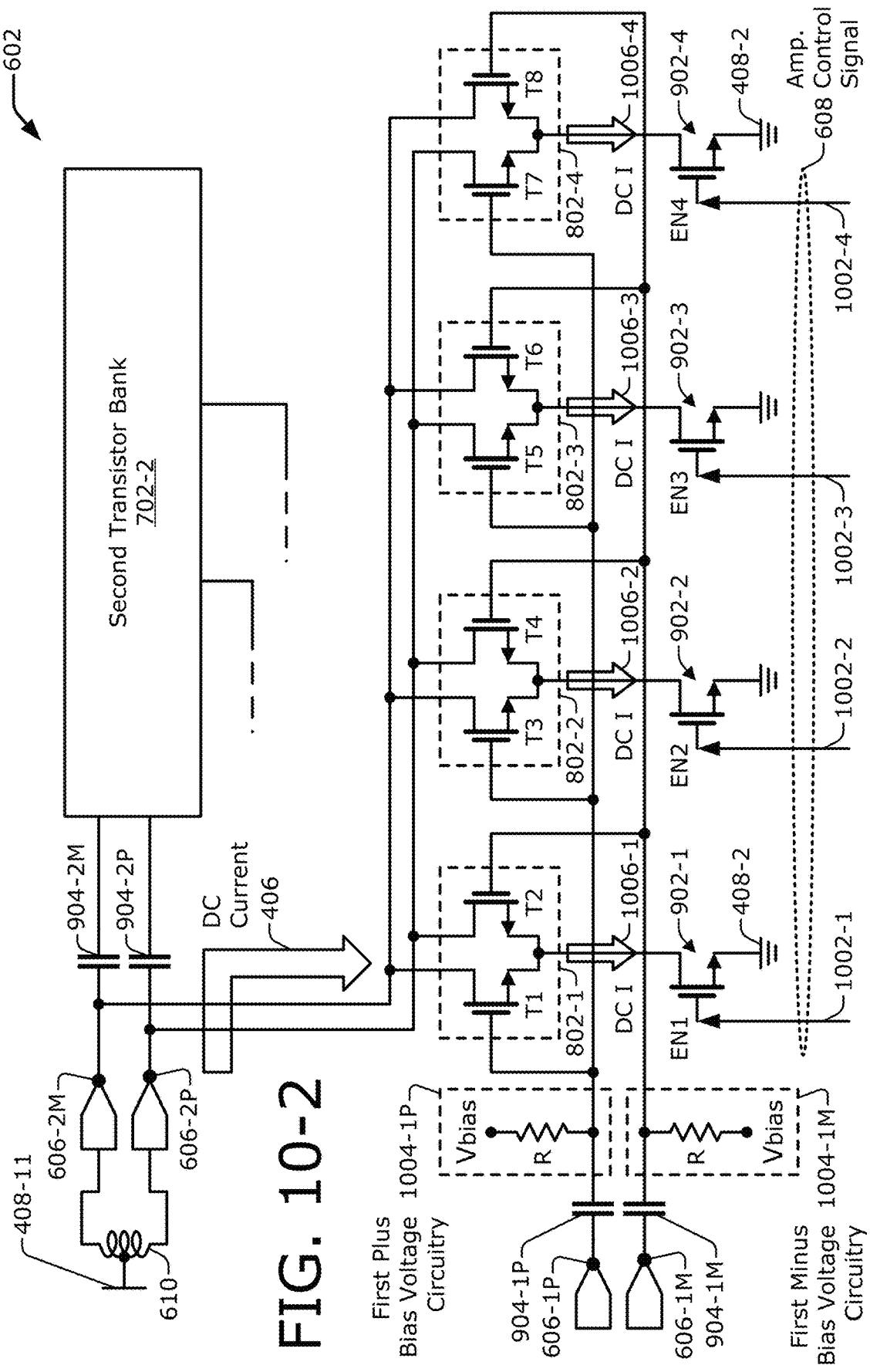
Figures 3, 10:
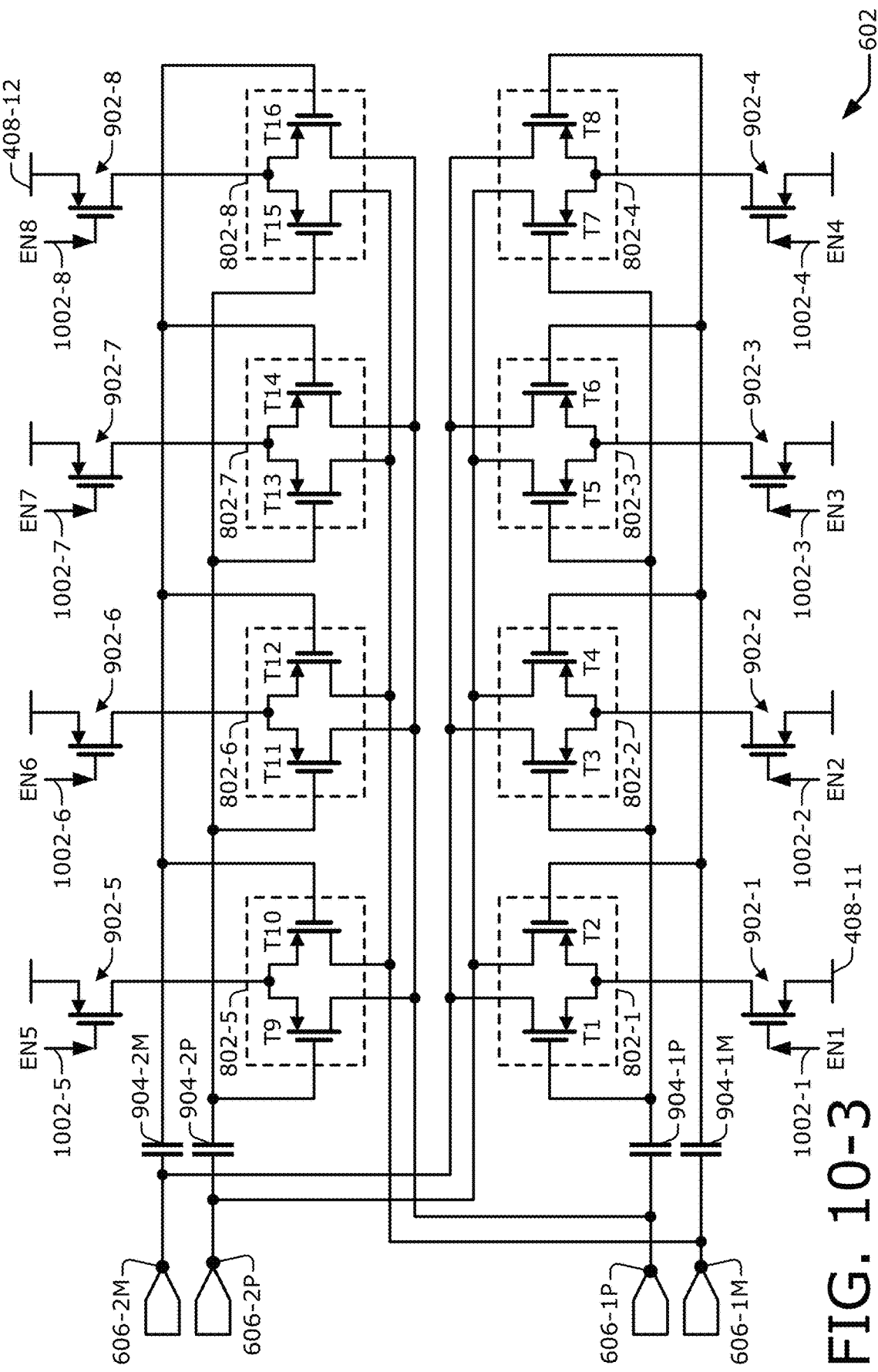

FIG. 10-1 is a circuit diagram illustrating an example bidirectional amplifier 602 including example enablement devices and an example power distribution network implementation. In FIG. 10-1, each of the 16 transistors T of the eight transistor pairs 802-1 ... 802-8 is implemented with an n-type MOSFET (nMOSFET). In the illustrated example, each enablement device 902 is implemented using as an enablement transistor. The first enablement device 902-1 includes a first enablement transistor, and the second enablement device 902-2 includes a second enablement transistor. The third enablement device 902-3 includes a third enablement transistor. The fourth enablement device 902-4 includes a fourth enablement transistor. Also, the fifth enablement device 902-5 includes a fifth enablement transistor, and the sixth enablement device 902-6 includes a sixth enablement transistor. The seventh enablement device 902-7 includes a seventh enablement transistor. The eighth enablement device 902-8 includes an eighth enablement transistor.

Each respective enablement device 902 is coupled between a respective transistor pair 802 and the ground node 408-2. Here, each enablement transistor of each enablement device 902 is implemented using an n-type MOSFET (nMOSFET). A drain terminal of each enablement transistor of each enablement device 902 is coupled to a source terminal of both transistors in each transistor pair 802. A source terminal of each enablement transistor is coupled to the ground node 408-2.

A gate terminal of each enablement transistor of each respective enablement device 902 is coupled to a respective enablement signal 1002 (EN 1002). The gate terminal of the enablement transistor of the first enablement device 902-1 accepts a first enablement signal 1002-1 (EN1). The gate terminal of the enablement transistor of the second enablement device 902-2 accepts a second enablement signal 1002-2 (EN2). The gate terminal of the enablement transistor of the third enablement device 902-3 accepts a third enablement signal 1002-3 (EN3). The gate terminal of the enablement transistor of the fourth enablement device 902-4 accepts a fourth enablement signal 1002-4 (EN4). The gate terminal of the enablement transistor of the fifth enablement device 902-5 accepts a fifth enablement signal 1002-5 (EN5). The gate terminal of the enablement transistor of the sixth enablement device 902-6 accepts a sixth enablement signal 1002-6 (EN6). The gate terminal of the enablement transistor of the seventh enablement device 902-7 accepts a seventh enablement signal 1002-7 (EN7). The gate terminal of the enablement transistor of the eighth enablement device 902-8 accepts an eighth enablement signal 1002-8 (EN8).

In example operations, each respective enablement signal 1002 can enable or disable a respective transistor pair 802 using the respective enablement device 902. If the enablement transistor of an enablement device 902 is turned on, a DC current flows through the two transistors of the corresponding respective transistor pair 802. This DC current flow enables the transistor pair 802. To turn on an nMOSFET transistor, the enablement signal 1002 is driven to a high voltage level. To turn off the nMOSFET enablement transistor of a given enablement device 902 and block the DC current from flowing through the two transistors of the corresponding transistor pair 802, the enablement signal 1002 is driven to a low voltage level. Example aspects of the DC current and the enablement signal 1002 are described below with reference to FIG. 10-2.

FIG. 10-2 is a circuit diagram that illustrates an example bidirectional amplifier 602 and that depicts multiple example operational aspects. These example operational aspects include enabling or disabling transistor pairs, creating DC current flows, and establishing DC voltage biases. For clarity, the transistors of the first transistor bank 702-1 (of FIGS. 7 and 8) are shown, but the transistors of the second transistor bank 702-2 are omitted. As illustrated, the bidirectional amplifier 602 includes bias voltage circuitry 1004, accepts an amplification control signal 608, and includes two DC currents: the DC current 406 and a DC current 1006 that flows through each depicted transistor pair 802-1 to 802-4.

In example implementations, the eight transistors T1-T8 are DC biased to enable the transistors to amplify an AC signal (e.g., the first signal 704-1 of FIGS. 7 and 8). To do so, the bias voltage circuitry 1004 is DC-coupled to the gate terminal of each of the eight transistors T1-T8. First plus bias voltage circuitry 1004-1P includes a resistor R and couples a bias voltage (Vbias) to the gate terminals of the first, third, fifth, and seventh transistors T1, T3, T5, and T7. First minus bias voltage circuitry 1004-1M includes another resistor R and couples the bias voltage (Vbias) to the gate terminals of the second, fourth, sixth, and eighth transistors T2, T4, T6, and T8. Although not shown, second plus bias voltage circuitry and second minus bias voltage circuitry can be coupled to the four transistor pairs of the second transistor bank 702-2 to DC bias the eight transistors thereof.

The amplification control signal 608 (e.g., also of FIG. 6) controls the amplification amount of the bidirectional amplifier 602. As shown in FIG. 10-2, the amplification control signal 608 includes multiple enablement signals, such as at least the multiple enablement signals 1002-1 to 1002-4 for the four transistor pairs 802-1 to 802-4. The amplification control signal 608 can also or instead include the multiple enablement signals 1002-5 to 1002-8 (e.g., of FIGS. 10-1 and 10-3). Thus, the amplification control signal 608 can include multiple bits, such as four or eight bits. Each respective enablement signal 1002 controls the flow of a respective DC current 1006 through a respective transistor pair 802.

In an example operation, the DC current 406 flows from the first power supply node 408-11 to the ground node 408-2. The DC current 406 can be separated into or distributed across two wires for the differential pathway. The DC current 406 flows through the central tap of the inductor 610 (which may be part of a transformer as shown in FIGS. 5 and 6) and through the second plus and minus nodes 606-2P and 606-2M. The DC current 406 splits into up to four DC currents, which include a first DC current 1006-1 (DC I), a second DC current 1006-2, a third DC current 1006-3, and a fourth DC current 1006-4. The first DC current 1006-1 flows through the first transistor pair 802-1 and the enablement transistor of the first enablement device 902-1 to the ground 408-2. The second DC current 1006-2 flows through the second transistor pair 802-2 and the enablement transistor of the second enablement device 902-2 to the ground 408-2. The third DC current 1006-3 flows through the third transistor pair 802-3 and the enablement transistor of the third enablement device 902-3 to the ground 408-2. The fourth DC current 1006-4 flows through the fourth transistor pair 802-4 and the enablement transistor of the fourth enablement device 902-4 to the ground 408-2. As described below with reference to FIGS. 11-1 to 11-3, for certain implementations, two DC currents are flowing at any given time depending on which operational mode is engaged.

Thus, the DC current 406 may be split into two DC currents, such as the first DC current 1006-1 and the second DC current 1006-2.

These DC currents and DC bias voltages place the eight transistors T1-T8 into states in which each can selectively amplify an AC first signal 704-1 (e.g., of FIGS. 7 and 8) responsive to the multiple enablement signals 1002-1 to 1002-4 of the amplification control signal 608. The eight transistors T9-T16 of the second transistor bank 702-2 can operate analogously to selectively amplify an AC second signal 704-2 responsive to the multiple enablement signals 1002-5 to 1002-8 of the amplification control signal 608. The transistors T1-T16 of FIGS. 10-1 and 10-2 are described as having an n-channel. However, p-channel MOSFETs can be used instead, and this is described with reference to FIG. 10-3.

FIG. 10-3 is a circuit diagram illustrating an example bidirectional amplifier 602 including other example enablement devices 902-1 . . . 902-8 and another example power distribution network implementation. In the examples of FIG. 10-3, the 16 transistors T1-T16 of the eight transistor pairs 802-1 . . . 802-8 and the eight enablement transistors of the eight enablement devices 902-1 . . . 902-8 are implemented using at least one p-type MOSFET (pMOSFET). To accommodate the p-type transistors, each respective enablement transistor of the eight enablement devices 902-1 . . . 902-8 is coupled between a respective transistor pair 802 of the eight transistor pairs 802-1 . . . 802-8 and at least one power supply node 408-1. To further enable operational tuning between the two transistor banks (e.g., for transmission versus reception operations), the four enablement devices 902-1 to 902-4 can be coupled to a first power supply node 408-11, and the four enablement devices 902-5 to 902-8 can be coupled to a second power supply node 408-12.

DC currents can flow by turning on the p-type MOSFET of each enablement transistor of each enablement device 902. Thus, each enablement signal 1002 is driven to a low voltage to turn on the corresponding pMOSFET. To enable the DC current 406 (e.g., of FIGS. 4-1 and 10-2) to flow, the at least one inductor 610 (e.g., of FIGS. 6 and 10-2) of a transformer 504 is coupled to at least one ground node 408-2 (not explicitly shown) via a central tap of the inductor 610. In example operations, up to four separate DC currents (e.g., that are like the DC currents 1006-1 to 1006-4 of FIG. 10-2) can flow from the first power supply node 408-11 through each respective enablement device 902 of the four enablement devices 902-1 to 902-4 and through each respective transistor pair 802 of the four transistor pairs 802-1 to 802-4. These separate DC currents combine at the outputs of the enabled ones of the multiple transistor pairs 802-1 to 802-4 to form the DC current 406. This DC current 406 flows through the second plus node 606-2P and the second minus node 606-2M and through the inductor 610 of a transformer 504 to the ground node 408-2. As described below with reference to FIGS. 11-1 to 11-3, for certain implementations, two DC currents are flowing at any given time depending on which operational mode is engaged. Thus, two DC currents, such as the first DC current 1006-1 and the second DC current 1006-2, may be combined into the DC current 406.

A given bidirectional amplifier 602 can be engaged into one of at least three different operational modes as part of a VGA 136 that forms a portion of a vector modulator 134 of a phase shifter 130. Example operational modes include an active mode, an inverted active mode, and an inactive mode. The "regular" active amplification mode corresponds to a particular amplification amount 612 for a given bidirectional amplifier 602. The inverted active amplification mode corresponds to a sign-switched version of the particular amplification amount 612 of the given bidirectional amplifier 602. The inactive amplification mode results in deactivating amplification by the given bidirectional amplifier 602. The inactive mode means that the bidirectional amplifier 602 does not contribute a corresponding amplification amount 612 to the gain amount being programmed for the VGA 136. The active amplification mode is described with reference to FIG. 11-1. The inverted active amplification mode is described with reference to FIG. 11-2. The inactive amplification mode is described with reference to FIG. 11-3.

In each amplification mode, two transistor pairs of a given transistor bank 702 are enabled while the other two transistor pairs of the same transistor bank 702 are disabled. The four transistor pairs of the other transistor bank 702 for signals propagating in the opposite direction are also disabled. Thus, two transistor pairs are enabled and two transistor pairs are disabled along a particular signal flow path for each amplification mode. This enables the VGA 136 to maintain a substantially constant impedance and phase as the gain amount is being programmed because a total quantity of active transistor pairs that are enabled across the VGA 136 is unchanged at each gain amount. For example, with four bidirectional amplifiers in a VGA 136, eight transistor pairs are enabled, and eight transistor pairs are disabled for each programmed gain amount along a particular signal propagation direction.

Figures 1, 11:
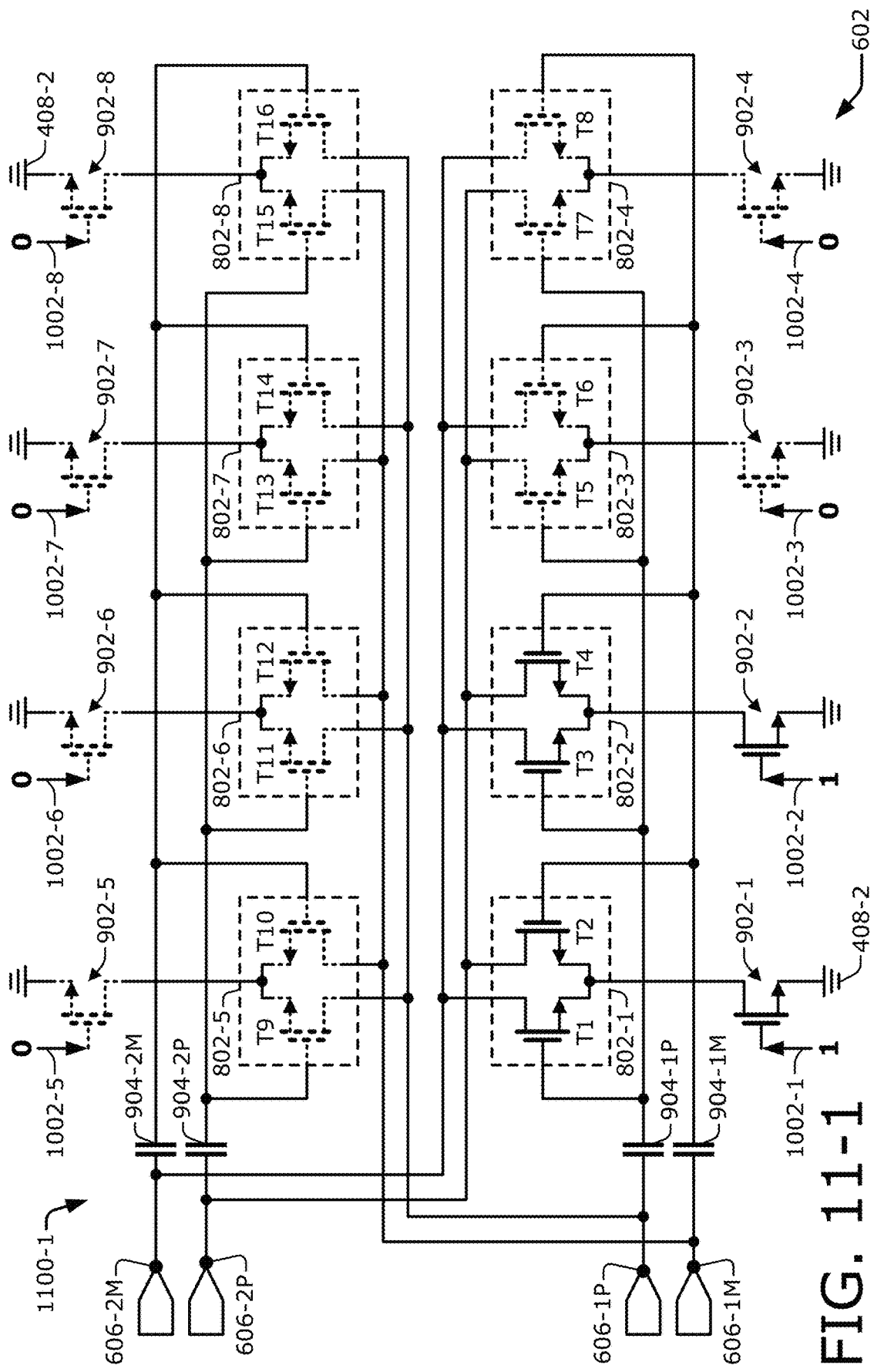
Figures 2, 11:
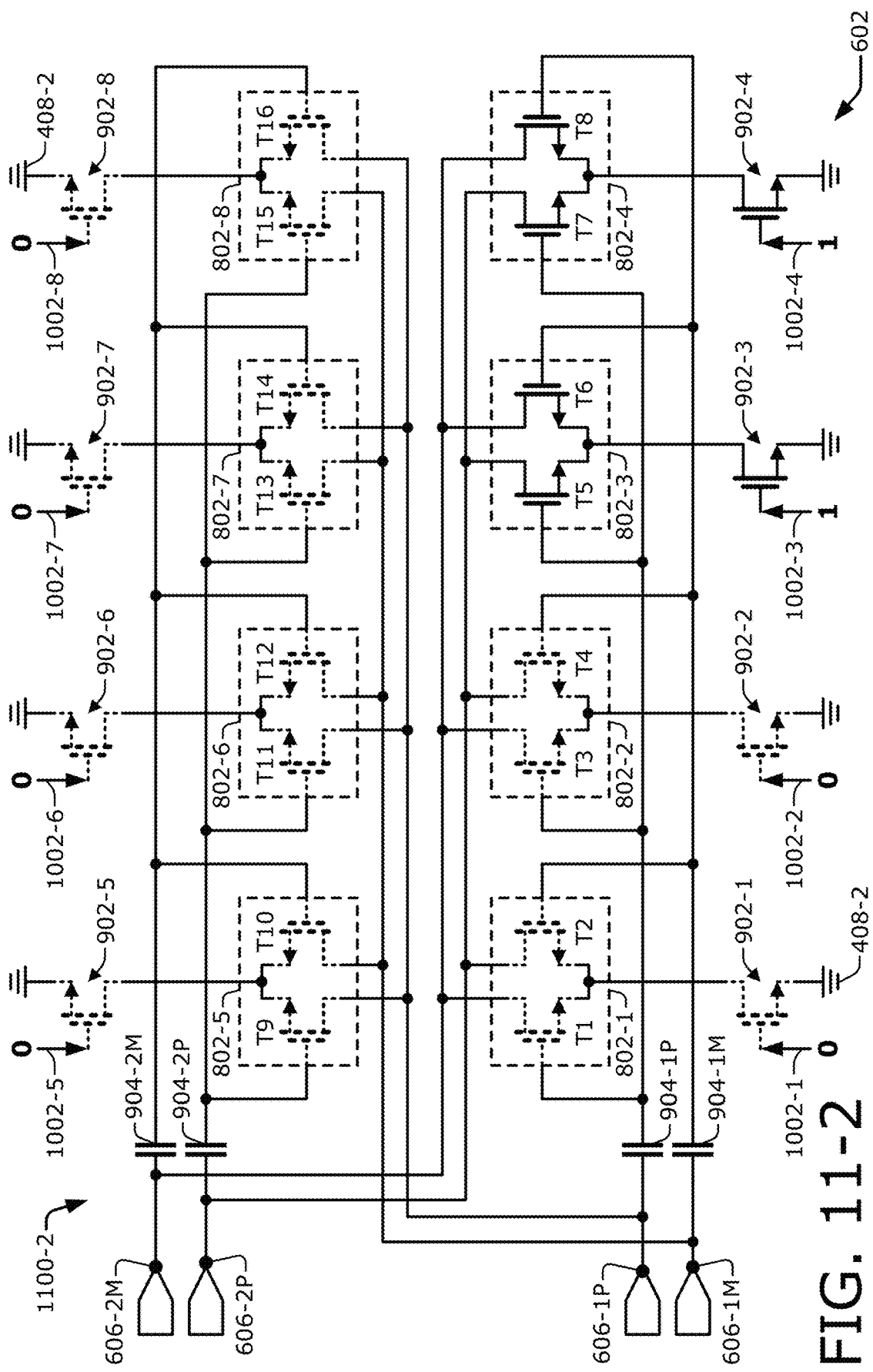
Figures 3, 11:
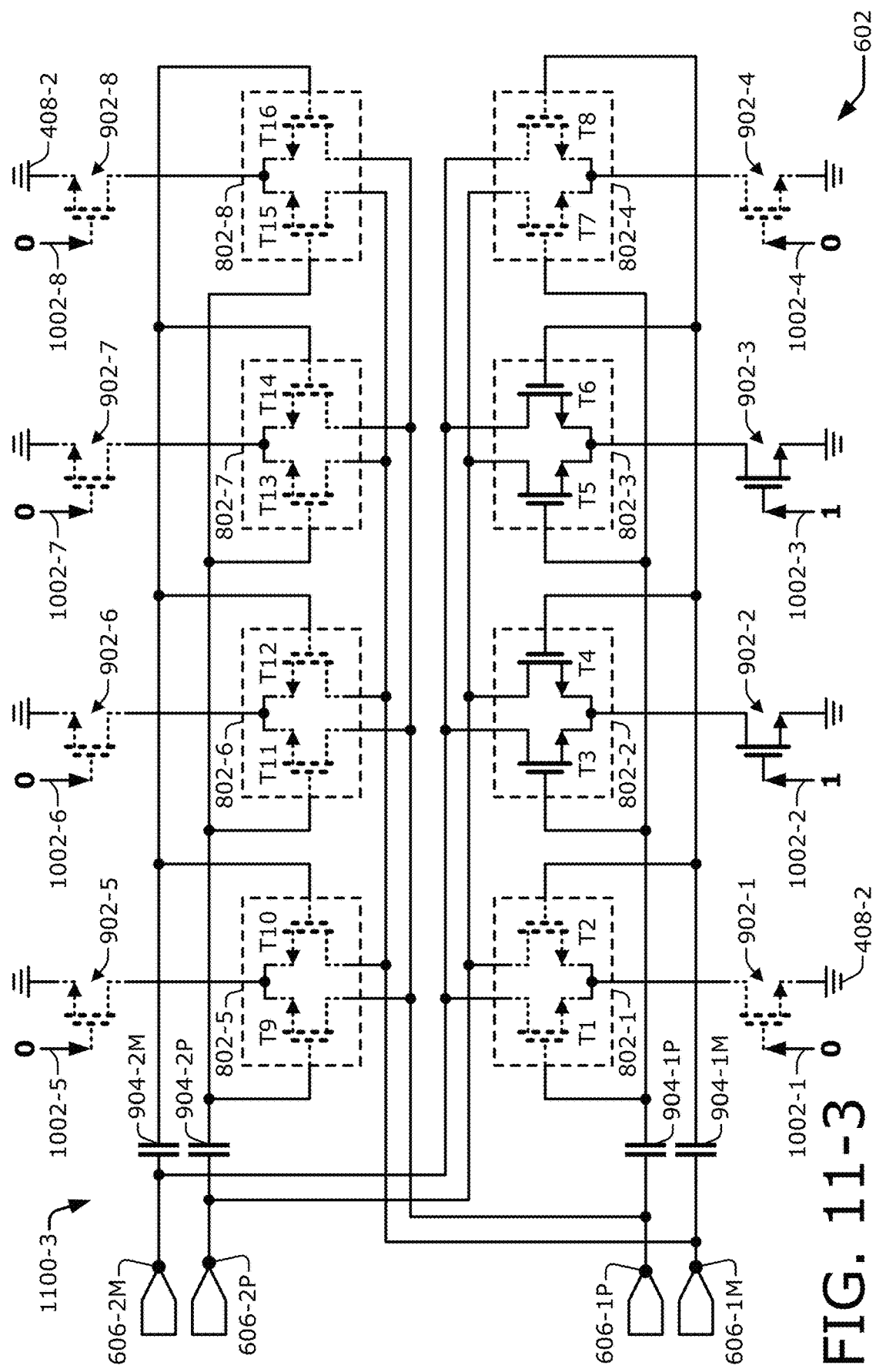

In each of FIGS. 11-1 to 11-3, enabled transistors are illustrated with solid lines, and disabled transistors are illustrated with dashed lines. Example voltage values for eight enablement signals 1002-1 . . . 1002-8 are indicated with a "1" to represent a high voltage value and with a "0" to represent a low voltage value. By way of example only, example amplification modes are depicted in FIGS. 11-1 to 11-3 and are described below in terms of nMOSFETs. Further, operation of the example bidirectional amplifier 602 is described for the transistors T1-T8 of the first transistor bank 702-1 in which a first signal 704-1 (both of FIGS. 7 and 8) propagates from the first interface 604-1 to the second interface 604-2. Nonetheless, the principles are also applicable to operation of the transistors T9-T16 of the second transistor bank 702-2 in which a second signal 704-2 propagates from the second interface 604-2 to the first interface 604-1.

FIG. 11-1 is a circuit diagram illustrating a bidirectional amplifier 602 that is in an example operational configuration 1100-1 for a regular active mode of signal amplification. For the regular active amplification mode, the bidirectional amplifier 602 amplifies a differential signal by the corresponding amplification amount 612 without changing the sign of the differential signal. In the operational configuration 1100-1, the first transistor pair 802-1 and the second transistor pair 802-2 are enabled, but the third transistor pair 802-3 and the fourth transistor pair 802-4 are disabled. The fifth through eighth transistor pairs 802-5 to 802-8 are also disabled.

In example implementations, to enable the first transistor pair 802-1, the first enablement signal 1002-1 turns on the enablement transistor of the first enablement device 902-1 with a high voltage ("1"). To enable the second transistor pair 802-2, the second enablement signal 1002-2 turns on the enablement transistor of the second enablement device 902-2 with a high voltage ("1"). The third and fourth transistor pairs 802-3 and 802-4 are turned off with low voltages ("0") on the third and fourth enablement signals 1002-3 and 1002-4, respectively. Thus, a DC current 1006

(e.g., of FIG. 10-2) can flow through each of the first and second transistor pairs 802-1 and 802-2, but no appreciable DC current 1006 can flow through either of the third or fourth transistor pair 802-3 or 802-4.

Accordingly, a differential first signal 704-1 that enters the bidirectional amplifier 602 at the first minus node 606-1M and the first plus node 606-1P is amplified by the first, second, third, and fourth transistors T1, T2, T3, and T4. Here, a plus part of an input signal provided at a gate terminal of a given transistor is provided as a minus part of an output signal at a drain terminal of the transistor. For example, the gate terminal of the first transistor T1 is coupled to the first plus node 606-1P, and the drain terminal of the first transistor T1 is coupled to the second minus node 606-2M. This results, however, in a non-inverted amplified signal at the second interface 604-2 because the transistor T1 is implemented in a common-source (CS) amplifier configuration, which "naturally" or "automatically" inverts a signal being amplified. By swapping the plus and minus polarity of the differential amplifier formed by each transistor pair 802-1 and 802-2 between the input and output nodes thereof, the amplified signal forwarded on the second plus node 606-2P and the second minus node 606-2M is not inverted.

FIG. 11-2 is a circuit diagram illustrating a bidirectional amplifier 602 that is in an example operational configuration 1100-2 for an inverted active mode of signal amplification. For the inverted active amplification mode, the bidirectional amplifier 602 amplifies a differential signal by the corresponding amplification amount 612 and also changes the sign of the differential signal (e.g., flips the polarity of the plus and minus parts of the differential signal). In the operational configuration 1100-2, the third transistor pair 802-3 and the fourth transistor pair 802-4 are enabled, but the first transistor pair 802-1 and the second transistor pair 802-2 are disabled. The fifth through eighth transistor pairs 802-5 to 802-8 are also disabled.

In example implementations, to enable the third transistor pair 802-3, the third enablement signal 1002-3 turns on the enablement transistor of the third enablement device 902-3 with a high voltage ("1"). To enable the fourth transistor pair 802-4, the fourth enablement signal 1002-4 turns on the enablement transistor of the fourth enablement device 902-4 with a high voltage ("1"). The first and second transistor pairs 802-1 and 802-2 are turned off with low voltages ("0") on the first and second enablement signals 1002-1 and 1002-2, respectively. Thus, a DC current 1006 (e.g., of FIG. 10-2) can flow through each of the third and fourth transistor pairs 802-3 and 802-4, but no appreciable DC current 1006 can flow through either of the first or second transistor pair 802-1 or 802-2.

Accordingly, a differential first signal 704-1 that enters the bidirectional amplifier 602 at the first minus node 606-1M and the first plus node 606-1P is amplified by the fifth, sixth, seventh, and eighth transistors T5, T6, T7, and T8. Here, a plus part of a differential signal that is input at a gate terminal of a given transistor is provided at a plus part of an output at a drain terminal of the transistor. For example, the gate terminal of the fifth transistor T5 is coupled to the first plus node 606-1P, and the drain terminal of the fifth transistor T5 is coupled to the second plus node 606-2P. Nevertheless, this results in an inverted amplified signal at the second interface 604-2 because the transistor T5 is implemented in a common-source (CS) amplifier configuration, which inverts an amplified signal during normal operation. By not swapping the plus and minus parts of a differential signal provided to the differential amplifier formed by each transistor pair 802-3 and 802-4 between the input and output nodes thereof, the amplified signal that is forwarded on the second plus node 606-2P and the second minus node 606-2M is inverted for the operational configuration 1100-2. Thus, by inverting the signal component being amplified (e.g., the I or Q signal component), the bidirectional amplifier 602 can implement sign-switching to extend the phase-shifting range of the phase shifter 130.

FIG. 11-3 is a circuit diagram illustrating a bidirectional amplifier 602 that is in an example operational configuration 1100-3 for an inactive mode of nonamplification. For the inactive amplification mode, the bidirectional amplifier 602 does not amplify a differential signal by the corresponding amplification amount 612. In other words, the bidirectional amplifier 602 does not contribute to a total gain amount of a VGA 136 if engaged in the inactive operational mode (or disengaged from amplification). In the operational configuration 1100-3, the second transistor pair 802-2 and the third transistor pair 802-3 are enabled, but the first transistor pair 802-1 and the fourth transistor pair 802-4 are disabled. The fifth through eighth transistor pairs 802-5 to 802-8 are also disabled.

In example implementations, to enable the second transistor pair 802-2, the second enablement signal 1002-2 turns on the enablement transistor of the second enablement device 902-2 with a high voltage ("1"). To enable the third transistor pair 802-3, the third enablement signal 1002-3 turns on the enablement transistor of the third enablement device 902-3 with a high voltage ("1"). The first and fourth transistor pairs 802-1 and 802-4 are turned off with low voltages ("0") on the first and fourth enablement signals 1002-1 and 1002-4, respectively. Thus, a DC current 1006 (e.g., of FIG. 10-2) can flow through each of the second and third transistor pairs 802-2 and 802-3, but no appreciable DC current 1006 can flow through either of the first or fourth transistor pair 802-1 or 802-4.

Although a DC current 1006 is flowing through each of the second and third transistor pairs 802-2 and 802-3, the bidirectional amplifier 602 performs no amplification in the operational configuration 1100-3. Instead, AC currents from the first differential signal 704-1 cycle through the transistors of the second and third transistor pairs 802-2 and 802-3. For example, a plus part of the first signal 704-1 (e.g., from the first plus node 606-1P) can increase a current at the drain of the third transistor T3 at the second minus node 606-2M. During this time, the minus part of the first signal 704-1 (e.g., from the first minus node 606-1M) is decreasing a current at the drain of the sixth transistor T6 at the second minus node 606-2M, which sinks the current being sourced by the third transistor T3. This causes the two currents from the third and sixth transistor T3 and T6 to circulate in a manner that effectively cancels one another. An analogous current circulation occurs for the fourth and fifth transistors T4 and T5, and this effectively cancels any current change on the second plus node 606-2P. Consequently, in the operational configuration 1100-3, the bidirectional amplifier 602 contributes no appreciable amplification amount 612 to a total gain amount of a VGA 136.

In some implementations, the first, second, third, fourth, fifth, sixth, seventh, and eighth transistors T1, T2, T3, T4, T5, T6, T7, and T8 each approximately have a same size (e.g., to an extent practical using a given process fabrication technology). In some cases, each transistor within the first transistor bank 702-1 is architected or engineered to have a same size, but each size may nevertheless vary somewhat due to fabrication tolerances. In other cases, each transistor has a size that is within 5-10% of the sizes of the other transistors within a given transistor bank. Further, a gateto-drain capacitance (Cgd) of each of the first, second, third, fourth, fifth, sixth, seventh, and eighth transistors T1, T2, T3, T4, T5, T6, T7, and T8 is substantially equivalent to one another within the capabilities of the fabrication process. Based on the transistors each having approximately the same size and the output couplings from the transistors to the second plus node 606-2P and the second minus node 606-2M, the gate-to-drain capacitances of the first through eighth transistors T1 to T8 substantially neutralize a combined parasitic capacitance of the first transistor bank 702-1. Analogously to how AC currents can internally circulate as described above, the gate-to-drain capacitances of certain pairs of transistors operate in opposite directions to counteract each other's parasitic capacitance. For example, as charge builds on the gate-to-drain capacitance of the third transistor T3 due to one part of a differential signal, charge is dissipated on the gate-to-drain capacitance of the sixth transistor T6 by another part of the differential signal with an opposite polarity.

A bidirectional amplifier 602 can therefore be selectively operated in an operational mode of multiple operational modes based on an amplification control signal 608. These operational modes can include a first active mode (e.g., a non-inverted active amplification mode), a second active mode (e.g., an inverted active amplification mode), and an inactive mode (e.g., a nonamplification mode). Each of the three operational modes are described above in terms of two particular transistor pairs being enabled and two other transistor pairs being disabled among the four transistor pairs per transistor bank 702. However, other implementations may have alternative pairs of transistor pairs that are enabled or disabled besides the example ones described above and depicted in FIGS. 11-1 to 11-3.

In other words, the four transistor pairs may be arranged differently relative to the input or output coupling polarity of each transistor pair. For example, for the active mode of FIG. 11-1, the second transistor pair 802-2 and the third transistor pair 802-3 can be enabled while the two "external" (as illustrated) transistor pairs (e.g., the first transistor pair 802-1 and the fourth transistor pair 802-4) are disabled. To implement this example, the second and third transistor pairs 802-2 and 802-3 are connected between the first differential interface 604-1 and the second differential interface 604-2 such that a signal being amplified by these two transistor pairs is not inverted. Further, the first and fourth transistor pairs 802-1 and 802-4 are connected between the first and second differential interfaces 604-1 and 604-2 such that amplified signals are inverted, as described above for the third and fourth transistor pairs of FIG. 11-2. As another example, for the nonamplification mode of FIG. 11-3, any two transistor pairs with opposite differential polarity couplings can be enabled while the other two transistor pairs are disabled. The two transistor pairs with opposite differential polarity couplings that enable an AC current to circulate within the bidirectional amplifier 602 need not be adjacently disposed to one another on an IC substrate or adjacently coupled electrically.

Figure 12:
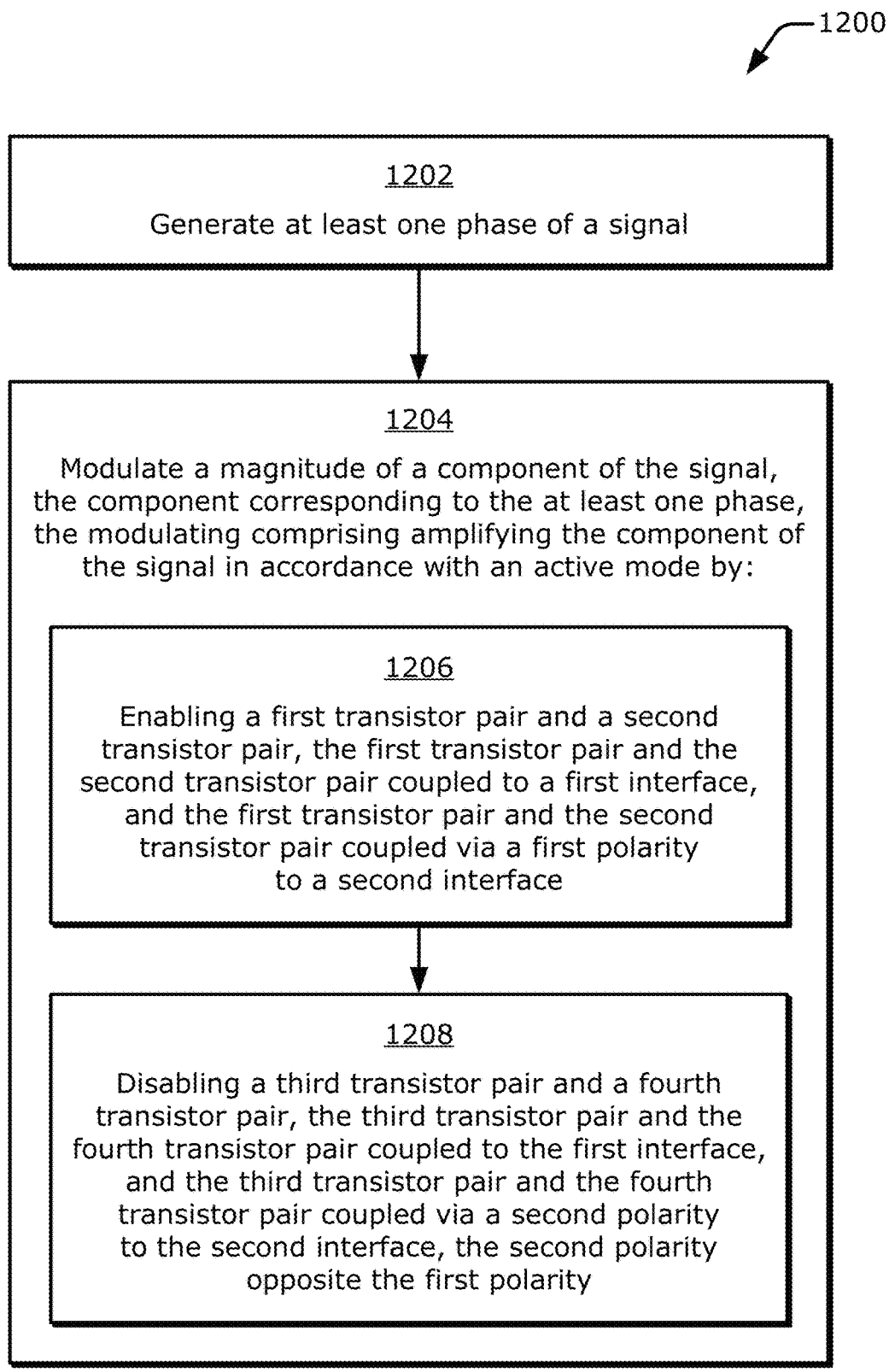
FIG. 12 is a flow diagram illustrating an example process for phase-shifting with bidirectional amplification.

FIG. 12 is a flow diagram illustrating an example process 1200 for phase shifting with bidirectional amplification. The process 1200 is described in the form of a set of blocks 1202-1208 that specify operations that can be performed. However, operations are not necessarily limited to the order shown in FIG. 12 or described herein, for the operations may be implemented in alternative orders or in fully or partially overlapping manners. Also, more, fewer, and/or different operations may be implemented to perform the process 1200, or an alternative process. Operations represented by the illustrated blocks of the process 1200 may be performed by a transceiver 126 or an RF front-end 128 in conjunction with a communication processor 124 or a controller 212 (e.g., of FIGS. 2 and 4-1). More specifically, the operations of the process 1200 may be performed by a phase shifter 130.

At block 1202, at least one phase of a signal is generated. For example, the phase shifter 130 can generate at least one phase 506 of a signal 324. For instance, a signal phase generator 132 may generate at least one phase 454-3 of the signal 324 from a phase 454-1 of the signal 324.

At block 1204, a magnitude of a component of the signal is modulated. The component corresponds to the at least one phase of the signal, and the modulating includes amplifying the component of the signal in accordance with an active mode. For example, the phase shifter 130 can modulate a magnitude of a component of the signal 324, with the signal component corresponding to the at least one phase 506. The phase shifter 130 can amplify the component of the signal 324 in accordance with an active mode of a vector modulator 134.

The vector modulator 134 may perform the modulating of the magnitude of the component of the signal 324 by, e.g., increasing the magnitude of the component corresponding to the at least one phase 454-3, which can include at least one of the signal components corresponding to the phase 454-10 or 454-11. The vector modulator 134 may include at least one VGA 136 that includes one or more bidirectional amplifiers 602-1 to 602-A. A bidirectional amplifier 602 may amplify the component of the signal 324 in accordance with an active mode that can be established using the operational configuration 1100-1 of FIG. 11-1. Engaging the active mode with the operational configuration 1100-1 may include enabling and disabling certain transistor pairs of the bidirectional amplifier 602. This enabling and disabling of certain transistor pairs is described with reference to blocks 1206 and 1208.

At block 1206, a first transistor pair and a second transistor pair are enabled. The first transistor pair and the second transistor pair are coupled to a first interface, and the first transistor pair and the second transistor pair are coupled via a first polarity to a second interface. For example, the bidirectional amplifier 602 can enable a first transistor pair 802-1 and a second transistor pair 802-1. The first transistor pair 802-1 and the second transistor pair 802-2 are coupled to a first interface 604-1, and the first transistor pair 802-1 and the second transistor pair 802-2 are coupled via a first polarity to a second interface 604-2. In some cases, the first interface 604-1 comprises a first differential interface 604-1 including a first plus node 606-1P and a first minus node 606-1M, and the second interface 604-2 comprises a second differential interface 604-2 including a second plus node 606-2P and a second minus node 606-2M. The first polarity may correspond to a first differential coupling in which the plus-minus signaling outputs are not swapped relative to the plus-minus signaling inputs of each transistor pair 802 of the first transistor pair 802-1 and the second transistor pair 802-2, as illustrated by the operational configuration 1100-1.

At block 1208, a third transistor pair and a fourth transistor pair are disabled. The third transistor pair and the fourth transistor pair are coupled to the first interface, and the third transistor pair and the fourth transistor pair are coupled via a second polarity to the second interface, with the second polarity opposite the first polarity. For example, the bidirectional amplifier 602 can disable a third transistor pair 802-3 and a fourth transistor pair 802-4. The third transistor pair 802-3 and the fourth transistor pair 802-4 are coupled to the first interface 604-1, and the third transistor pair 802-3 and the fourth transistor pair 802-4 are coupled via a second polarity to the second interface 604-2. Here, the second polarity is opposite the first polarity by swapping the respective plus and minus parts of the differential signaling. For instance, the second polarity may correspond to a second differential coupling in which the plus-minus signaling outputs are swapped relative to the plus-minus signaling inputs of each transistor pair 802 of the third transistor pair 802-3 and the fourth transistor pair 802-4, as illustrated by the operational configuration 1100-1. This swapping or non-swapping of the plus-minus signaling outputs relative to the plus-minus signaling inputs may be made with regard to whether an amplifier intrinsically inverts a signal (e.g., like a common-source amplifier) or does not intrinsically invert a signal (e.g., like a common-gate amplifier).

The terms "first," "second," "third," and other numeric-related indicators are used herein to identify or distinguish similar or analogous items from one another within a given context—such as a particular implementation, a given circuit, a single drawing figure, or a claim. Thus, a first item in one context may differ from a first item in another context. For example, an item identified as a "first transistor pair" in one context may be identified as a "second transistor pair" in another context or may be arranged differently relative to other transistor pairs in various contexts.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, the scope of the invention is provided by the claims. Thus, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
    a phase shifter comprising:
        a first differential interface comprising a first plus node and a first minus node;
        a second differential interface comprising a second plus node and a second minus node; and
        a bidirectional amplifier comprising:
            a first transistor bank comprising:
                a first transistor coupled between the first plus node and the second minus node;
                a second transistor coupled between the first minus node and the second plus node;
                a third transistor coupled between the first plus node and the second minus node;
                a fourth transistor coupled between the first minus node and the second plus node;
                a fifth transistor coupled between the first plus node and the second plus node;
                a sixth transistor coupled between the first minus node and the second minus node;
                a seventh transistor coupled between the first plus node and the second plus node; and
                an eighth transistor coupled between the first minus node and the second minus node; and
            a second transistor bank comprising:
                a ninth transistor coupled between the second plus node and the first plus node;
                a tenth transistor coupled between the second minus node and the first minus node;
                an eleventh transistor coupled between the second plus node and the first plus node;
                a twelfth transistor coupled between the second minus node and the first minus node;
                a thirteenth transistor coupled between the second plus node and the first minus node;
                a fourteenth transistor coupled between the second minus node and the first plus node;
                a fifteenth transistor coupled between the second plus node and the first minus node; and
                a sixteenth transistor coupled between the second minus node and the first plus node, wherein:
            the first differential interface comprises an input of the first transistor bank and an output of the second transistor bank; and
            the second differential interface comprises an output of the first transistor bank and an input of the second transistor bank.

2. The apparatus of claim 1, wherein the bidirectional amplifier is configured to:
    amplify a signal that is flowing from the first differential interface to the second differential interface using the first transistor bank; and
    amplify another signal that is flowing from the second differential interface to the first differential interface using the second transistor bank.

3. The apparatus of claim 1, wherein:
    the first, second, third, fourth, fifth, sixth, seventh, and eighth transistors each approximately have a first size;
    the ninth, tenth, eleventh, twelfth, thirteenth, fourteenth, fifteenth, and sixteenth transistors each approximately have a second size; and
    the first size is substantially different from the second size.

4. The apparatus of claim 3, wherein the first size and the second size correspond to at least one of channel width, channel length, or effective channel width.

5. The apparatus of claim 1, wherein:
    with regard to the first, second, third, fourth, fifth, sixth, seventh, and eighth transistors:
        the first plus node and the first minus node comprise a first differential signaling input of the bidirectional amplifier with respect to a first signal propagation direction corresponding to the first transistor bank; and
        the second plus node and the second minus node comprise a first differential signaling output of the bidirectional amplifier with respect to the first signal propagation direction; and
    with regard to the ninth, tenth, eleventh, twelfth, thirteenth, fourteenth, fifteenth, and sixteenth transistors:
        the second plus node and the second minus node comprise a second differential signaling input of the bidirectional amplifier with respect to a second signal propagation direction corresponding to the second transistor bank; and the first plus node and the first minus node comprise a second differential signaling output of the bidirectional amplifier with respect to the second signal propagation direction.

6. The apparatus of claim 1, wherein the phase shifter is configured to propagate an in-phase signal component (I signal component) through the bidirectional amplifier and between the first differential interface and the second differential interface.

7. The apparatus of claim 1, wherein:
a gate terminal of the first transistor is coupled to the first plus node, and a drain terminal of the first transistor is coupled to the second minus node;
a gate terminal of the second transistor is coupled to the first minus node, and a drain terminal of the second transistor is coupled to the second plus node;
a gate terminal of the third transistor is coupled to the first plus node, and a drain terminal of the third transistor is coupled to the second minus node;
a gate terminal of the fourth transistor is coupled to the first minus node, and a drain terminal of the fourth transistor is coupled to the second plus node;
a gate terminal of the fifth transistor is coupled to the first plus node, and a drain terminal of the fifth transistor is coupled to the second plus node;
a gate terminal of the sixth transistor is coupled to the first minus node, and a drain terminal of the sixth transistor is coupled to the second minus node;
a gate terminal of the seventh transistor is coupled to the first plus node, and a drain terminal of the seventh transistor is coupled to the second plus node; and
a gate terminal of the eighth transistor is coupled to the first minus node, and a drain terminal of the eighth transistor is coupled to the second minus node.

8. The apparatus of claim 7, wherein the bidirectional amplifier further comprises:
first plus bias voltage circuitry coupled to the gate terminal of the first transistor, the gate terminal of the third transistor, the gate terminal of the fifth transistor, and the gate terminal of the seventh transistor; and
first minus bias voltage circuitry coupled to the gate terminal of the second transistor, the gate terminal of the fourth transistor, the gate terminal of the sixth transistor, and the gate terminal of the eighth transistor.

9. The apparatus of claim 7, wherein:
the first plus node and the first minus node comprise a differential signaling input of the bidirectional amplifier with respect to the first transistor bank; and
the second plus node and the second minus node comprise a differential signaling output of the bidirectional amplifier with respect to the first transistor bank.

10. The apparatus of claim 1, wherein the bidirectional amplifier further comprises:
a first plus capacitor coupled between the first plus node and the first, third, fifth, and seventh transistors; and
a first minus capacitor coupled between the first minus node and the second, fourth, sixth, and eighth transistors.

11. The apparatus of claim 10, further comprising:
at least one power distribution network (PDN) node (PDN node), wherein:
the first, third, sixth, and eighth transistors are direct-current-coupled (DC-coupled) to the at least one PDN node via the second minus node; and
the second, fourth, fifth, and seventh transistors are DC-coupled to the at least one PDN node via the second plus node.

12. The apparatus of claim 1, wherein the bidirectional amplifier further comprises:
a first enablement device coupled between:
the first transistor and at least one power distribution network (PDN) node (PDN node); and
the second transistor and the at least one PDN node;
a second enablement device coupled between:
the third transistor and the at least one PDN node; and
the fourth transistor and the at least one PDN node;
a third enablement device coupled between:
the fifth transistor and the at least one PDN node; and
the sixth transistor and the at least one PDN node; and
a fourth enablement device coupled between:
the seventh transistor and the at least one PDN node; and
the eighth transistor and the at least one PDN node.

13. The apparatus of claim 12, wherein:
the first enablement device is configured to enable a first direct-current (DC) current to flow through or to disable the first DC current from flowing through the first transistor and the second transistor;
the second enablement device is configured to enable a second DC current to flow through or to disable the second DC current from flowing through the third transistor and the fourth transistor;
the third enablement device is configured to enable a third DC current to flow through or to disable the third DC current from flowing through the fifth transistor and the sixth transistor; and
the fourth enablement device is configured to enable a fourth DC current to flow through or to disable the fourth DC current from flowing through the seventh transistor and the eighth transistor.

14. The apparatus of claim 13, wherein:
the first enablement device comprises a first enablement transistor;
the second enablement device comprises a second enablement transistor;
the third enablement device comprises a third enablement transistor; and
the fourth enablement device comprises a fourth enablement transistor.

15. The apparatus of claim 12, wherein:
the at least one PDN node comprises a ground node; and
each of the first, second, third, fourth, fifth, sixth, seventh, and eighth transistors comprises a respective n-channel metal-oxide-semiconductor (MOS) field-effect transistor (FET) (nMOSFET).

16. The apparatus of claim 12, wherein:
the at least one PDN node comprises at least one power supply node; and
each of the first, second, third, fourth, fifth, sixth, seventh, and eighth transistors comprises a respective p-channel metal-oxide-semiconductor (MOS) field-effect transistor (FET) (pMOSFET).

17. The apparatus of claim 12, wherein the bidirectional amplifier is configured to be in an active mode or an inactive mode based on at least one of the first, second, third, or fourth enablement device enabling at least one direct-current (DC) current to flow.

18. The apparatus of claim 17, wherein:
the active mode comprises a first active mode; and
the bidirectional amplifier is configured to be in the first active mode based on the first enablement device and the second enablement device jointly enabling the at least one DC current to flow through the first, second, third, and fourth transistors.

19. The apparatus of claim 18, wherein:
the active mode comprises the first active mode and a second active mode; and
the bidirectional amplifier is configured to be in the second active mode based on the third enablement device and the fourth enablement device jointly enabling the at least one DC current to flow through the fifth, sixth, seventh, and eighth transistors.

20. The apparatus of claim 19, wherein the bidirectional amplifier is configured to output a differential signal having a polarity that is inverted responsive to operating in the second active mode relative to operating in the first active mode.

21. The apparatus of claim 18, wherein the bidirectional amplifier is configured to be in the first active mode based on the third enablement device and the fourth enablement device jointly disabling the at least one DC current from flowing through the fifth, sixth, seventh, and eighth transistors.

22. The apparatus of claim 17, wherein the bidirectional amplifier is configured to be in the inactive mode based on the second enablement device and the third enablement device jointly enabling the at least one DC current to flow through the third, fourth, fifth, and sixth transistors.

23. The apparatus of claim 22, wherein the bidirectional amplifier is configured to be in the inactive mode based on the first enablement device and the fourth enablement device jointly disabling the at least one DC current from flowing through the first, second, seventh, and eighth transistors.

24. The apparatus of claim 17, wherein:
the bidirectional amplifier is configured to be in the inactive mode based on two enablement devices of the first, second, third, or fourth enablement devices jointly enabling the at least one DC current to flow through four transistors of the first, second, third, fourth, fifth, sixth, seventh, and eighth transistors; each of the four transistors coupled to at least one of the two enablement devices;
two of the four transistors are coupled to the second plus node and the second minus node with a first polarity; and
another two of the four transistors are coupled to the second plus node and the second minus node with a second polarity, the second polarity different from the first polarity.

25. The apparatus of claim 1, wherein:
the bidirectional amplifier comprises a first bidirectional amplifier that corresponds to a first amplification amount; and
the phase shifter comprises a variable gain amplifier (VGA), the VGA comprising the first bidirectional amplifier and a second bidirectional amplifier that corresponds to a second amplification amount, the second amplification amount different from the first amplification amount.

26. The apparatus of claim 25, wherein transistors of the first bidirectional amplifier and transistors of the second bidirectional amplifier have different weighting factors to cause the first amplification amount and the second amplification amount to be different.

27. The apparatus of claim 26, wherein the transistors of the first bidirectional amplifier have different sizes than the transistors of the second bidirectional amplifier.

28. The apparatus of claim 25, wherein the phase shifter comprises:
a signal phase generator; and
a vector modulator coupled to the signal phase generator, the vector modulator comprising the VGA.

29. The apparatus of claim 28, wherein the signal phase generator is configured to generate a first signal component having a first phase and a second signal component having a second phase, the first phase and the second phase separated by 90 degrees (90°).

30. The apparatus of claim 28, wherein:
the VGA comprises a first VGA associated with a first phase of a signal;
the vector modulator comprises a second VGA associated with a second phase of the signal;
the first VGA is coupled to the signal phase generator via a first transformer; and
the second VGA is coupled to the signal phase generator via a second transformer.

31. The apparatus of claim 28, further comprising:
a signal coupler;
a power amplifier; and
a low-noise amplifier,
wherein the phase shifter is coupled switchably between:
the signal coupler and the power amplifier; or
the signal coupler and the low-noise amplifier.

32. The apparatus of claim 1, further comprising:
an antenna array comprising multiple antenna elements, at least one antenna element of the multiple antenna elements coupled to the phase shifter; and
a wireless interface device coupled to the antenna array, the wireless interface device comprising the phase shifter and configured to steer wireless signals communicated via the antenna array using the bidirectional amplifier of the phase shifter.

33. The apparatus of claim 32, further comprising:
a display screen; and
a processor operatively coupled to the display screen and the wireless interface device, the processor configured to present one or more graphical images on the display screen based on the wireless signals steered by the wireless interface device using the bidirectional amplifier of the phase shifter.

34. An apparatus comprising:
a phase shifter comprising:
a first plus node;
a first minus node;
a second plus node;
a second minus node; and
a bidirectional amplifier comprising:
a first transistor coupled between the first plus node and the second minus node;
a second transistor coupled between the first minus node and the second plus node;
a third transistor coupled between the first plus node and the second minus node;
a fourth transistor coupled between the first minus node and the second plus node;
a fifth transistor coupled between the first plus node and the second plus node;
a sixth transistor coupled between the first minus node and the second minus node;
a seventh transistor coupled between the first plus node and the second plus node; and
an eighth transistor coupled between the first minus node and the second minus node, a gate terminal of the first transistor coupled to the first plus node, and a drain terminal of the first transistor coupled to the second minus node;
a gate terminal of the second transistor coupled to the first minus node, and a drain terminal of the second transistor coupled to the second plus node;
a gate terminal of the third transistor coupled to the first plus node, and a drain terminal of the third transistor coupled to the second minus node;
a gate terminal of the fourth transistor coupled to the first minus node, and a drain terminal of the fourth transistor coupled to the second plus node;
a gate terminal of the fifth transistor coupled to the first plus node, and a drain terminal of the fifth transistor coupled to the second plus node;
a gate terminal of the sixth transistor coupled to the first minus node, and a drain terminal of the sixth transistor coupled to the second minus node;
a gate terminal of the seventh transistor coupled to the first plus node, and a drain terminal of the seventh transistor coupled to the second plus node; and
a gate terminal of the eighth transistor coupled to the first minus node, and a drain terminal of the eighth transistor coupled to the second minus node.

35. The apparatus of claim 34, wherein the bidirectional amplifier further comprises:
first plus bias voltage circuitry coupled to the gate terminal of the first transistor, the gate terminal of the third transistor, the gate terminal of the fifth transistor, and the gate terminal of the seventh transistor; and
first minus bias voltage circuitry coupled to the gate terminal of the second transistor, the gate terminal of the fourth transistor, the gate terminal of the sixth transistor, and the gate terminal of the eighth transistor.

36. The apparatus of claim 34, wherein:
the first plus node and the first minus node comprise a differential signaling input of the bidirectional amplifier; and
the second plus node and the second minus node comprise a differential signaling output of the bidirectional amplifier.

37. An apparatus comprising:
a phase shifter comprising:
a first plus node;
a first minus node;
a second plus node;
a second minus node; and
a bidirectional amplifier comprising:
a first transistor coupled between the first plus node and the second minus node;
a second transistor coupled between the first minus node and the second plus node;
a third transistor coupled between the first plus node and the second minus node;
a fourth transistor coupled between the first minus node and the second plus node;
a fifth transistor coupled between the first plus node and the second plus node;
a sixth transistor coupled between the first minus node and the second minus node;
a seventh transistor coupled between the first plus node and the second plus node; and
an eighth transistor coupled between the first minus node and the second minus node;
a first enablement device coupled between:
the first transistor and at least one power distribution network (PDN) node (PDN node); and
the second transistor and the at least one PDN node;
a second enablement device coupled between:
the third transistor and the at least one PDN node; and
the fourth transistor and the at least one PDN node;
a third enablement device coupled between:
the fifth transistor and the at least one PDN node; and
the sixth transistor and the at least one PDN node; and
a fourth enablement device coupled between:
the seventh transistor and the at least one PDN node; and
the eighth transistor and the at least one PDN node.

38. The apparatus of claim 37, wherein:
the first enablement device is configured to enable a first direct-current (DC) current to flow through or to disable the first DC current from flowing through the first transistor and the second transistor;
the second enablement device is configured to enable a second DC current to flow through or to disable the second DC current from flowing through the third transistor and the fourth transistor;
the third enablement device is configured to enable a third DC current to flow through or to disable the third DC current from flowing through the fifth transistor and the sixth transistor; and
the fourth enablement device is configured to enable a fourth DC current to flow through or to disable the fourth DC current from flowing through the seventh transistor and the eighth transistor.

39. The apparatus of claim 37, wherein:
the at least one PDN node comprises a ground node; and
each of the first, second, third, fourth, fifth, sixth, seventh, and eighth transistors comprises a respective n-channel metal-oxide-semiconductor (MOS) field-effect transistor (FET) (nMOSFET).

40. The apparatus of claim 37, wherein:
the at least one PDN node comprises at least one power supply node; and
each of the first, second, third, fourth, fifth, sixth, seventh, and eighth transistors comprises a respective p-channel metal-oxide-semiconductor (MOS) field-effect transistor (FET) (pMOSFET).

41. The apparatus of claim 37, wherein the bidirectional amplifier is configured to be in an active mode or an inactive mode based on at least one of the first, second, third, or fourth enablement device enabling at least one direct-current (DC) current to flow.

42. The apparatus of claim 41, wherein:
the active mode comprises a first active mode and a second active mode;
the bidirectional amplifier is configured to be in the first active mode based on the first enablement device and the second enablement device jointly enabling the at least one DC current to flow through the first, second, third, and fourth transistors; and
the bidirectional amplifier is configured to be in the second active mode based on the third enablement device and the fourth enablement device jointly enabling the at least one DC current to flow through the fifth, sixth, seventh, and eighth transistors.

43. The apparatus of claim 42, wherein the bidirectional amplifier is configured to output a differential signal having a polarity that is inverted responsive to operating in the second active mode relative to operating in the first active mode.

44. The apparatus of claim 42, wherein the bidirectional amplifier is configured to be in the first active mode based on the third enablement device and the fourth enablement device jointly disabling the at least one DC current from flowing through the fifth, sixth, seventh, and eighth transistors.

45. The apparatus of claim 41, wherein the bidirectional amplifier is configured to be in the inactive mode based on the second enablement device and the third enablement device jointly enabling the at least one DC current to flow through the third, fourth, fifth, and sixth transistors.

46. The apparatus of claim 45, wherein the bidirectional amplifier is configured to be in the inactive mode based on the first enablement device and the fourth enablement device jointly disabling the at least one DC current from flowing through the first, second, seventh, and eighth transistors.

47. The apparatus of claim 41, wherein:
the bidirectional amplifier is configured to be in the inactive mode based on two enablement devices of the first, second, third, or fourth enablement devices jointly enabling the at least one DC current to flow through four transistors of the first, second, third, fourth, fifth, sixth, seventh, and eighth transistors; each of the four transistors coupled to at least one of the two enablement devices;
two of the four transistors are coupled to the second plus node and the second minus node with a first polarity; and
another two of the four transistors are coupled to the second plus node and the second minus node with a second polarity, the second polarity different from the first polarity.

* * * * *